(12) United States Patent
Jeong et al.

(10) Patent No.: US 12,268,091 B2
(45) Date of Patent: Apr. 1, 2025

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Eunjae Jeong, Hwaseong-si (KR); Dongjun Kim, Suwon-si (KR); Minji Kim, Hwaseong-si (KR); Hankyu Pak, Suwon-si (KR); Sohee Jo, Cheonan-si (KR); Sanghyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 848 days.

(21) Appl. No.: 17/351,049

(22) Filed: Jun. 17, 2021

(65) Prior Publication Data
US 2022/0131092 A1 Apr. 28, 2022

(30) Foreign Application Priority Data
Oct. 23, 2020 (KR) .................. 10-2020-0138279

(51) Int. Cl.
H10K 85/60 (2023.01)
H10K 50/15 (2023.01)

(52) U.S. Cl.
CPC ....... *H10K 85/6576* (2023.02); *H10K 85/622* (2023.02); *H10K 85/631* (2023.02);
(Continued)

(58) Field of Classification Search
CPC .. C07F 9/587; C07F 15/06; C09K 2211/1029; C09K 2211/1044; C09K 2211/187
See application file for complete search history.

(56) References Cited

U.S. PATENT DOCUMENTS 4,720,432 A 1/1988 VanSlyke et al.
5,061,569 A 10/1991 VanSlyke et al.
(Continued)

FOREIGN PATENT DOCUMENTS

JP H 06-314594 A 11/1994
JP H 08-291115 A 11/1996
(Continued)

*Primary Examiner* — Shane Fang
(74) *Attorney, Agent, or Firm* — Womble Bond Dickinson (US) LLP

(57) ABSTRACT

An organic electroluminescence device includes a first electrode and a second electrode, and a plurality of organic layers disposed between the first electrode and the second electrode, wherein at least one organic layer among the plurality of organic layers includes an amine compound represented by Formula 1, and thereby exhibits improved emission efficiency.

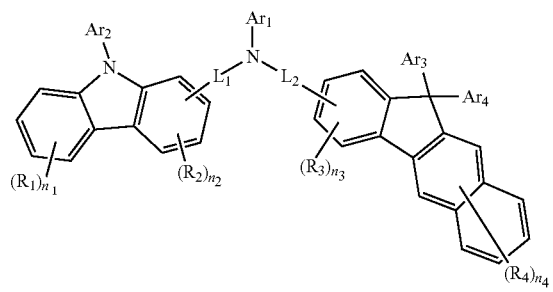

14 Claims, 6 Drawing Sheets

(52) U.S. Cl.
CPC ....... *H10K 85/636* (2023.02); *H10K 85/6572* (2023.02); *H10K 85/6574* (2023.02); *H10K 50/15* (2023.02)

(56) References Cited

U.S. PATENT DOCUMENTS

| | | |
|---|---|---|
| 6,242,115 B1 | 6/2001 | Thomson et al. |
| 8,021,764 B2 | 9/2011 | Hwang et al. |
| 8,993,805 B2 | 3/2015 | Nishiyama et al. |
| 10,141,516 B2 | 11/2018 | Lee et al. |
| 10,797,247 B2 | 10/2020 | Lee et al. |
| 2018/0226579 A1 | 8/2018 | Kim et al. |
| 2019/0055187 A1 | 2/2019 | Kim et al. |
| 2020/0212311 A1 | 7/2020 | Hong |

FOREIGN PATENT DOCUMENTS

| | | |
|---|---|---|
| JP | H 11-144873 A | 5/1999 |
| JP | 2000-302756 A | 10/2000 |
| JP | 2000-309566 A | 11/2000 |
| JP | 2006-151979 A | 6/2006 |
| JP | 5446247 B2 | 3/2014 |
| KR | 10-1166809 B1 | 7/2012 |
| KR | 10-1462070 B1 | 11/2014 |
| KR | 10-1939552 B1 | 1/2019 |
| KR | 10-1921680 B1 | 2/2019 |
| KR | 10-2019-0035503 A | 4/2019 |
| KR | 10-2034199 B1 | 10/2019 |

ORGANIC ELECTROLUMINESCENCE DEVICE AND AMINE COMPOUND FOR ORGANIC ELECTROLUMINESCENCE DEVICE

CROSS-REFERENCE TO RELATED APPLICATIONS

This application claims priority to and the benefit of Korean Patent Application No. 10-2020-0138279, filed on Oct. 23, 2020, the entire content of which is hereby incorporated by reference.

BACKGROUND

1. Field

One or more aspects of embodiments of the present disclosure relate to an organic electroluminescence device and an amine compound utilized therein, and for example, to an amine compound utilized as a light emitting material and an organic electroluminescence device including the same.

2. Description of the Related Art

Organic electroluminescence displays are being actively developed as image displays. An organic electroluminescence display is different from a liquid crystal display and is so-called a self-luminescent display, in which holes and electrons respectively injected from a first electrode and a second electrode recombine in an emission layer so that a light emitting material including an organic compound in the emission layer emits light to achieve display.

In the application of an organic electroluminescence device to a display, a decrease in driving voltage, and an increase in emission efficiency and/or life (e.g., lifespan) of the organic electroluminescence device are desired, and development of materials capable of providing these properties for an organic electroluminescence device are desired.

In order to accomplish an organic electroluminescence device with high efficiency, materials for a hole transport layer are being developed.

SUMMARY

One or more aspects of embodiments of the present disclosure are directed toward an organic electroluminescence device having improved emission efficiency and/or device life.

One or more aspects of embodiments of the present disclosure are directed toward an amine compound capable of improving the emission efficiency and/or device life (lifespan) of an organic electroluminescence device.

One or more embodiments of the present disclosure provide an organic electroluminescence device including a first electrode, a second electrode opposite the first electrode, and a plurality of organic layers disposed between the first electrode and the second electrode, wherein at least one organic layer among the plurality of organic layers includes an amine compound, the amine compound includes an amine group (e.g., amine functional group), and three aromatic ring substituents substituted at the amine group (e.g., at the nitrogen atom of the amine functional group), and the three aromatic ring substituents include a carbazole group, and a benzo[b]fluorenyl group.

In an embodiment, each of the carbazole group and the benzo[b]fluorenyl group may be bonded to the amine group via a linker, or directly to the amine group.

In an embodiment, the plurality of organic layers may include a hole transport region disposed on the first electrode, an emission layer disposed on the hole transport region, and an electron transport region disposed on the emission layer, and the hole transport region may include the amine compound.

In an embodiment, the hole transport region may include a hole injection layer disposed on the first electrode, and a hole transport layer disposed on the hole injection layer, and the hole transport layer may include the amine compound.

In an embodiment, the hole transport region may include multiple organic layers, and an organic layer adjacent to the emission layer among the multiple organic layers may include the amine compound.

One or more embodiments of the present disclosure provide an organic electroluminescence device including a first electrode, a second electrode opposite the first electrode, and plurality of organic layers disposed between the first electrode and the second electrode, wherein at least one organic layer among the plurality of organic layers includes an amine compound represented by Formula 1.

[Formula 1]

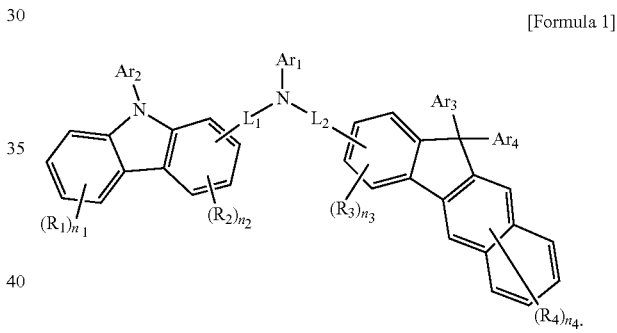

In Formula 1, $Ar_1$ to $Ar_4$ are each independently a substituted or unsubstituted aryl group of 6 to 30 ring-forming carbon atoms, or a substituted or unsubstituted heteroaryl group of 2 to 30 ring-forming carbon atoms, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_1$ to $R_4$ are each independently a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, "$n_1$" is an integer of 0 to 4, "$n_2$" and "$n_3$" are each independently an integer of 0 to 3, and "$n_4$" is an integer of 0 to 6.

In an embodiment, the amine compound represented by Formula 1 may be a monoamine compound (e.g., may include only one amine functional group).

In an embodiment, the amine compound represented by Formula 1 may be represented by any one among Formula 2-1 to Formula 2-3.

[Formula 2-1]

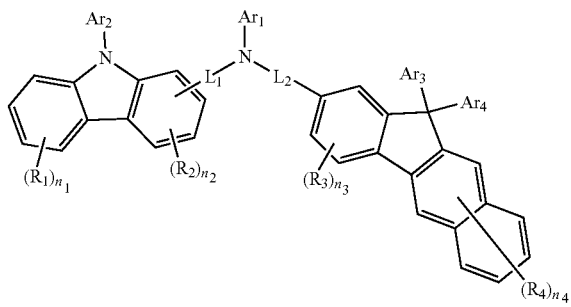

[Formula 3-1]

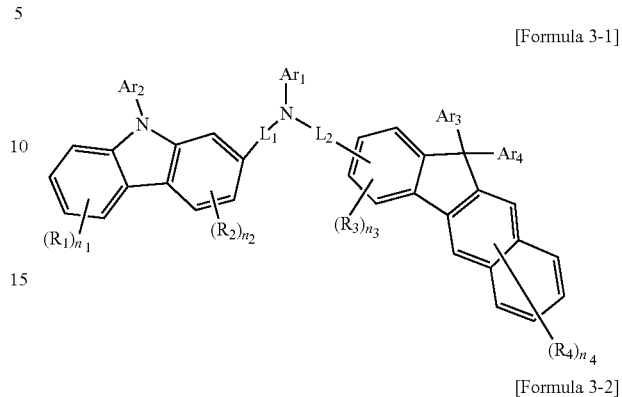

[Formula 2-2]

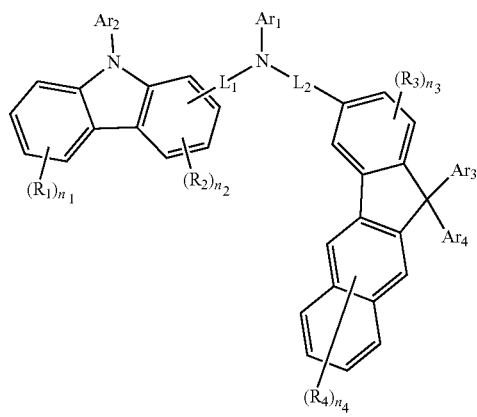

In an embodiment, the amine compound represented by Formula 1 may be represented by Formula 3-1 or Formula 3-2.

[Formula 3-2]

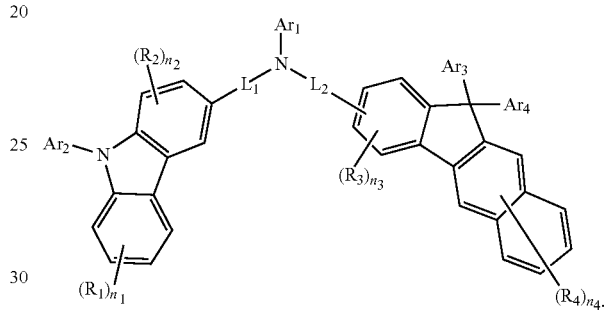

In Formula 3-1 and Formula 3-2, $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" are each independently the same as defined in Formula 1.

In an embodiment, the amine compound represented by Formula 1 may be represented by Formula 4-1 or Formula 4-2.

[Formula 4-1]

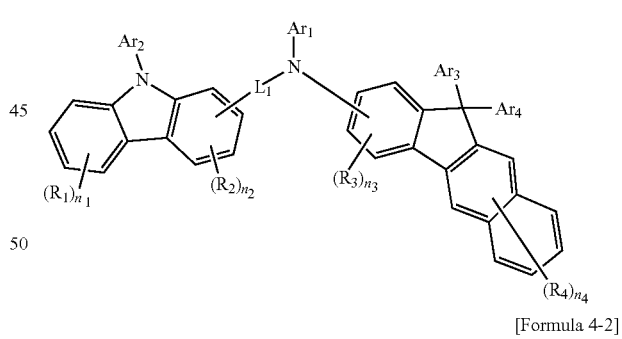

[Formula 2-3]

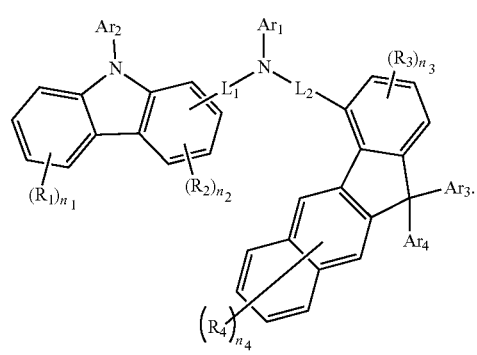

[Formula 4-2]

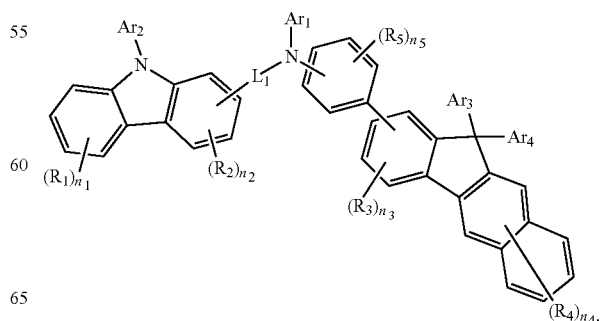

In Formula 2-1 to Formula 2-3, $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" are each independently the same as defined in Formula 1.

In Formula 4-1 and Formula 4-2, $R_5$ is a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, "$n_5$" is an integer of 0 to 4, and $Ar_1$, $Ar_2$, $Ar_3$, $Ar_4$, $L_1$, $R_1$, $R_2$, $R_3$, $R_4$, "$n_1$", "$n_2$", "$n_3$", and "$n_4$" are each independently the same as defined in Formula 1 above.

In an embodiment, the amine compound represented by Formula 1 may be represented by Formula 5-1 or Formula 5-2.

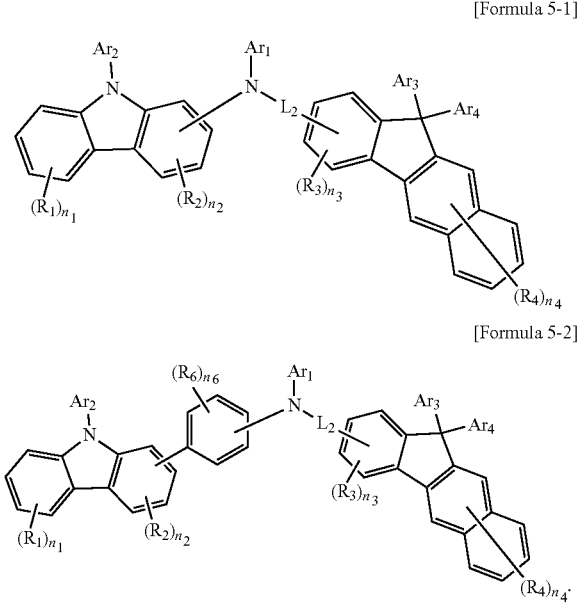

[Formula 5-1]

[Formula 5-2]

In Formula 5-1 and Formula 5-2, $R_6$ is a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, "$n_6$" is an integer of 0 to 4, and $Ar_1$, $Ar_2$, $Ar_3$, $Ar_4$, $L_2$, $R_1$, $R_2$, $R_3$, $R_4$, "$n_1$", "$n_2$", "$n_3$", and "$n_4$" are each independently the same as defined in Formula 1.

In an embodiment, $Ar_1$ to $Ar_4$ may each independently be a substituted or unsubstituted phenyl group, a substituted or unsubstituted biphenyl group, a substituted or unsubstituted naphthyl group, a substituted or unsubstituted dibenzofuran group, or a substituted or unsubstituted dibenzothiophene group.

In an embodiment, $R_1$ to $R_4$ may each (e.g., all simultaneously) be a hydrogen atom.

One or more embodiments of the present disclosure provide an amine compound represented by Formula 1.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
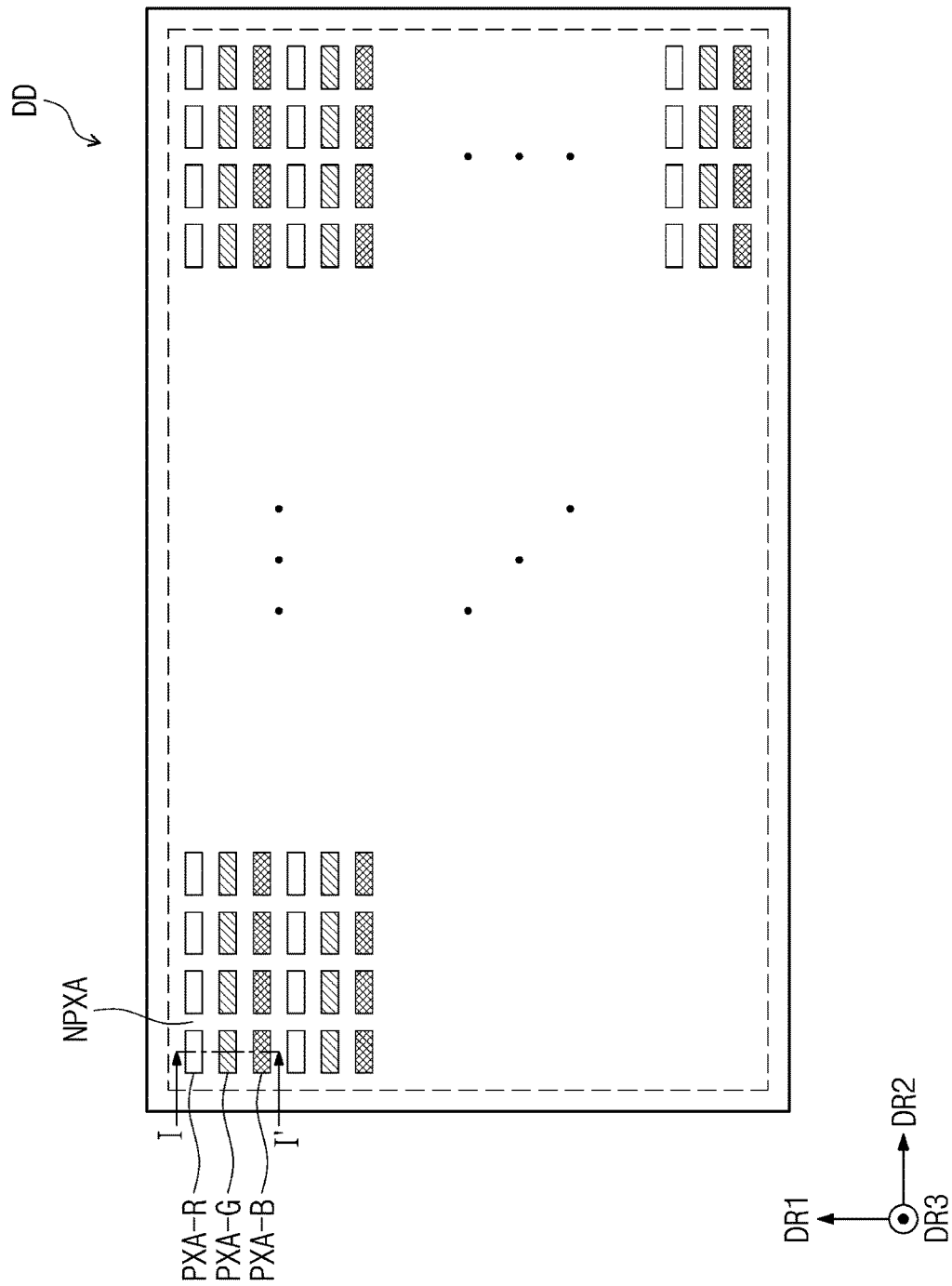
FIG. 1 is a plan view showing a display apparatus according to an embodiment of the present disclosure.

The present disclosure may have various suitable modifications and may be embodied in different forms, and embodiments will be explained in more detail with reference to the accompanying drawings. The present disclosure may, however, be embodied in different forms and should not be construed as being limited to the embodiments set forth herein. Rather, all modifications, equivalents, and substituents that are within the spirit and technical scope of the present disclosure should be included in the present disclosure.

In the description, it will be understood that when an element (or region, layer, part, etc.) is referred to as being "on", "connected to" or "coupled to" another element, it can be directly on, connected or coupled to the other element or a third intervening elements may be present. When an element is referred to as being "directly on," "directly connected to," or "directly coupled to" another element, there are no intervening elements present.

Like reference numerals refer to like elements throughout, and duplicative descriptions thereof may not be provided. In the drawings, the thicknesses, ratios, and dimensions of constituent elements may be exaggerated for effective explanation of technical contents.

The term "and/or" includes any and all combinations of one or more of the associated listed elements. As used herein, expressions such as "at least one of," "one of," and "selected from," when preceding a list of elements, modify the entire list of elements and do not modify the individual elements of the list. As used herein, the singular forms "a," "an," and "the" are intended to include the plural forms as well, unless the context clearly indicates otherwise. Further, the use of "may" when describing embodiments of the present disclosure refers to "one or more embodiments of the present disclosure".

It will be understood that, although the terms first, second, etc. may be utilized herein to describe various elements, those elements should not be limited by these terms. These terms are only utilized to distinguish one element from another element. Thus, a first element could be termed a second element without departing from the teachings of the present disclosure. Similarly, a second element could be alternatively termed a first element. As utilized herein, the singular forms are intended to include the plural forms as well, unless the context clearly indicates otherwise.

In some embodiments, the terms "below", "beneath", "on" and "above" are utilized for explaining the spatial relationships of elements shown in the drawings. The terms are relative concepts and may be based on the directions shown in the drawings.

Unless otherwise defined, all terms (including technical and scientific terms) utilized herein have the same meanings as commonly understood by one of ordinary skill in the art to which this present disclosure belongs. It will be further understood that terms, such as those defined in commonly utilized dictionaries, should be interpreted as having a meaning that is consistent with their meaning in the context of the relevant art and will not be interpreted in an idealized or overly formal sense unless expressly so defined herein.

It will be further understood that the terms "includes," "including," "comprises," and/or "comprising," when utilized in this specification, specify the presence of stated features, numerals, steps, operations, elements, parts, or the combination thereof, but do not preclude the presence or addition of one or more other features, numerals, steps, operations, elements, parts, or combinations thereof.

In the description, the term "substituted or unsubstituted" refers to substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of the substituents may be further substituted or unsubstituted. For example, a biphenyl group may be interpreted as an aryl group or as a phenyl group substituted with a phenyl group.

In the description, the terms "combined with an adjacent group to form a ring," "forming a ring via the combination with an adjacent group" and similar terms may refer to forming a substituted or unsubstituted hydrocarbon ring, or a substituted or unsubstituted heterocycle upon combination (e.g., linking) with an adjacent group. The term "hydrocarbon ring" includes an aliphatic hydrocarbon ring and an aromatic hydrocarbon ring. The term "heterocycle" includes an aliphatic heterocycle and an aromatic heterocycle. The ring formed by the combination with an adjacent group may be a monocyclic ring or a polycyclic ring. In some embodiments, the ring formed via the combination with an adjacent group may be combined with another ring to form a spiro structure.

In the description, the term "adjacent group" may refer to a substituent on the same atom or point, a substituent on an atom that is directly connected to the base atom or point, or a substituent sterically positioned at the nearest position (e.g., within intramolecular bonding distance) to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, the halogen atom may be a fluorine atom, a chlorine atom, a bromine atom, or an iodine atom.

In the description, the alkyl may be a linear, branched, or cyclic alkyl group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring may be an optional functional group or substituent, which is derived from an aliphatic hydrocarbon ring. The hydrocarbon ring may be a saturated hydrocarbon ring of 5 to 20 ring-forming carbon atoms.

In the description, the term "aryl group" refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted (e.g., at the 9H position), and two substituents may be combined with each other to form a spiro structure. Examples of a substituted fluorenyl group are as follows. However, embodiments of the present disclosure are not limited thereto.

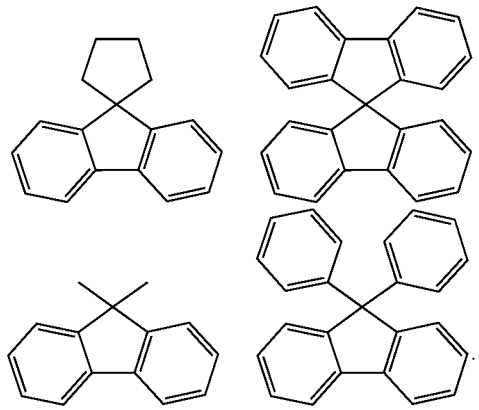

In the description, the term "heterocyclic group" refers to an optional functional group or substituent derived from a ring including one or more among B, O, N, P, Si and S as heteroatoms. The heterocyclic group may include an aliphatic heterocyclic group and an aromatic heterocyclic group. The aromatic heterocyclic group may be a heteroaryl group. The aliphatic heterocyclic group and the aromatic heterocyclic group may be monocycles or polycycles.

In the description, the heterocyclic group may include one or more among B, O, N, P, Si and S as heteroatoms. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The ring-forming carbon number of the heterocyclic group may be 2 to 30, 2 to 20, or 2 to 10.

In the description, the aliphatic heterocyclic group may include one or more among boron (B), oxygen (O), nitrogen (N), phosphorus (P), silicon (Si) and sulfur (S) as heteroatoms. The carbon number for forming rings of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the heteroaryl group may include one or more among B, O, N, P, Si and S as heteroatoms. When the heteroaryl group includes two or more heteroatoms, the two or more heteroatoms may be the same or different. The heteroaryl group may be a monocyclic heterocyclic group or polycyclic heterocyclic group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation of the aryl group may be similarly applied to the arylene group except that the arylene group is a divalent group. The explanation of the heteroaryl group may be similarly applied to the heteroarylene group except that the heteroarylene group is a divalent group.

In the description, the term "silyl group" includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc. However, embodiments of the present disclosure are not limited thereto.

In the description, the carbon number of the amino group is not specifically limited, but may be 1 to 30. The term "amino group" may include an alkyl amino group, an aryl amino group, or a heteroaryl amino group. Examples of the amino group include a methylamino group, a dimethylamino group, a phenylamino group, a diphenylamino group, a 9-methyl-anthracenylamino group, a triphenylamino group, etc., without limitation.

In the description, the carbon number of a carbonyl group is not specifically limited, but the carbon number may be 1 to 40, 1 to 30, or 1 to 20. For example, the carbonyl group may have any of the structures below, but is not limited thereto.

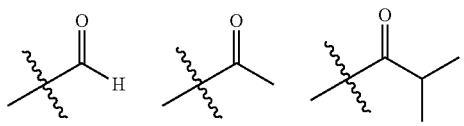

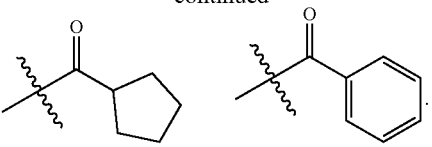

In the description, the carbon number of the sulfinyl group and sulfonyl group is not specifically limited, but may be 1 to 30. The term "sulfinyl group" may include an alkyl sulfinyl group and an aryl sulfinyl group. The term "sulfonyl group" may include an alkyl sulfonyl group and an aryl sulfonyl group.

In the description, the term "thiol group" may include an alkyl thio group and an aryl thio group. The thiol group may include the above-defined alkyl group or aryl group combined with a sulfur atom. Examples of the thiol group include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, the term "oxy group" may refer to the above-defined alkyl group or aryl group combined with an oxygen atom. The oxy group may include an alkoxy group and an aryl oxy group. The alkoxy group may be a linear, branched, or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyl oxy, nonyloxy, decyloxy, benzyloxy, etc. However, embodiments of the present disclosure are not limited thereto.

In the description, the term "boron group" may refer to the above-defined alkyl group or aryl group combined with a boron atom. The boron group includes an alkyl boron group and an aryl boron group. Examples of the boron group include a trimethylboron group, a triethylboron group, a t-butyldimethylboron group, a triphenylboron group, a diphenylboron group, a phenylboron group, etc., without limitation.

In the description, the term "alkenyl group" may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the carbon number of the amine group is not specifically limited, but may be 1 to 30. The term "amine group" may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., without limitation.

In the description, each alkyl group in the alkylthio group, alkylsulfoxy group, alkylaryl group, alkylamino group, alkylboron group, alkyl silyl group, and alkyl amine group may be substantially the same as the examples of the above-described alkyl group.

In the description, each aryl group in the aryloxy group, arylthio group, arylsulfoxy group, aryl amino group, arylboron group, and aryl silyl group may be substantially the same as the examples of the above-described aryl group.

In the description, the term "direct linkage" may refer to a single bond.

In the description,

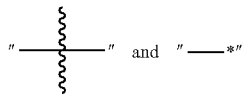

may indicate positions to be connected.

Hereinafter, embodiments of the present disclosure will be explained with reference to the attached drawings.

Figure 2:
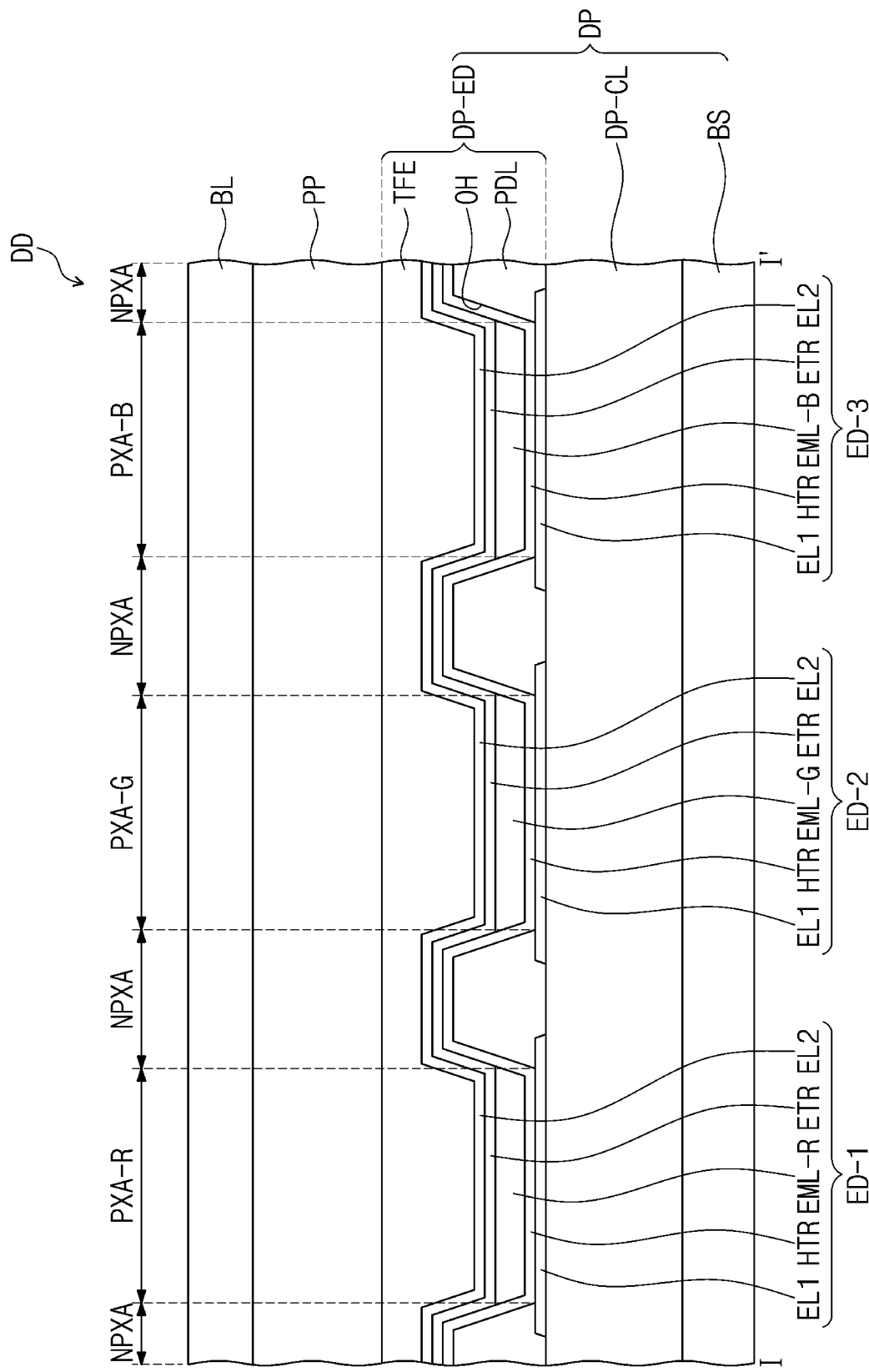
FIG. 2 is a cross-sectional view showing a display apparatus according to an embodiment of the present disclosure.

FIG. 1 is a plan view showing an embodiment of a display apparatus DD. FIG. 2 is a cross-sectional view of the display apparatus DD. FIG. 2 is a cross-sectional view showing a part corresponding to line I-I' in FIG. 1.

The display apparatus DD may include a display panel DP and an optical layer PP disposed on the display panel DP. The display panel DP includes light emitting devices ED-1, ED-2 and ED-3. The display apparatus DD may include multiple light emitting devices ED-1, ED-2 and ED-3. The optical layer PP may be disposed on the display panel DP and may control or reduce reflection of external light by the display panel DP. The optical layer PP may include, for example, a polarization layer or a color filter layer. In some embodiments, the optical layer PP may not be provided in the display apparatus DD of an embodiment. In some embodiments, a plugging layer may be further included between the optical layer PP and the display panel DP. The plugging layer may include, for example, at least one among a silicon-based polymer resin, and an acrylic polymer resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2 and ED-3 disposed in the pixel definition layer PDL, and an encapsulating layer TFE disposed on the light emitting devices ED-1, ED-2 and ED-3.

The base layer BS may be a member providing a base surface where the display device layer DP-ED is disposed. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting devices ED-1, ED-2 and ED-3 of the display device layer DP-ED.

Each of the light emitting devices ED-1, ED-2, and ED-3 may have structures according to any of the light emitting devices ED of FIG. 3 to FIG. 6, which will be explained later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

In FIG. 2, shown is an embodiment where the emission layers EML-R, EML-G, and EML-B of light emitting devices ED-1, ED-2, and ED-3 are disposed in opening portions OH defined in a pixel definition layer PDL, and a hole transport region HTR, an electron transport region ETR, and a second electrode EL2 are provided as common layers in all light emitting devices ED-1, ED-2 and ED-3. However, embodiments of the present disclosure are not limited thereto. In some embodiments, the hole transport region HTR and the electron transport region ETR may be patterned and deposited in the opening portions OH defined in the pixel definition layer PDL. For example, in an embodiment, the hole transport region HTR, the emission layers EML-R, EML-G and EML-B, and the electron transport region ETR of the light emitting devices ED-1, ED-2 and ED-3 may be patterned and deposited by an ink jet printing method.

An encapsulating layer TFE may cover the light emitting devices ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to an embodiment may include at least one inorganic layer (hereinafter, encapsulating inorganic layer). In some embodiments, the encapsulating layer TFE according to an embodiment may include at least one organic layer (hereinafter, encapsulating organic layer) and at least one encapsulating inorganic layer.

The encapsulating inorganic layer may protect the display device layer DP-ED from moisture/oxygen, and the encapsulating organic layer may protect the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while filling the opening portion OH.

A top base layer BL may be a member providing a base surface where the optical layer PP is disposed. The top base layer BL may be a glass substrate, a metal substrate, a plastic substrate, etc. However, embodiments of the present disclosure are not limited thereto, and the top base layer BL may be an inorganic layer, an organic layer, or a composite material layer. In an embodiment, the top base substrate BL may not be provided. When the top base layer BL is omitted, the optical layer PP may be provided directly on the encapsulating layer TFE.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G, and PXA-B may be separated by the pixel definition layer PDL. The non-luminous areas NPXA may be between neighboring luminous areas PXA-R, PXA-G and PXA-B, and may correspond to the pixel definition layer PDL. In some embodiments, in the disclosure, each of the luminous areas PXA-R, PXA-G, and PXA-B may correspond to each pixel. The pixel definition layer PDL may divide (e.g., spatially divide) the light emitting devices ED-1, ED-2, and ED-3. The emission layers EML-R, EML-G, and EML-B of the light emitting devices ED-1, ED-2, and ED-3 may be disposed and divided in the opening parts OH defined in the pixel definition layer PDL.

The luminous areas PXA-R, PXA-G, and PXA-B may be divided into groups according to the color of light produced by the light emitting devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, multiple light emitting devices ED-1, ED-2, and ED-3 may be to emit light having different wavelengths. For example, in an embodiment, the display apparatus DD may include a first light emitting device ED-1 to emit red light, a second light emitting device ED-2 to emit green light, and a third light emitting device ED-3 to emit blue light. For example, each of the red luminous area PXA-R, the green luminous area PXA-G, and the blue luminous area PXA-B may correspond to the first light emitting device ED-1, the second light emitting device ED-2, and the third light emitting device ED-3.

However, embodiments of the present disclosure are not limited thereto, and the first to third light emitting devices ED-1, ED-2, and ED-3 may be to emit light in the same wavelength region, or at least one thereof may be to emit light in a different wavelength region. For example, all the first to third light emitting devices ED-1, ED-2 and ED-3 may be to emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G, and multiple blue luminous areas PXA-B may be arranged along a second directional axis DR2. In some embodiments, the red luminous area PXA-R, the green luminous area PXA-G, and the blue luminous area PXA-B may be arranged by turns (e.g., may alternate) along a first directional axis DR1.

In FIG. 1 and FIG. 2, the areas of the luminous areas PXA-R, PXA-G, and PXA-B are shown to be similar, but embodiments of the present disclosure are not limited thereto. The areas of the luminous areas PXA-R, PXA-G, and PXA-B may be different from each other according to the wavelength region of light emitted. In some embodiments, the areas of the luminous areas PXA-R, PXA-G, and PXA-B may refer to areas on a plane defined by the first directional axis DR1 and the second directional axis DR2.

In some embodiments, the arrangement of the luminous areas PXA-R, PXA-G, and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required for the display apparatus DD. For example, the arrangement of the luminous areas PXA-R, PXA-G, and PXA-B may be a PENTILE® arrangement, or a diamond arrangement.

In some embodiments, the areas of the luminous areas PXA-R, PXA-G, and PXA-B may be different from each other. For example, in an embodiment, the area of the green luminous area PXA-G may be smaller than the area of the blue luminous area PXA-B, but embodiments of the present disclosure are not limited thereto.

FIG. 3 to FIG. 6 are cross-sectional views schematically showing organic electroluminescence devices according to embodiments of the present disclosure. Referring to FIG. 3 to FIG. 6, in the light emitting device ED of an embodiment, a first electrode EU and a second electrode EL2 may be oppositely disposed, and between the first electrode EL1 and the second electrode EL2, a plurality of organic layers may be disposed. The plurality of organic layers may include a hole transport region HTR, an emission layer EML, and an electron transport region ETR. For example, a light emitting device ED according to an embodiment may include a first electrode, a hole transport region HTR, an emission layer EML, an electron transport region ETR, and a second electrode EL2, stacked in order. On the second electrode EL2, a capping layer CPL may be further disposed.

The light emitting device ED of an embodiment may include an amine compound of an embodiment, which will be explained later, in at least one organic layer among the plurality of organic layers disposed between the first electrode EU and the second electrode EL2. For example, the light emitting device ED of an embodiment may include an amine compound of an embodiment, which will be explained later, in a hole transport region HTR disposed between the first electrode EL1 and the second electrode EL2. However, embodiments of the present disclosure are not limited thereto, and the light emitting device ED of an embodiment may include an amine compound according to an embodiment, which will be explained later, in at least one organic layer among the plurality of organic layers disposed between the first electrode EL1 and the second electrode EL2, including an emission layer EML and an electron transport region ETR in addition to the hole transport region HTR, or may include an amine compound according to an embodiment, which will be explained later, in a capping layer CPL disposed on the second electrode EL2.

Figure 3:
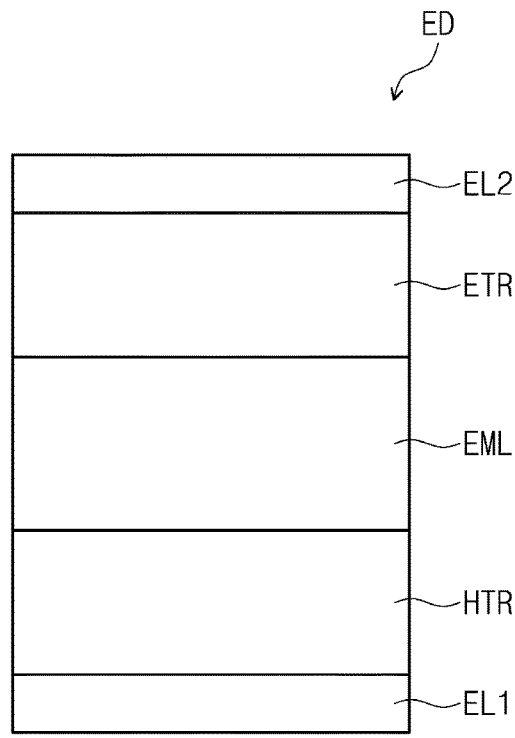
FIG. 3 is a cross-sectional view schematically showing an organic electroluminescence device according to an embodiment of the present disclosure.
Figure 4:
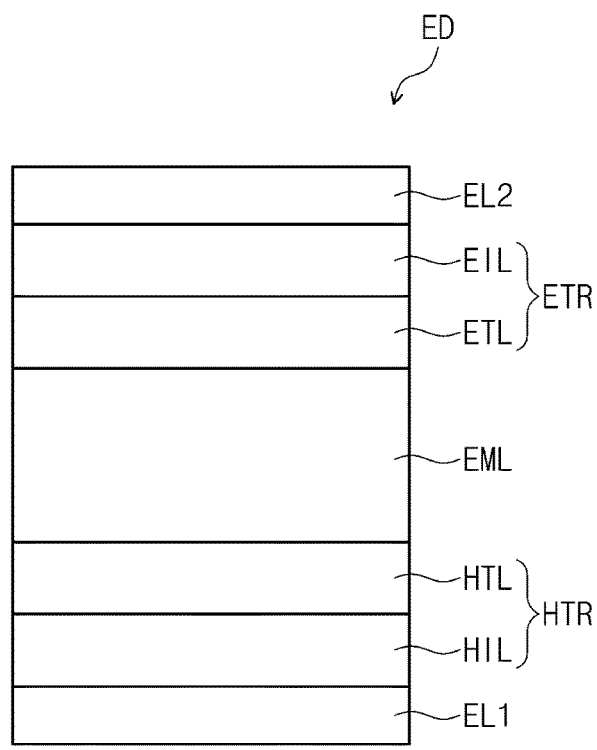
FIG. 4 is a cross-sectional view schematically showing an organic electroluminescence device according to an embodiment of the present disclosure.
Figure 5:
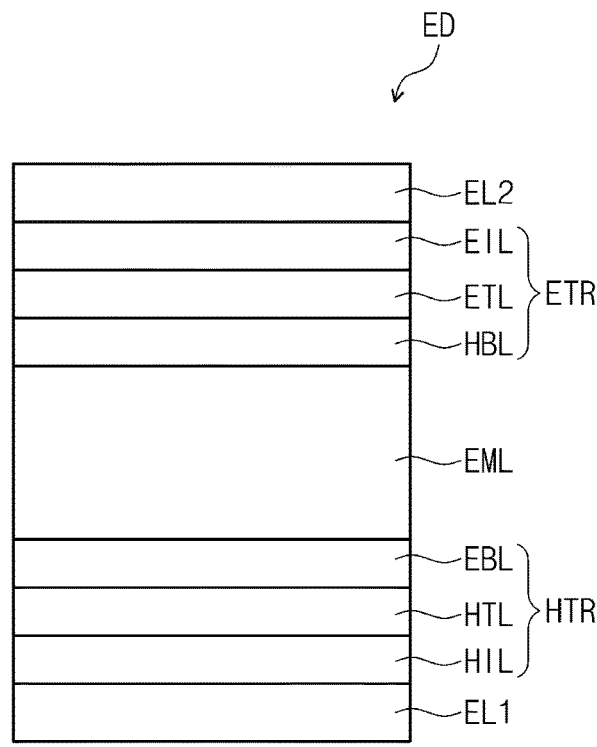
FIG. 5 is a cross-sectional view schematically showing an organic electroluminescence device according to an embodiment of the present disclosure.
Figure 6:
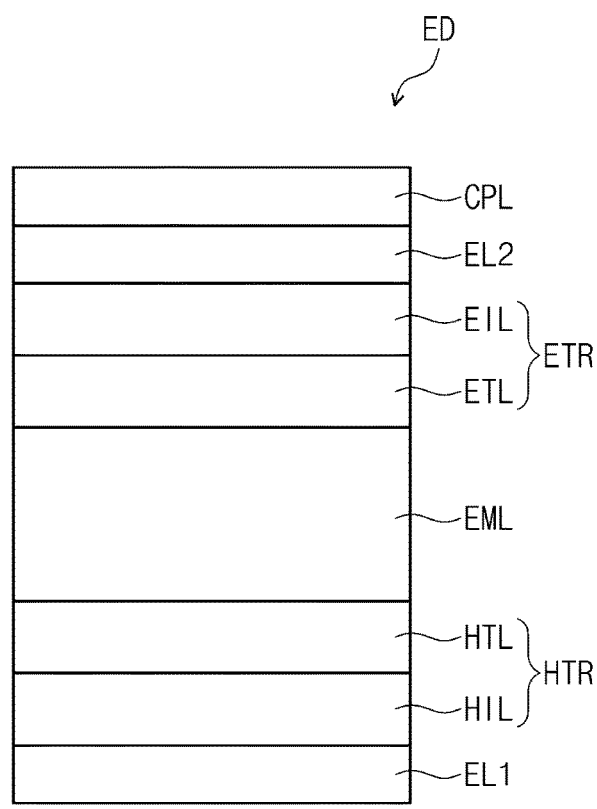
FIG. 6 is a cross-sectional view schematically showing an organic electroluminescence device according to an embodiment of the present disclosure.

Compared with FIG. 3, FIG. 4 shows the cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. Compared with FIG. 3, FIG. 5 shows the cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 shows the cross-sectional view of a light emitting device ED of an embodiment, including a capping layer CPL disposed on the second electrode EL2.

Hereinafter, in the explanation of the light emitting device ED of an embodiment, the amine compound according to an embodiment, which will be explained later, is included in an hole transport region HTR, but embodiments of the present disclosure are not limited thereto, and the amine compound according to an embodiment, may be included in an emission layer EML or an electron transport region ETR.

The first electrode EL1 has conductivity. The first electrode EL1 may be formed utilizing a metal alloy and/or a conductive compound. The first electrode EL1 may be an anode or a cathode. However, embodiments of the present disclosure are not limited thereto. In some embodiments, the first electrode EU may be a pixel electrode. The first electrode EU may be a transmissive electrode, a transflective electrode, or a reflective electrode. If the first electrode EL1 is the transmissive electrode, the first electrode EL1 may be formed utilizing a transparent metal oxide, for example, indium tin oxide (ITO), indium zinc oxide (IZO), zinc oxide (ZnO), and/or indium tin zinc oxide (ITZO). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/calcium (Ca), LiF/aluminum (Al), molybdenum (Mo), titanium (Ti), tungsten (W), indium (In), zinc (Zn), tin (Sn), a compound thereof, a mixture thereof (for example, a mixture of Ag and Mg), or one or more oxides thereof. Also, the first electrode EL1 may have a structure including multiple layers including a reflective layer or a transflective layer formed utilizing the above materials and a transmissive conductive layer formed utilizing ITO, IZO, ZnO, or ITZO. For example, the first electrode EL1 may include a three-layer structure of ITO/Ag/ITO. However, embodiments of the present disclosure are not limited thereto. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include at least one of a hole injection layer HIL, a hole transport layer HTL, a hole buffer layer, an emission auxiliary layer or an electron blocking layer EBL. The thickness of the hole transport region HTR may be from about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, and may have a structure of a single layer formed utilizing a hole injection material and a hole transport material. In some embodiments, the hole transport region HTR may have a structure of a single layer formed utilizing multiple different materials, or a structure stacked from the first electrode EU of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

In the light emitting device ED of an embodiment, the hole transport region HTR may include an amine compound of an embodiment.

The amine compound of an embodiment includes a carbazole group, and a benzo[b]fluorenyl group as substituents. For example, the amine compound of an embodiment includes an amine group and three aromatic ring substituents substituted at the amine group, and the three aromatic ring substituents include a carbazole group, and a benzo[b]fluorenyl group. The benzo[b]fluorenyl group is a substituent in which a benzene ring is additionally fused to a fluorenyl group, and may have a structure of Formula a.

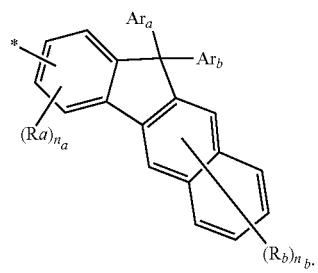

[Formula a]

In Formula a, $Ar_a$ and $Ar_b$ may each independently be a substituted or unsubstituted aryl group of 6 to 30 ring-forming carbon atoms, or a substituted or unsubstituted heteroaryl group of 2 to 30 ring-forming carbon atoms. For example, $Ar_a$ and $Ar_b$ may each independently be a substituted or unsubstituted phenyl group, a substituted or unsubstituted biphenyl group, or a substituted or unsubstituted naphthyl group.

In Formula a, $R_a$ and $R_b$ may each independently be a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. For example, $R_a$ and $R_b$ may be (e.g., both be) hydrogen atoms.

In Formula a, "—*" represents a position where a benzo[b]fluorenyl group substituent is connected with an amine group.

In Formula a, $n_a$ may be an integer of 0 to 3, and $n_4$ may be an integer of 0 to 6. In Formula a, when $n_a$ is 0, the benzo[b]fluorenyl substituent of an embodiment may effectively not be substituted with $R_a$. For example, Formula a where $n_a$ is 3 and all $R_a$ are hydrogen atoms may be substantially the same as Formula a where $n_a$ is 0. In Formula a, when $n_a$ is an integer of 2 or more, the multiple $R_a$ groups may be the same or different. In Formula a, when $n_b$ is 0, the benzo[b]fluorenyl substituent of an embodiment may effectively not be substituted with $R_b$. For example, Formula a where $n_b$ is 3 and all $R_b$ are hydrogen atoms may be substantially the same as Formula a where $n_b$ is 0. In Formula a, when $n_b$ is an integer of 2 or more, the multiple $R_b$ groups may be the same or different.

The amine group is connected with a fluorenyl moiety in the benzo[b]fluorenyl group. The amine group is connected with a benzene ring to which a benzene ring is not additionally fused, within the fluorenyl moiety of the benzo[b]fluorenyl group. Each of the carbazole group and the benzo[b]fluorenyl group included in the amine compound may be bonded to an amine group directly or via a linker. In an embodiment, the linker connecting each of the carbazole group and the benzo[b]fluorenyl group with the amine group may be a substituted or unsubstituted arylene group of 6 to 30 ring-forming carbon atoms, or a substituted or unsubstituted heteroarylene group of 2 to 30 ring-forming carbon atoms.

The amine compound of an embodiment may be a monoamine compound. The amine compound may include one amine group in its compound structure.

The amine compound of an embodiment may be represented by Formula 1.

[Formula 1]

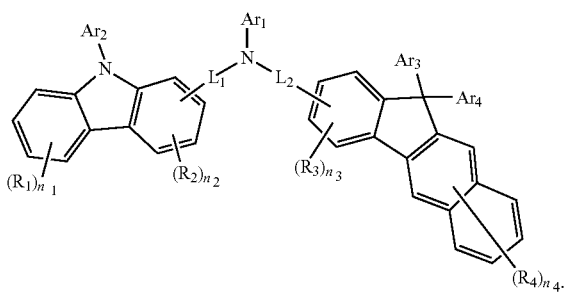

In Formula 1, $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms. In an embodiment, $Ar_1$ to $Ar_4$ may each independently be a substituted or unsubstituted phenyl group, a substituted or unsubstituted biphenyl group, a substituted or unsubstituted aryl group in which two or more rings are fused, or a substituted or unsubstituted heteroaryl group in which two or more rings are fused. $Ar_1$ to $Ar_4$ may each independently be a substituted or unsubstituted phenyl group, a substituted or unsubstituted biphenyl group, a substituted or unsubstituted naphthyl group, a substituted or unsubstituted dibenzofuran group, or a substituted or unsubstituted dibenzothiophene group. $Ar_1$ may be a substituted or unsubstituted phenyl group, a substituted or unsubstituted o-biphenyl group, a substituted or unsubstituted m-biphenyl group, a substituted or unsubstituted p-biphenyl group, a substituted or unsubstituted naphthyl group, a substituted or unsubstituted dibenzofuran group, or a substituted or unsubstituted dibenzothiophene group. $Ar_2$ may be a substituted or unsubstituted phenyl group, a substituted or unsubstituted o-biphenyl group, a substituted or unsubstituted m-biphenyl group, a substituted or unsubstituted p-biphenyl group, or a substituted or unsubstituted naphthyl group. $Ar_3$ and $Ar_4$ may each independently be a substituted or unsubstituted phenyl group, a substituted or unsubstituted o-biphenyl group, a substituted or unsubstituted m-biphenyl group, a substituted or unsubstituted p-biphenyl group, or a substituted or unsubstituted naphthyl group.

In Formula 1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In an embodiment, $L_1$ and $L_2$ may each independently be a direct linkage, or a substituted or unsubstituted phenylene group. For example, $L_1$ and $L_2$ may each independently be a direct linkage, or an unsubstituted phenylene group. $L_1$ and $L_2$ may each independently be a direct linkage, an unsubstituted o-phenylene group, an unsubstituted m-phenylene group, or an unsubstituted p-phenylene group.

In Formula 1, $R_1$ to $R_4$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula 1, cases where $R_1$ to $R_4$ are combined with adjacent groups to form rings, respectively, may be excluded. For example, in the amine compound represented by Formula 1, the carbazole group and the benzo[b]fluorenyl group may not form additional rings other than a carbazole moiety and a benzo[b]fluorenyl moiety. In an embodiment, each of $R_1$ to $R_4$ may be hydrogen atom.

In Formula 1, "$n_1$" may be an integer of 0 to 4, "$n_2$" and "$n_3$" may each independently be an integer of 0 to 3, and "$n_4$" may be an integer of 0 to 6. In Formula 1, when $n_1$ is 0, the amine compound of an embodiment may effectively not be substituted with $R_1$. For example, Formula 1 where $n_1$ is 4 and all $R_1$ are hydrogen atoms may be substantially the same as Formula 1 where $n_1$ is 0. In Formula 1, when $n_1$ is an integer of 2 or more, multiple $R_1$ groups may be the same or different. In Formula 1, when "$n_2$" is 0, the amine compound of an embodiment may not be substituted with $R_2$. For example, Formula 1 where $n_2$ is 3 and all $R_2$ are hydrogen atoms may be substantially the same as Formula 1 where $n_2$ is 0. In Formula 1, when $n_2$ is an integer of 2 or more, multiple $R_2$ groups may be the same or different. In Formula 1, when $n_3$ is 0, the amine compound of an embodiment may not be substituted with $R_3$. For example, Formula 1 where $n_3$ is 3 and all $R_3$ are hydrogen atoms may be substantially the same as Formula 1 where $n_3$ is 0. In Formula 1, when $n_2$ is an integer of 2 or more, multiple $R_3$ groups may be the same or different. In Formula 1, when $n_4$ is 0, the amine compound of an embodiment may effectively not be substituted with $R_4$. Formula 1 where $n_4$ is 6 and all $R_4$ are hydrogen atoms may be substantially the same as Formula 1 where $n_4$ is 0. In Formula 1, when $n_4$ is an integer of 2 or more, multiple $R_4$ groups may be the same or different.

The amine compound of an embodiment includes a carbazole group and a benzo[b]fluorenyl group as substituents connected to the amine nitrogen. Because the amine compound of an embodiment includes the carbazole group and the benzo[b]fluorenyl group as substituents, intermolecular hole transport capacity may be improved through the stabilization of a compound structure. Accordingly, an organic electroluminescence device including the amine compound of an embodiment as a hole transport material may have increased life (life span) due to the prevention or reduction of the damage of materials by excessive charge, and may achieve high emission efficiency, low driving voltage, and/or high luminance.

The amine compound represented by Formula 1 may be represented by any one among Formula 2-1 to Formula 2-3.

[Formula 2-1]

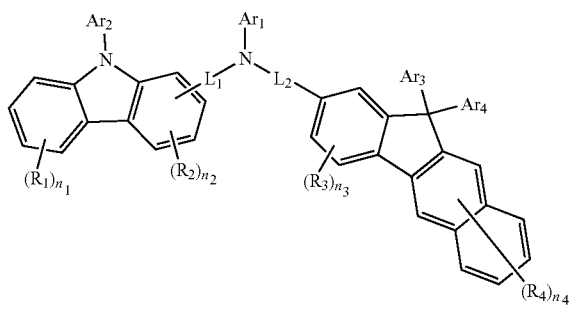

[Formula 2-2]

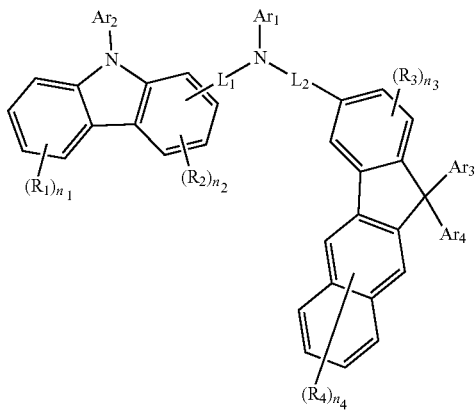

[Formula 2-3]

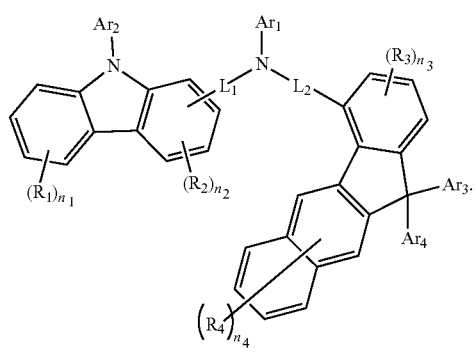

Formula 2-1 to Formula 2-3 are structures of Formula 1 in which the carbon position of the benzo[b]fluorenyl group moiety combined with the central nitrogen atom of an amine compound via $L_2$ is specified.

According to Formula 2-1, in the amine compound of an embodiment, the benzo[b]fluorenyl group may be connected at a carbon position number of 2 with the central nitrogen atom of the amine group via $L_2$. According to Formula 2-2, in the amine compound of an embodiment, the benzo[b]fluorenyl group may be connected at a carbon position number of 3 with the central nitrogen atom of the amine group via $L_2$. According to Formula 2-3, in the amine compound of an embodiment, the benzo[b]fluorenyl group may be connected at a carbon position number of 4 with the central nitrogen atom of the amine group via $L_2$.

In Formula 2-1 to Formula 2-3, the same explanations of $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" referring to Formula 1 may be applied.

The amine compound represented by Formula 1 may be represented by Formula 3-1 or Formula 3-2.

[Formula 3-1]

[Formula 3-2]

Formula 3-1 and Formula 3-2 are structures of Formula 1 in which the carbon position of the carbazole group moiety combined with the central nitrogen atom of an amine compound via $L_2$ is specified.

According to Formula 3-1, in the amine compound of an embodiment, the carbazole group may be connected at a carbon position number of 2 with the central nitrogen atom of the amine group via $L_1$. According to Formula 3-2, in the amine compound of an embodiment, the carbazole group may be connected at a carbon position number of 3 with the central nitrogen atom of the amine group via $L_1$.

In Formula 3-1 and Formula 3-2, the same explanations of $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" referring to Formula 1 may be applied.

The amine compound represented by Formula 1 may be represented by Formula 4-1 or Formula 4-2.

[Formula 4-1]

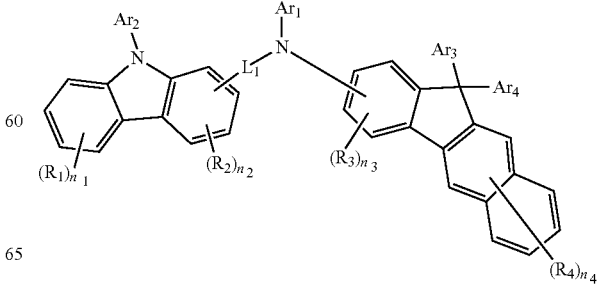

[Formula 4-2]

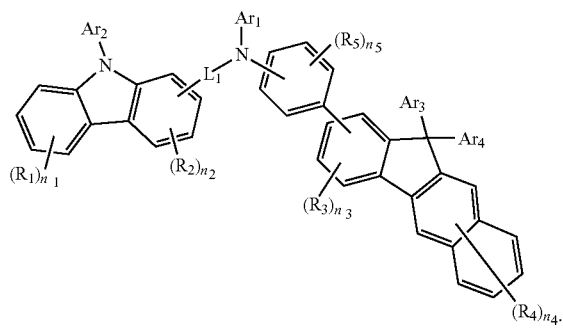

Formula 4-1 and Formula 4-2 are structures of Formula 1 in which $L_2$ is specified to a particular structure. Formula 4-1 is Formula 1 where $L_2$ is a direct linkage. Formula 4-2 is Formula 1 where $L_2$ is a substituted or unsubstituted phenylene group.

In Formula 4-2, $R_5$ may be a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. In an embodiment, $R_5$ may be a hydrogen atom.

In Formula 4-2, "$n_5$" may be an integer of 0 to 4. In Formula 4-2, when $n_5$ is 0, the amine compound of an embodiment may not be substituted with $R_5$. For example, Formula 4-2 where $n_5$ is 4 and all $R_5$ are hydrogen atoms may be substantially the same as Formula 4-2 where $n_5$ is 0. In Formula 4-2, when $n_5$ is an integer of 2 or more, multiple $R_5$ groups may be the same or different.

In Formula 4-1 and Formula 4-2, the same explanations of $Ar_1$, $Ar_2$, $Ar_3$, $Ar_4$, $L_1$, $R_1$, $R_2$, $R_3$, $R_4$, "$n_1$", "$n_2$", "$n_3$", and "$n_4$" referring to Formula 1 may be applied.

The amine compound represented by Formula 1 may be represented by Formula 5-1 or Formula 5-2.

[Formula 5-1]

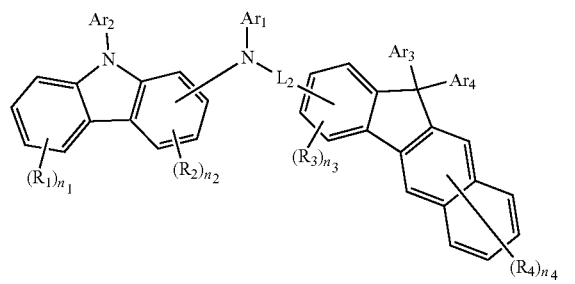

[Formula 5-2]

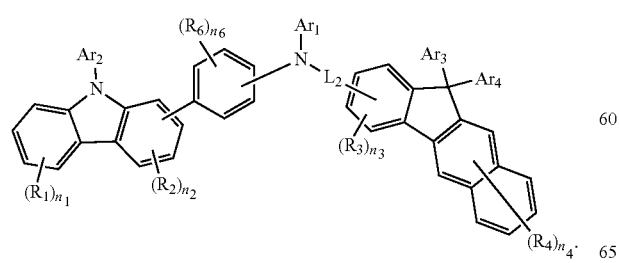

Formula 5-1 and Formula 5-2 are structures of Formula 1 in which $L_1$ is specified to a particular structure. Formula 5-1 corresponds to Formula 1 where $L_1$ is a direct linkage. Formula 5-2 corresponds to Formula 1 where $L_1$ is a substituted or unsubstituted phenylene group.

In Formula 5-2, $R_6$ may be a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. In an embodiment, $R_6$ may be a hydrogen atom.

In Formula 5-2, "$n_4$" may be an integer of 0 to 4. In Formula 5-2, when $n_6$ is 0, the amine compound of an embodiment may not be substituted with $R_6$. For example, Formula 5-2 where $n_6$ is 4 and all $R_6$ groups are hydrogen atoms may be substantially the same as Formula 5-2 where $n_6$ is 0. In Formula 5-2, when $n_6$ is an integer of 2 or more, multiple $R_6$ groups may be the same or different.

In some embodiments, in Formula 5-1 and Formula 5-2, the same explanations of $Ar_1$, $Ar_2$, $Ar_3$, $Ar_4$, $L_2$, $R_1$, $R_2$, $R_3$, $R_4$, "$n_1$", "$n_2$", "$n_3$", and "$n_4$" referring to Formula 1 and Formula 3 may be applied.

The amine compound of an embodiment may be at least one among the compounds represented in Compound Group 1. In some embodiments, the light emitting device ED of an embodiment may include at least one amine compound among the compounds represented in Compound Group 1 in the hole transport region HTR. In some embodiments, the light emitting device ED of an embodiment may include at least one amine compound among the compounds represented in Compound Group 1 in the hole transport layer HTL.

[Compound Group 1]

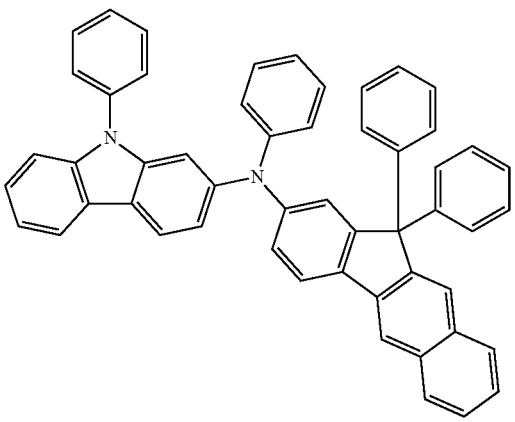

1

2
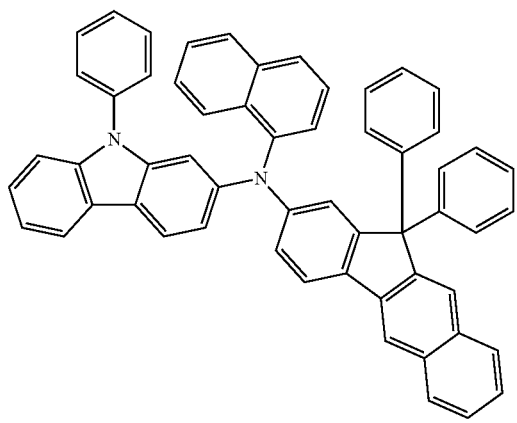
3
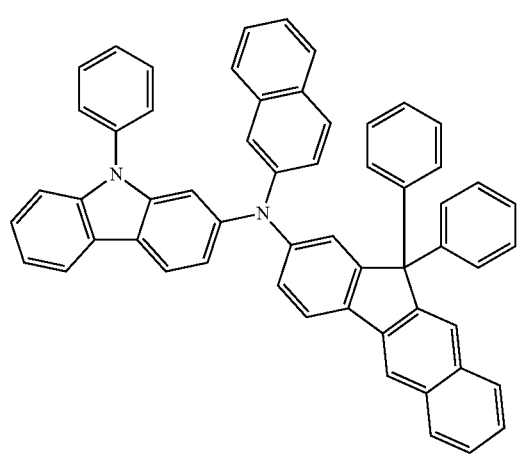
4
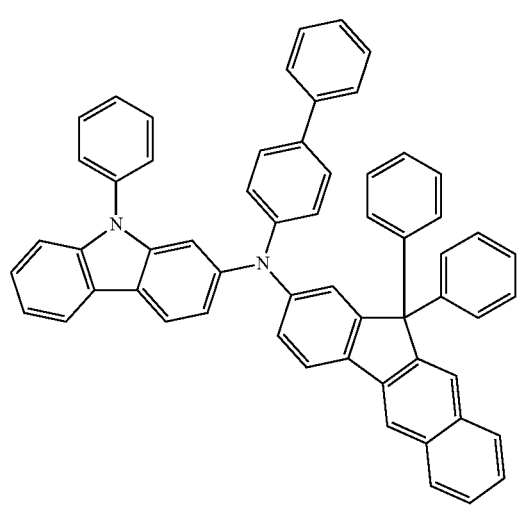
5
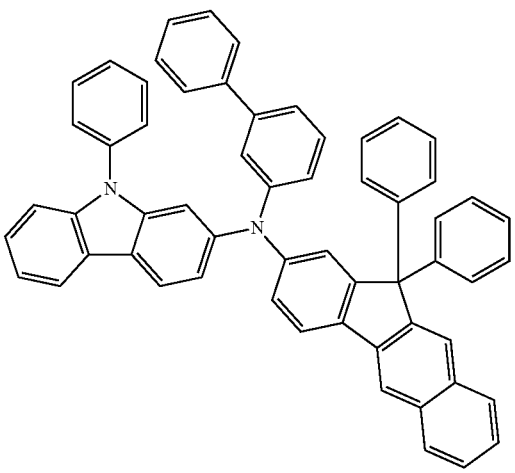
6
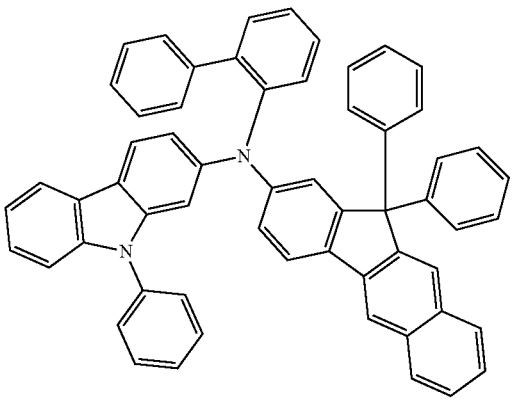
7
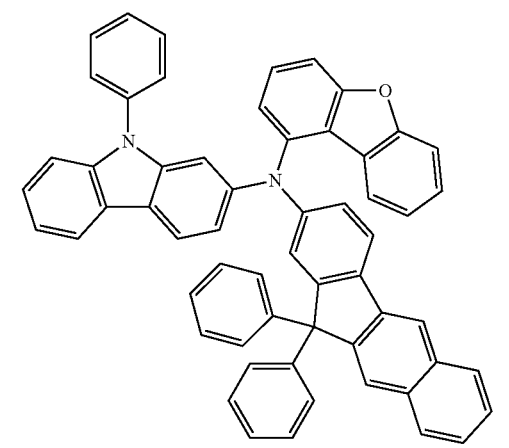

8
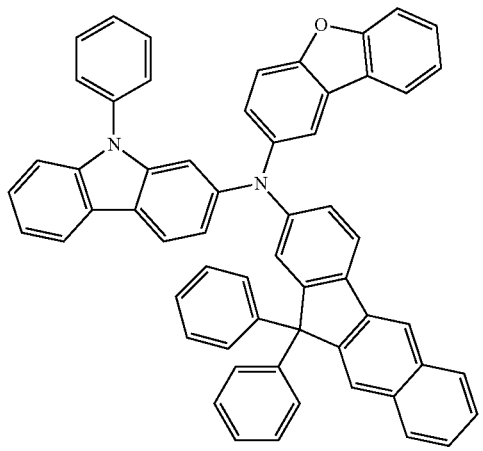
9
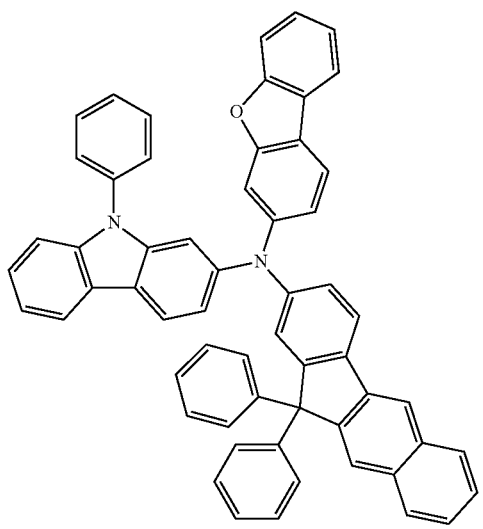
10
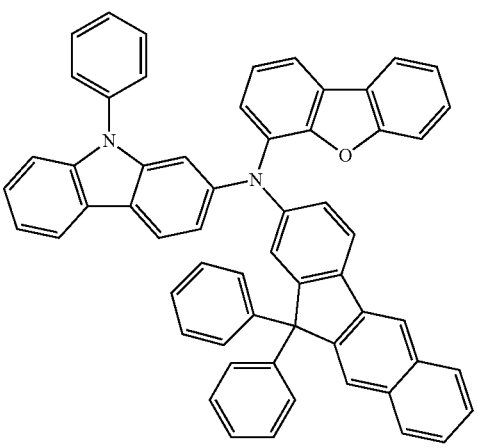
11
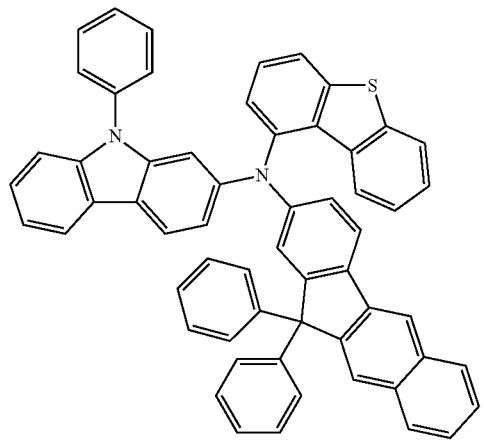
12
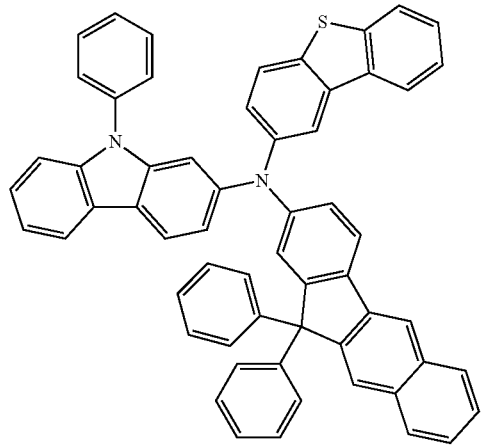
13
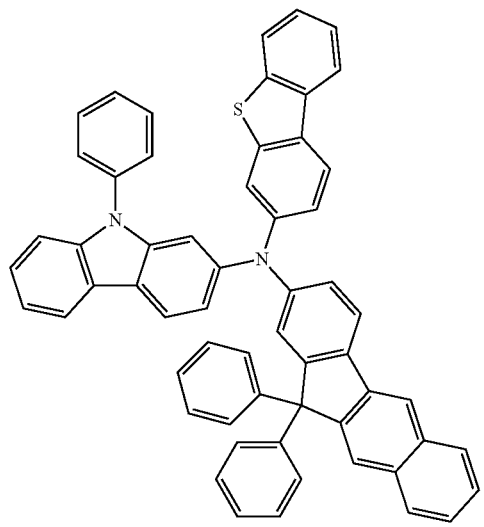

14
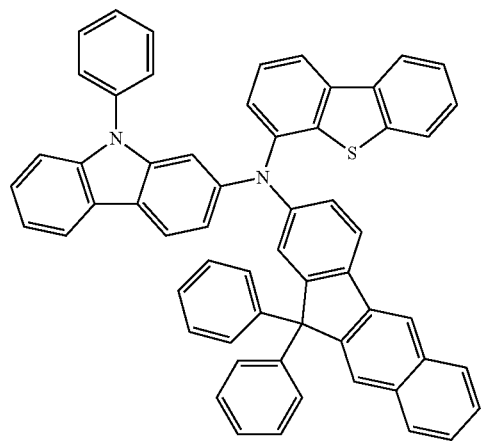
15
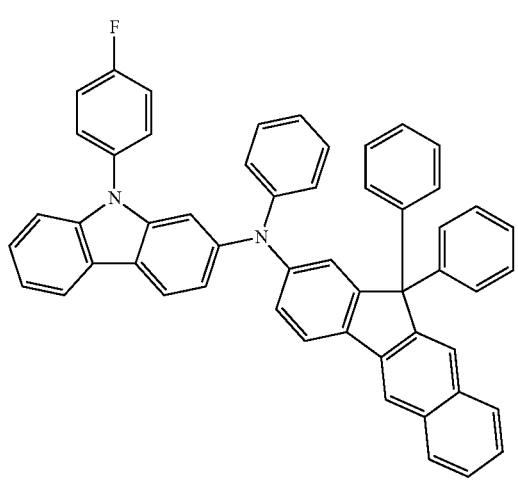
16
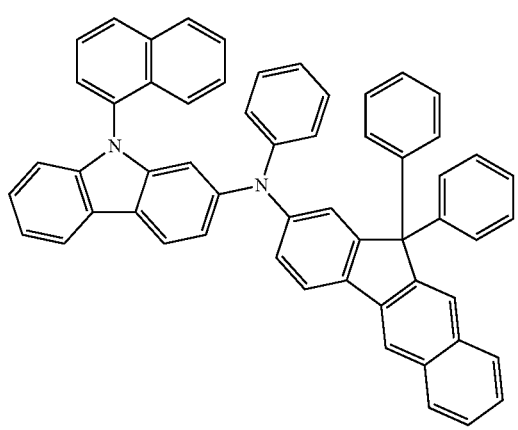
17
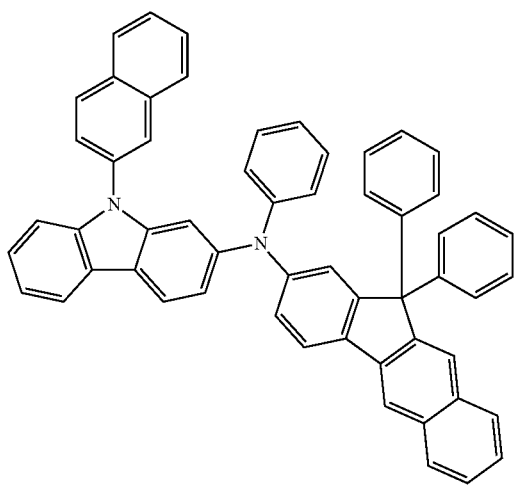
18
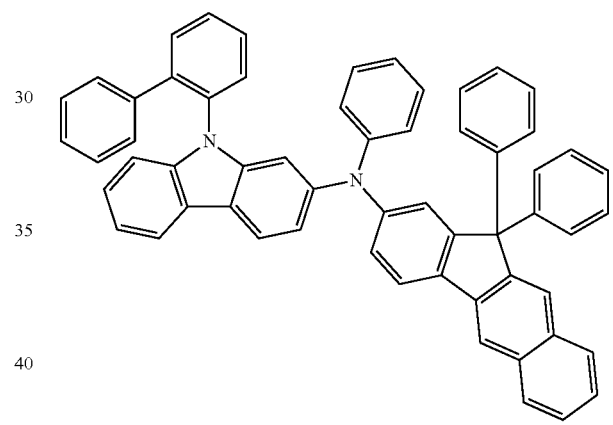
19
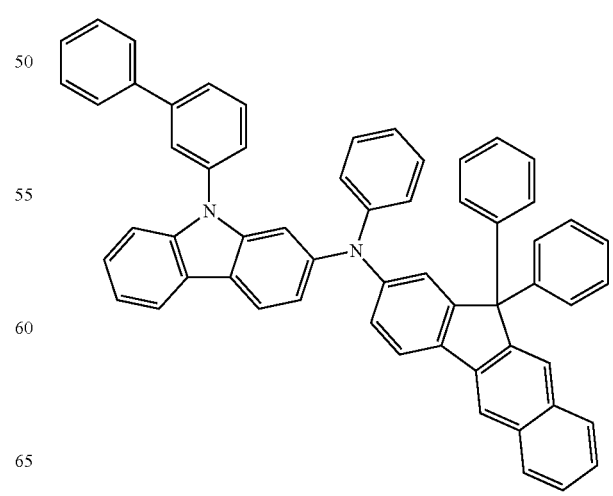

20
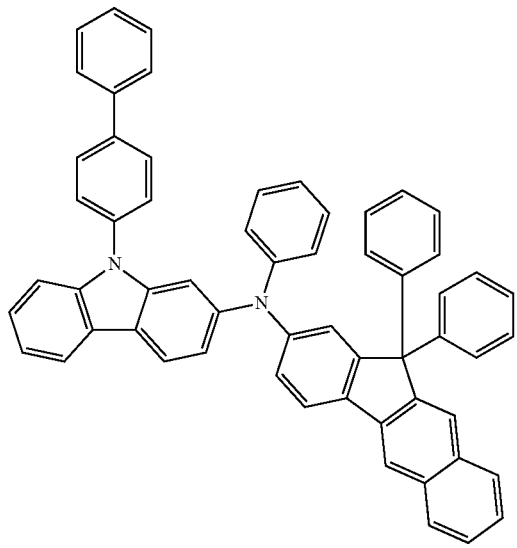
23
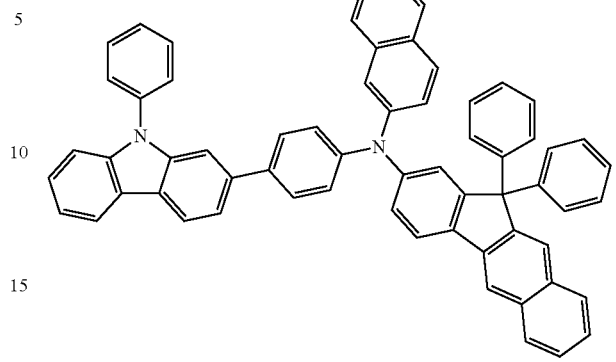
21
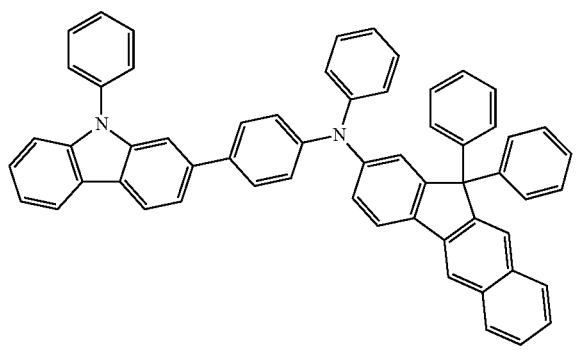
24
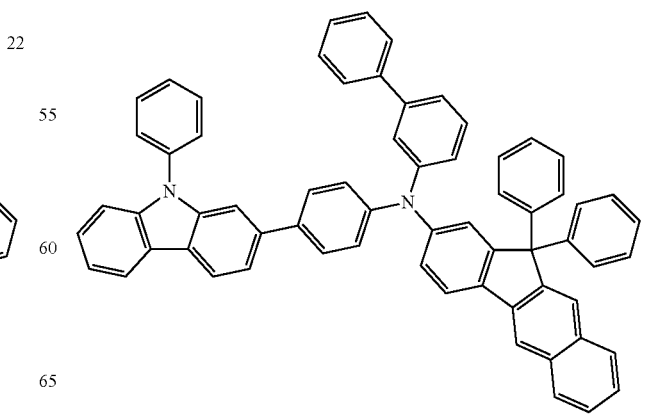
22
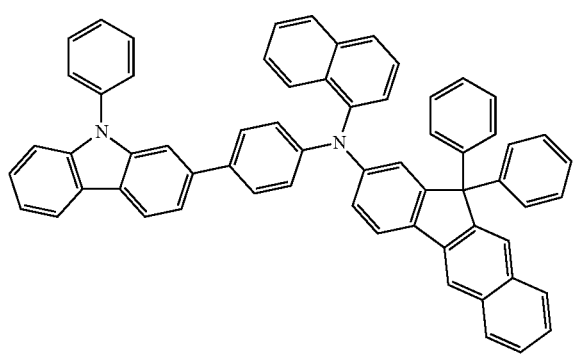
25

26
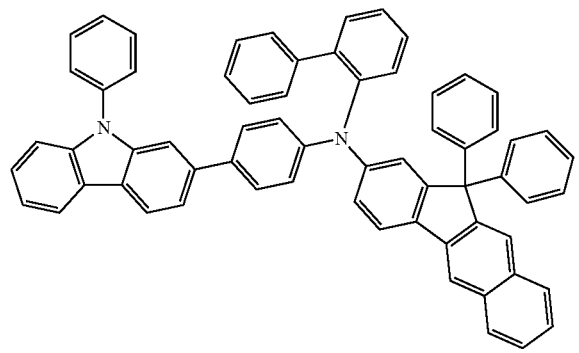
27
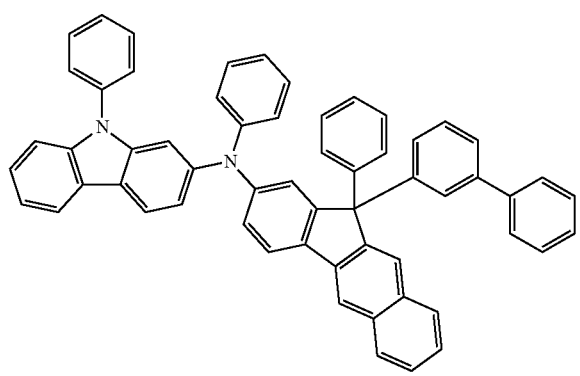
28
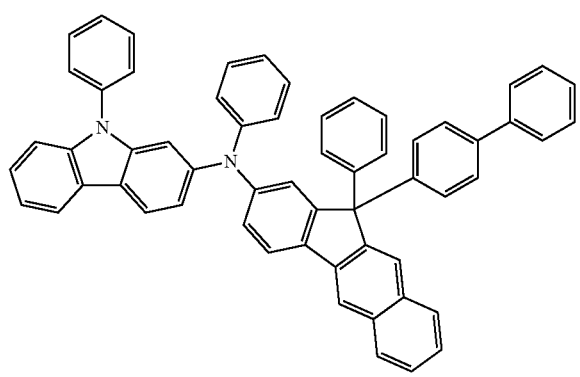
29
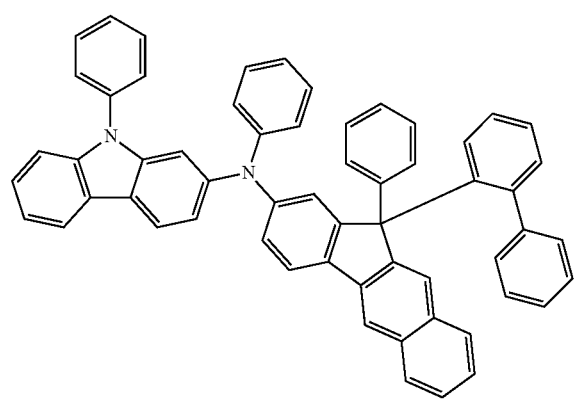
30
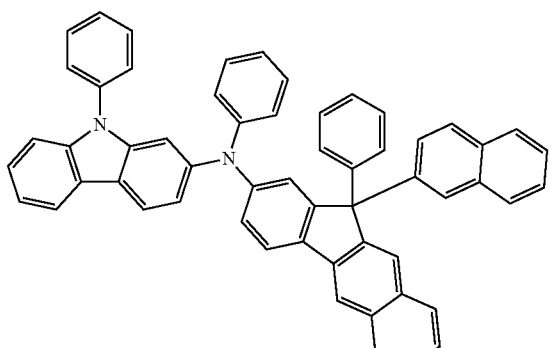
31
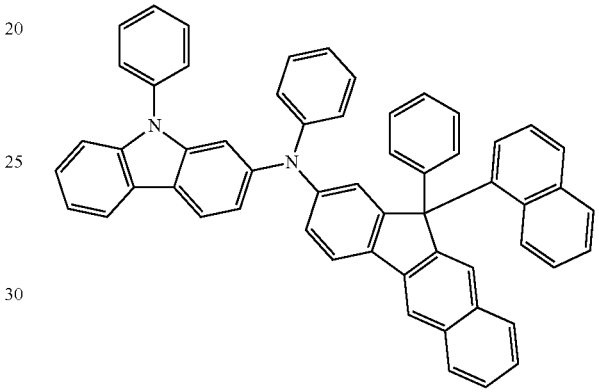
32
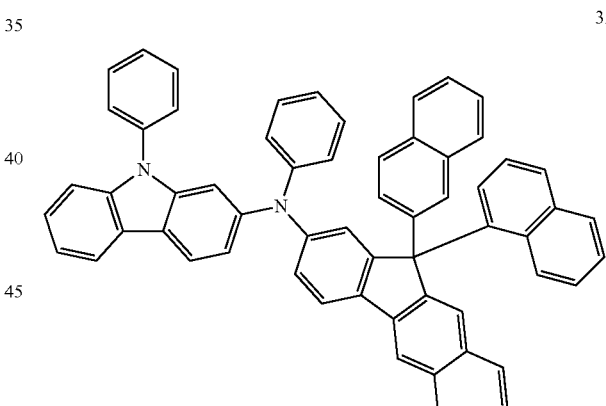
33
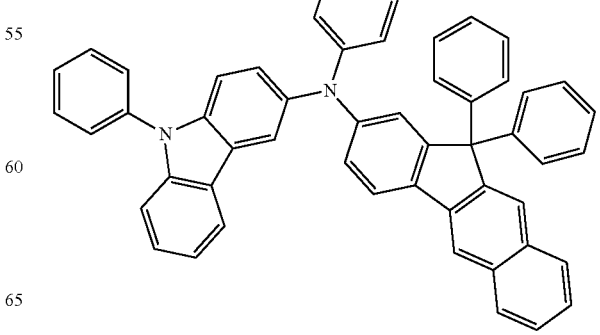

34
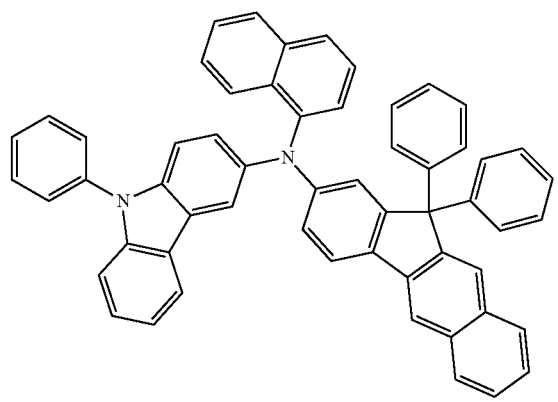
35
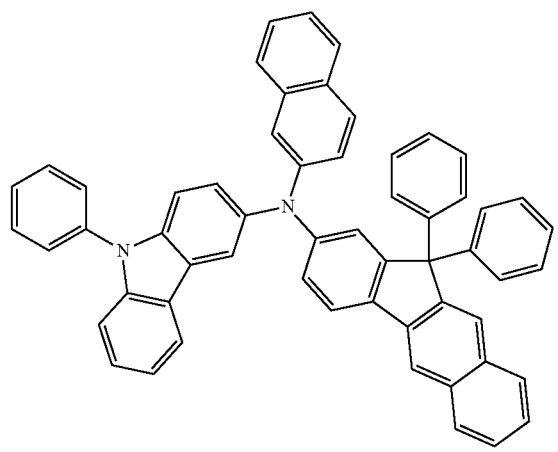
36
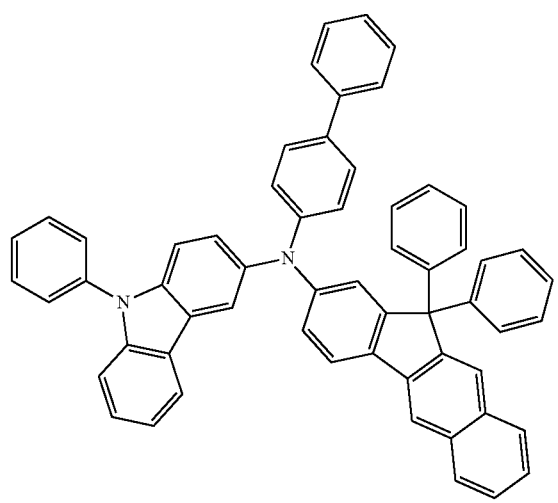
37
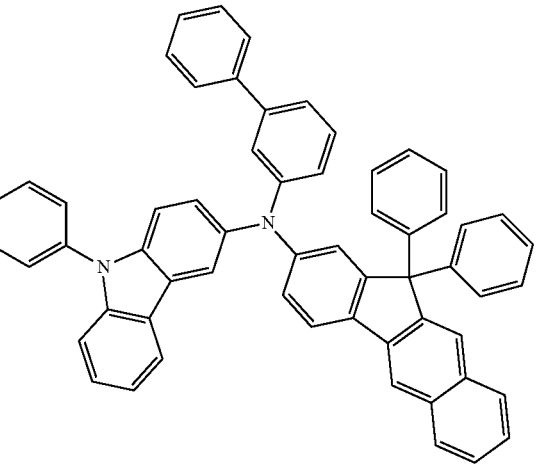
38
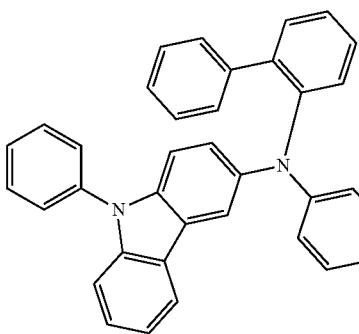
39
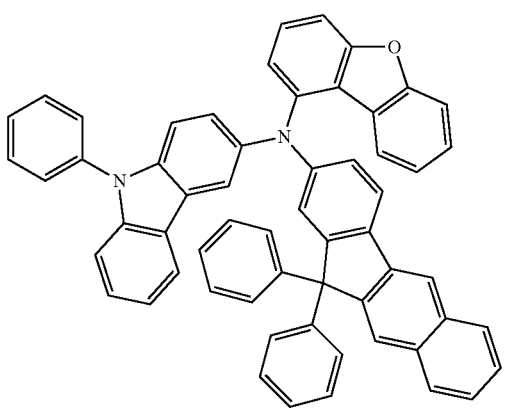

40
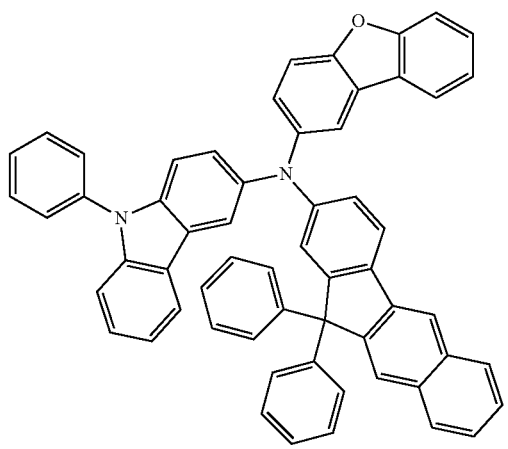
41
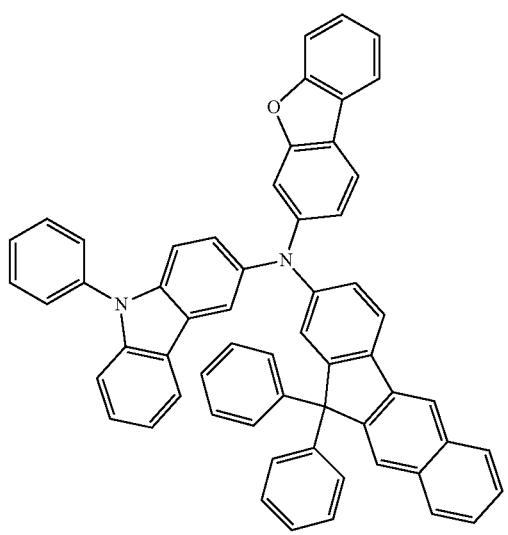
42
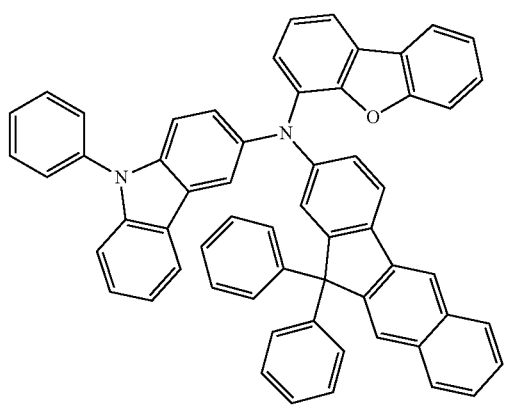
43
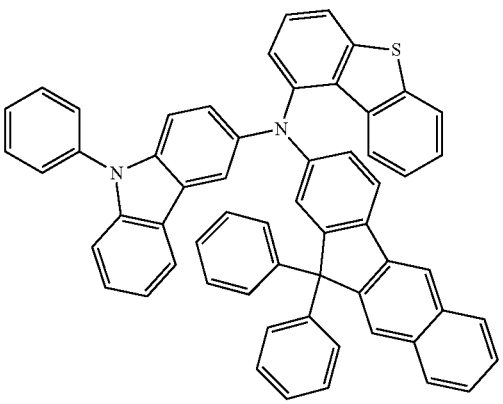
44
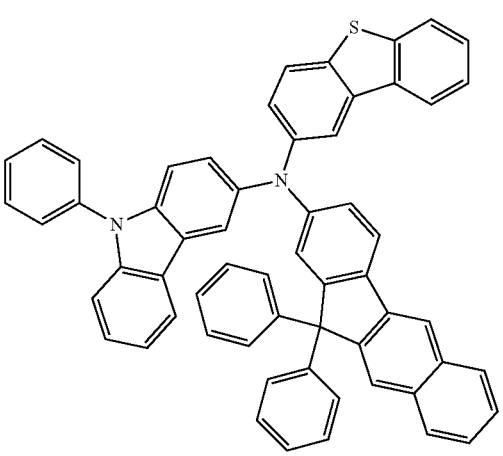
45
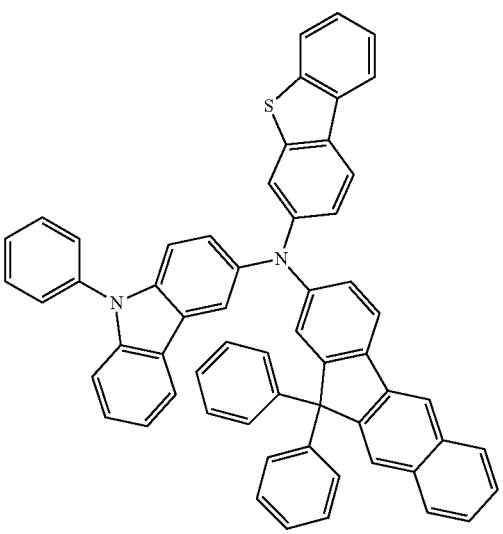

46
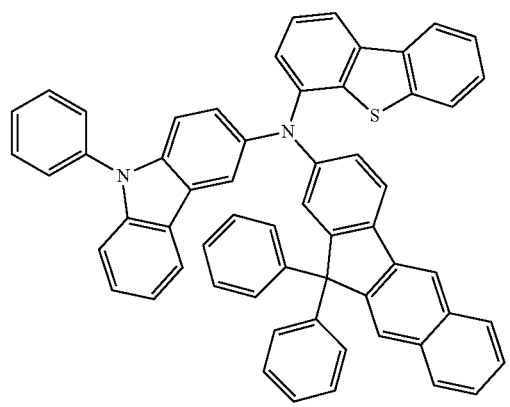
50
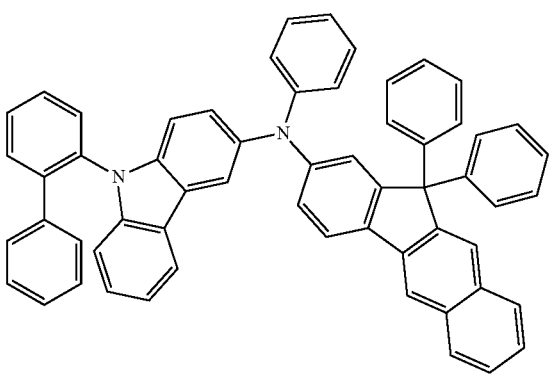
47
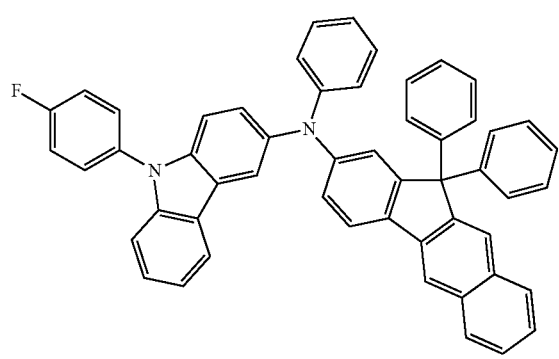
51
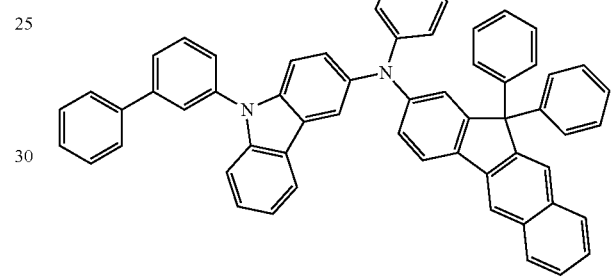
48
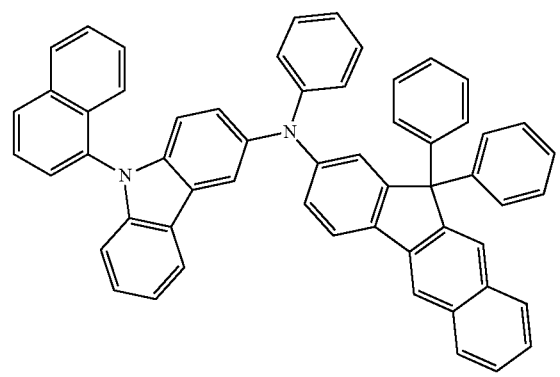
52
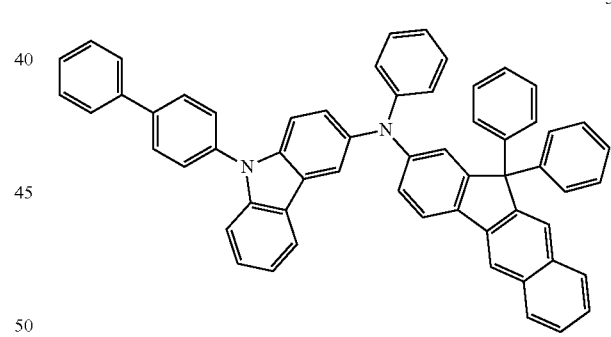
49
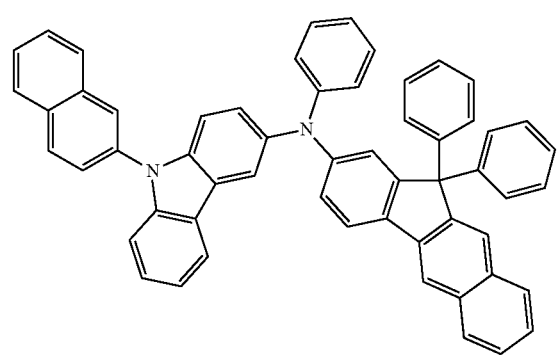
53
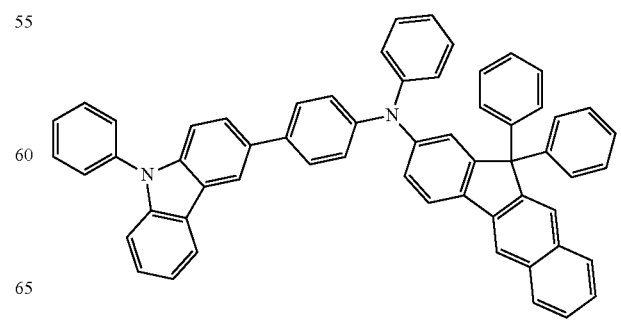

54
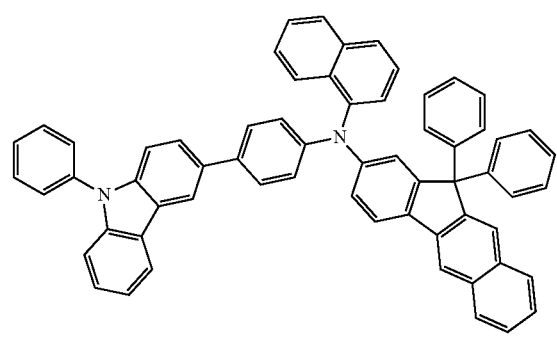
55
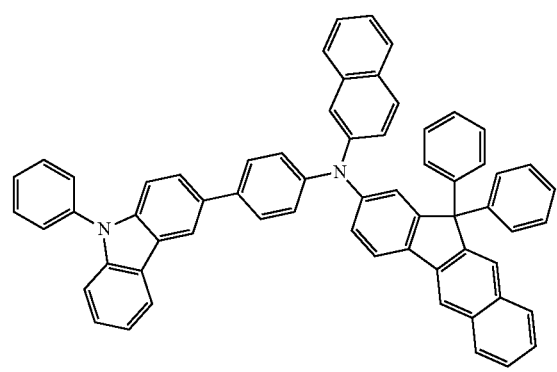
56
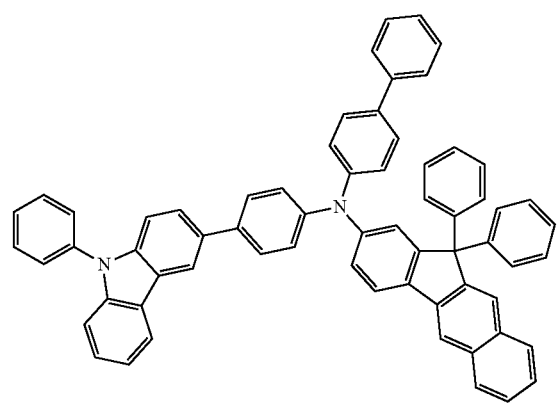
57
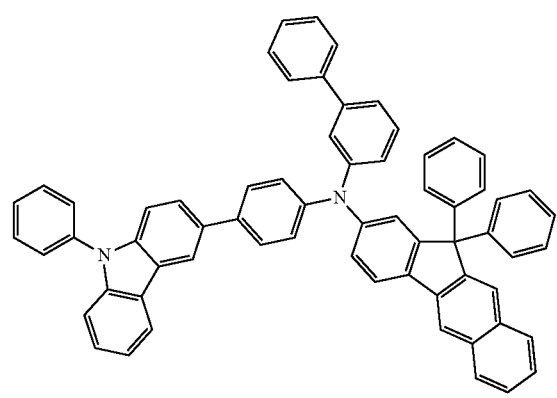
58
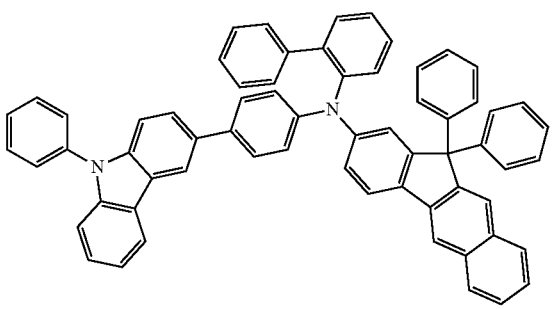
59
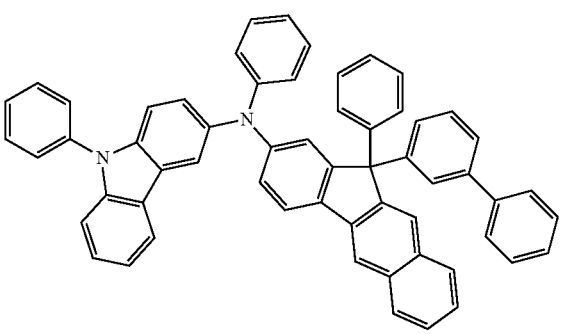
60
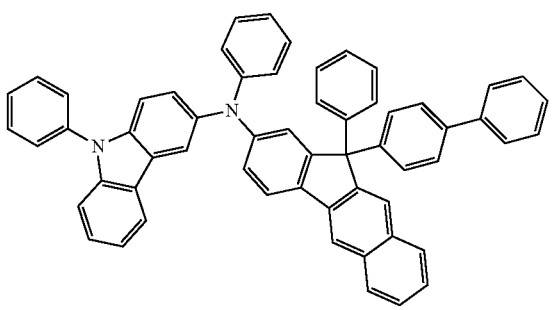
61
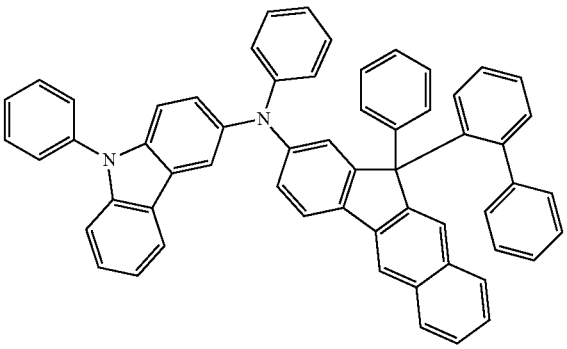

62
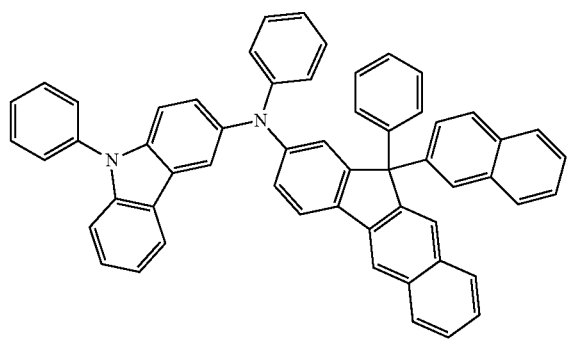
63
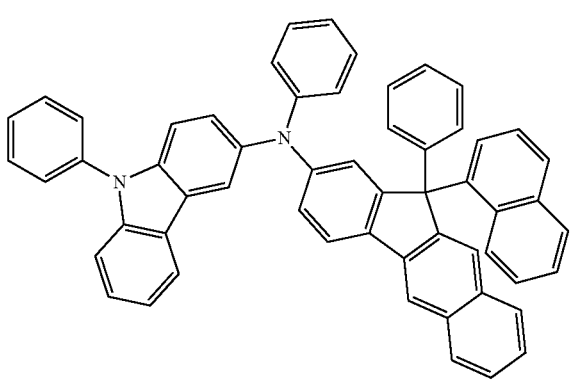
64
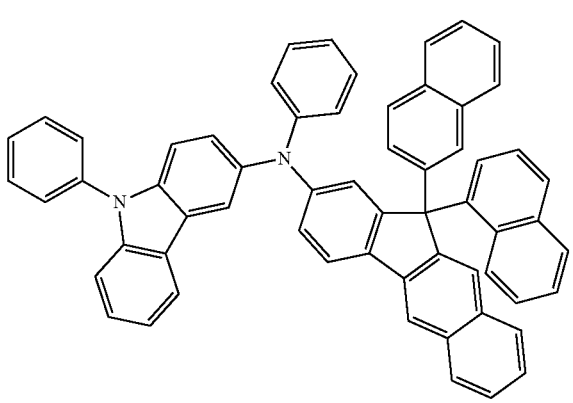
65
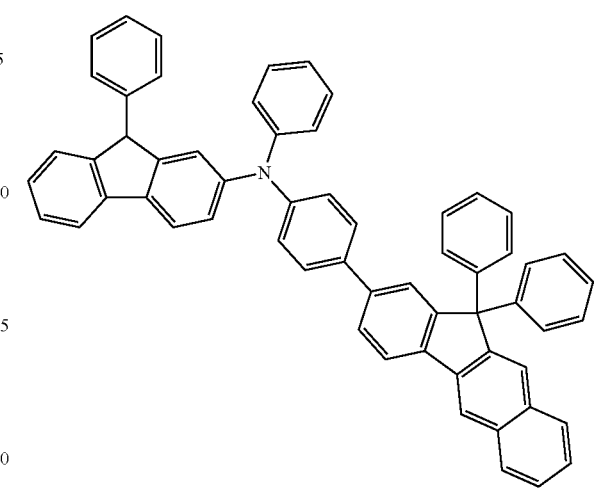
66
67
68
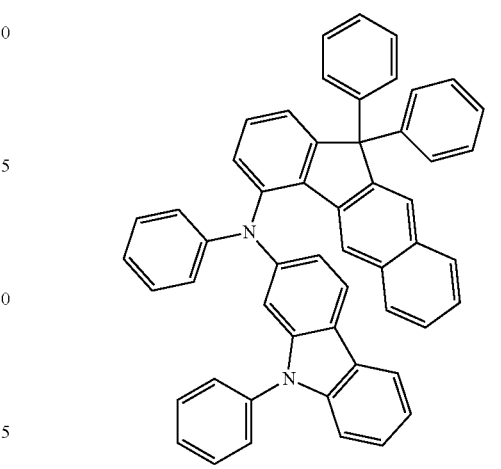

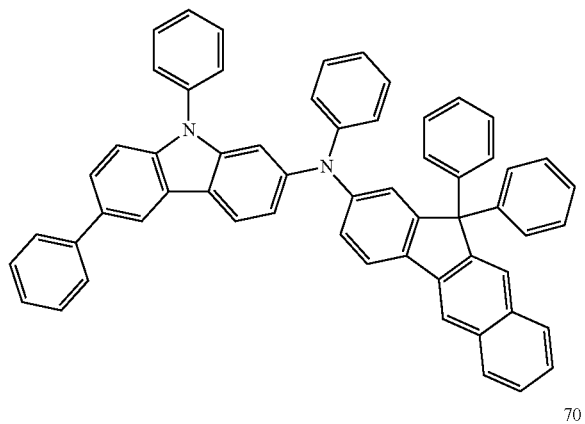
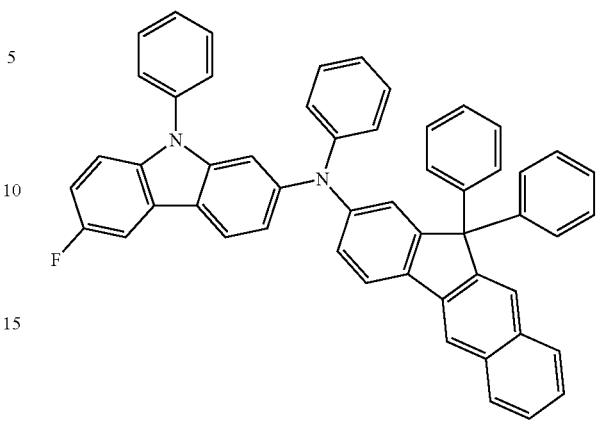
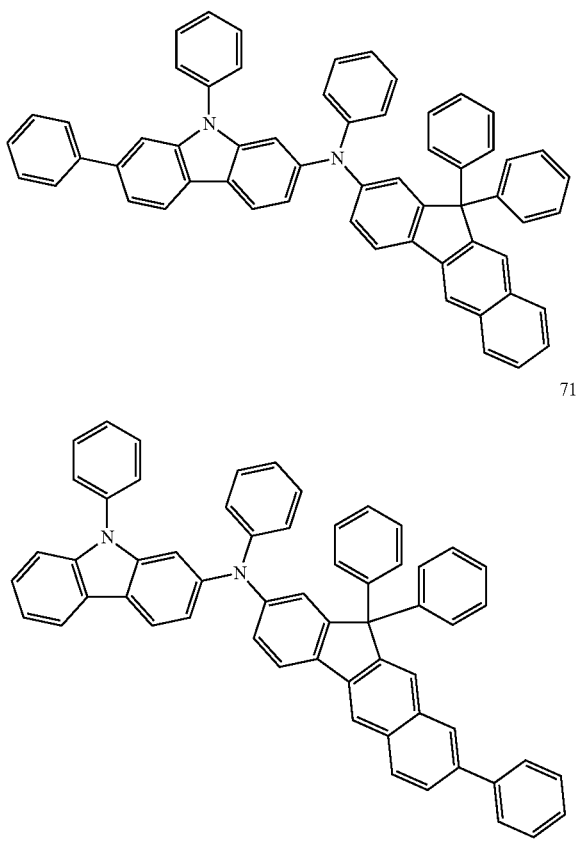
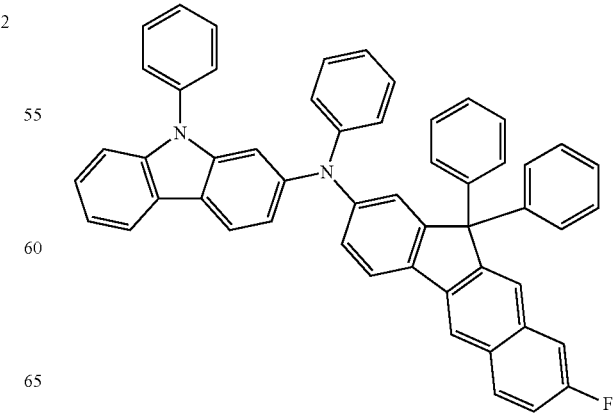

-continued
76
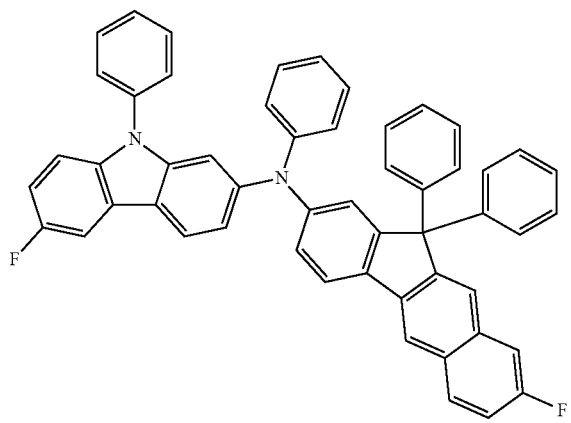
77
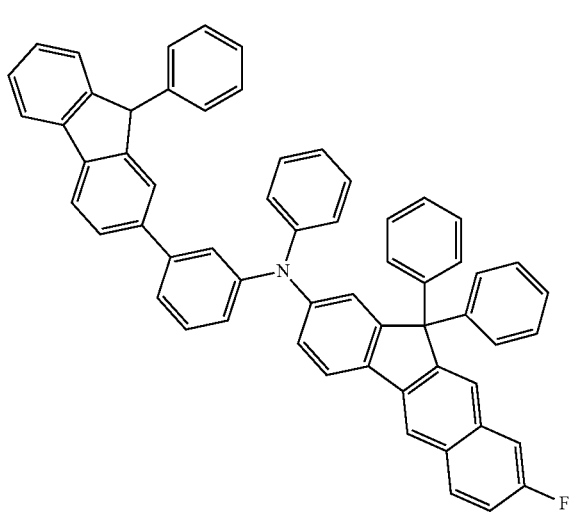
78
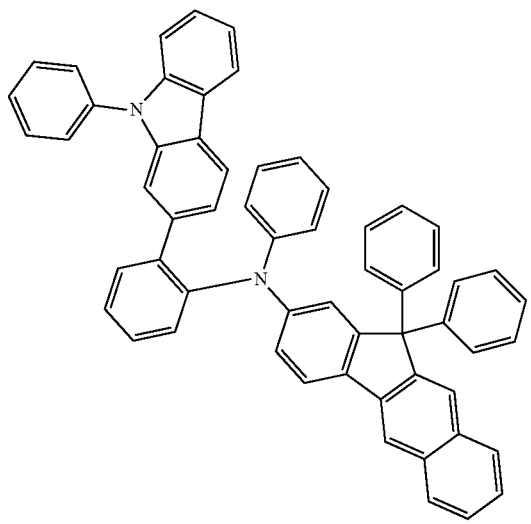
-continued
79
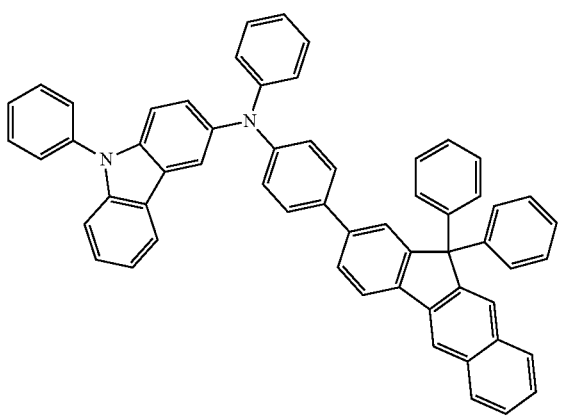
80
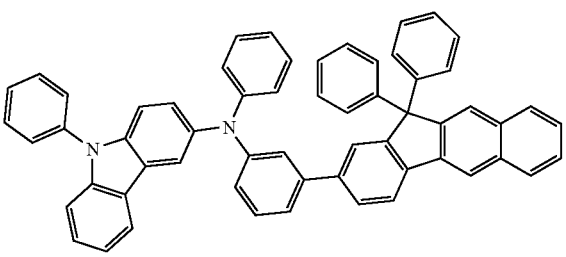
81
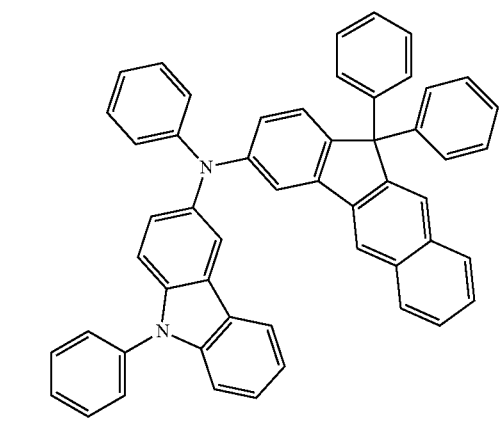
82
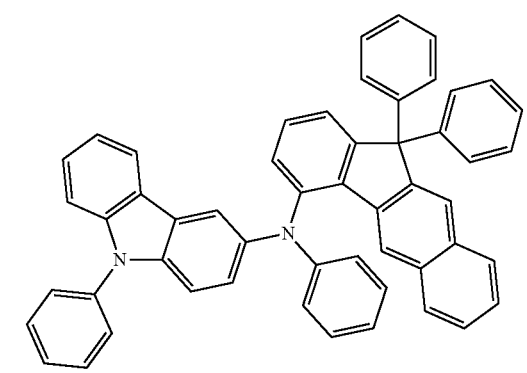

-continued
83
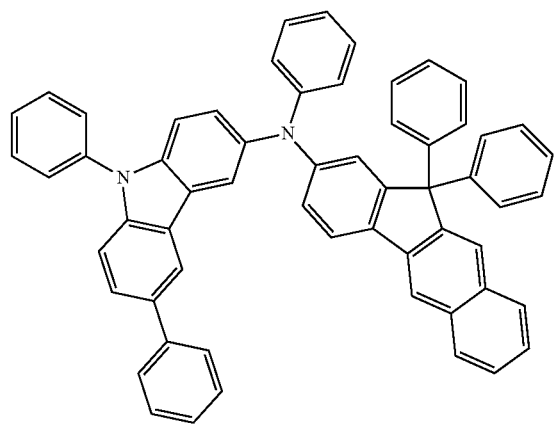
84
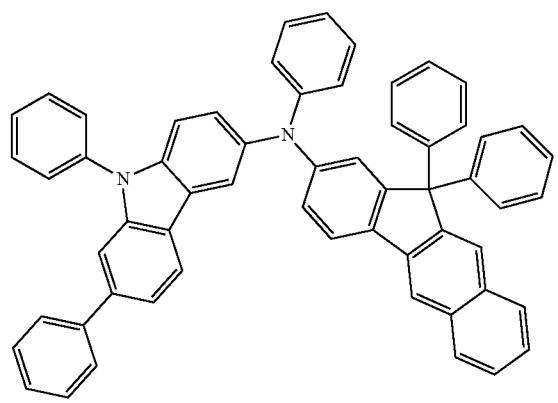
85
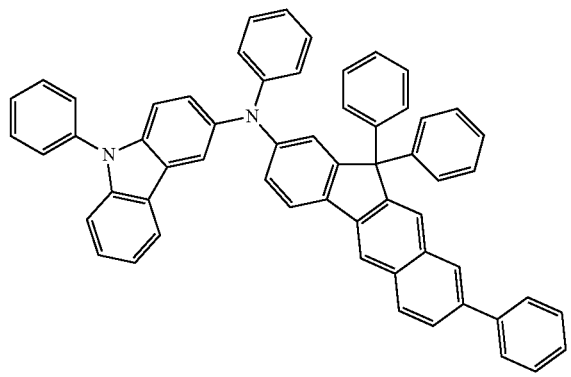
86
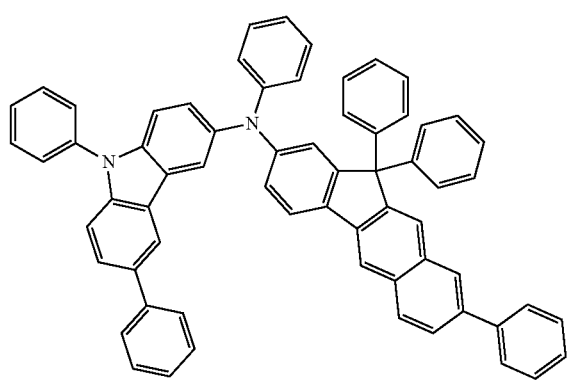
-continued
87
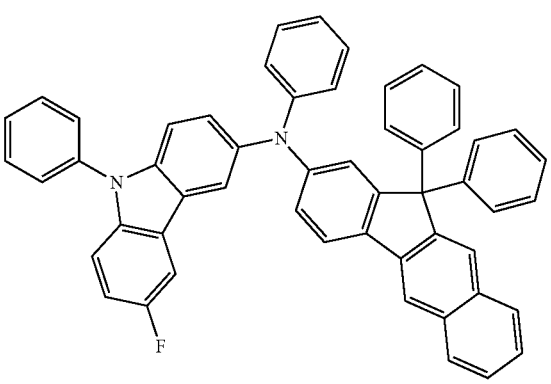
88
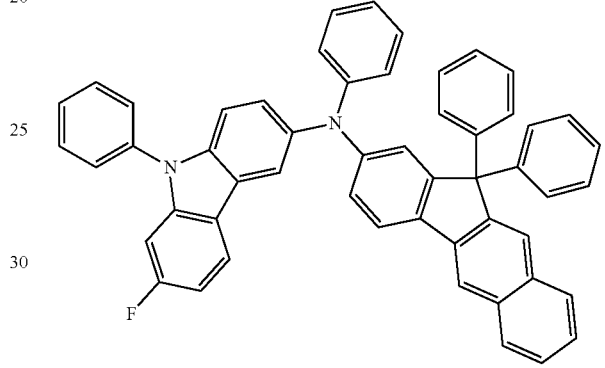
89
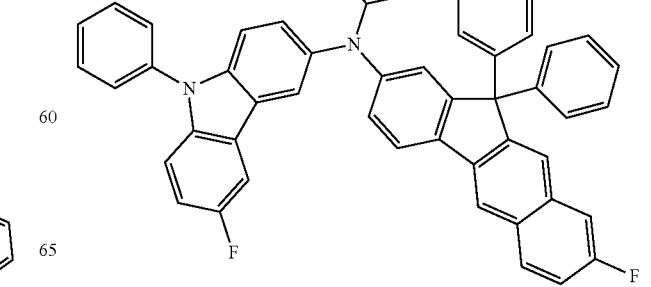
90
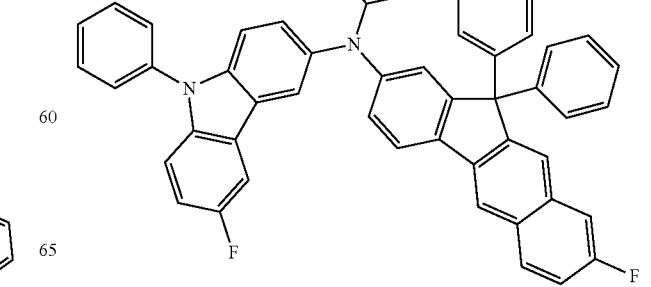

-continued

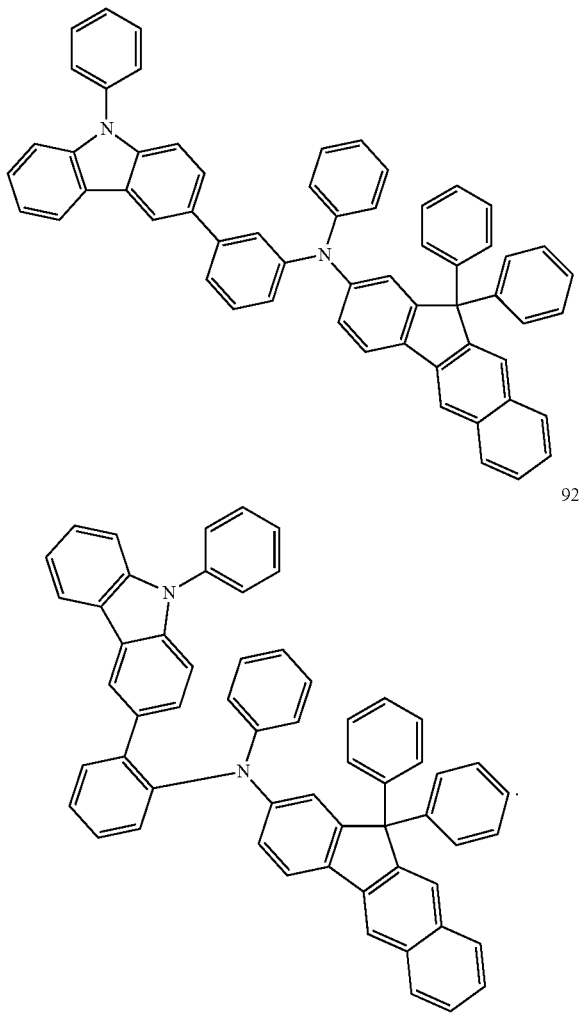

In some embodiments, in the light emitting device ED of an embodiment, the hole transport region HTR may further include a suitable material.

The hole transport region HTR may include, for example, a phthalocyanine compound (such as copper phthalocyanine), $N^1,N^{1'}$-([1,1'-biphenyl]-4,4'-diyl)bis($N^1$-phenyl-$N^4$, $N^4$-di-m-tolylbenzene-1,4-diamine) (DNTPD), 4,4',4"-[tris (3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PAN I/PSS), N,N'-di(1-naphthalene-1-yl)-N,N'-diphenyl-benzidine (NPB), triphenylamine-containing polyether ketone (TPAPEK), 4-isopropyl-4'-methyl-diphenyliodonium [tetrakis(pentafluorophenyl)borate], and dipyrazino[2,3-f:2',3'-h] quinoxaline-2,3,6,7,10,11-hexacarbonitrile (HAT-CN).

The hole transport region HTR may include, for example, carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-di- amine (TPD), triphenylamine-based derivatives (such as 4,4',4"-tris(N-carbazolyl)triphenylamine (TCTA)), N,N'-di (naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include, for example, carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diam ine (TPD), triphenylamine-based derivatives (such as 4,4',4"-tris(N-carbazolyl)triphenylamine (TCTA)), N,N'-di(1-naphthalene-1-yl)-N,N'-diphenylbenzidine (NPB), 4,4'-cyclohexylidene bis[N,N-bis(4-methylphenyl)benzeneamine (TAPC), 4,4'-bis[N,N'-(3-tolyl) amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed substantially uniformly or non-uniformly in the hole transport region HTR. The charge generating material may be, for example, a p-dopant. The p-dopant may include at least one among quinone derivatives, metal oxides, and cyano group-containing compounds, without limitation. For example, non-limiting examples of the p-dopant may include quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), metal halides (such as CuI and/or RbI), dipyrazino [2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3, 5,6-tetrafluorobenzonitrile, etc., without limitation.

As described above, the hole transport region HTR may further include at least one of a hole buffer layer and/or an electron blocking layer EBL in addition to the hole injection layer HIL and the hole transport layer HTL. The hole buffer layer may compensate for an optical resonance distance of a wavelength of light emitted from an emission layer EML, and may thereby increase light emission efficiency. Materials that may be included in a hole transport region HTR may be included in a hole buffer layer. The electron blocking layer EBL may prevent or reduce electron injection from the electron transport region ETR to the hole transport region HTR. When the hole transport region HTR includes at least one among a hole buffer layer and an electron blocking layer, adjacent to the emission layer EML, the amine compound according to an embodiment may be included in the hole buffer layer and/or the electron blocking layer, adjacent to the emission layer EML.

The emission layer EML is provided on the hole transport region HTR. The emission layer EML may, for example, have a thickness of about 100 Å to about 1,000 Å, or about 100 Å to about 300 Å. The emission layer EML may be a single layer formed utilizing a single material, a single layer formed utilizing a plurality of different materials, or a multilayer structure having multiple layers formed utilizing multiple different materials.

In some embodiments, the emission layer EML of the light emitting device ED may be to emit blue light. For example, the emission layer EML of the light emitting device ED of an embodiment may be to emit blue light in a region of about 490 nm or more. However, embodiments of the present disclosure are not limited thereto, and the emission layer EML may be to emit green light or red light.

In some embodiments, the light emitting device ED of an embodiment may include multiple emission layers. The multiple emission layers may be stacked in order. For example, a light emitting device ED including multiple emission layers may be to emit white light. An organic electroluminescence device including multiple emission layers may be an organic electroluminescence device of a tandem structure.

In the light emitting device ED of an embodiment, the emission layer EML may include anthracene derivatives, pyrene derivatives, fluoranthene derivatives, chrysene derivatives, dihydrobenzanthracene derivatives, and/or triphenylene derivatives. For example, the emission layer EML may include anthracene derivatives and/or pyrene derivatives.

In the light emitting devices ED of embodiments, shown in FIG. 3 to FIG. 6, the emission layer EML may include a host and a dopant, and the emission layer EML may include a compound represented by Formula E-1. The compound represented by Formula E-1 may be utilized as a fluorescence host material.

[Formula E-1]

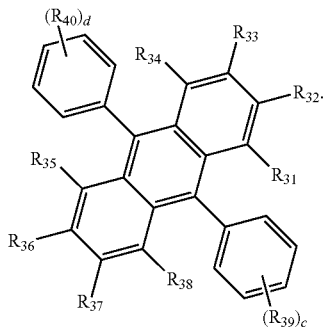

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In some embodiments, $R_{31}$ to $R_{40}$ may be combined with an adjacent group to form a saturated hydrocarbon ring or an unsaturated hydrocarbon ring.

In Formula E-1, "c" and "d" may each independently be an integer of 0 to 5.

Formula E-1 may be represented by any one among Compound E1 to Compound E18.

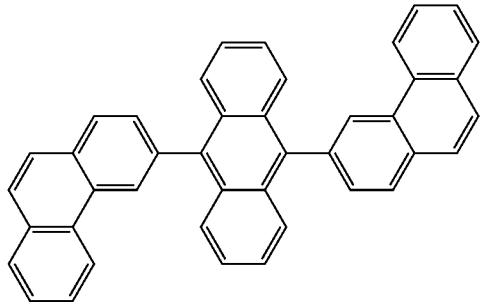

E1

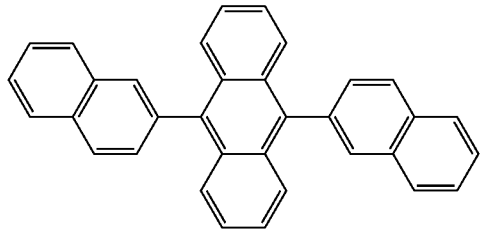

E2

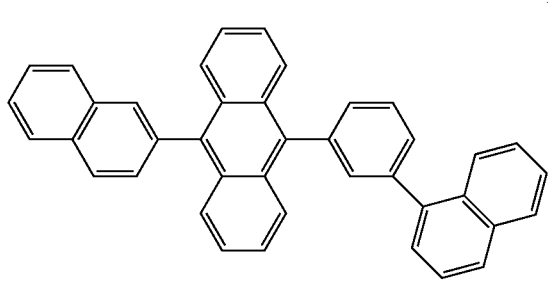

E3

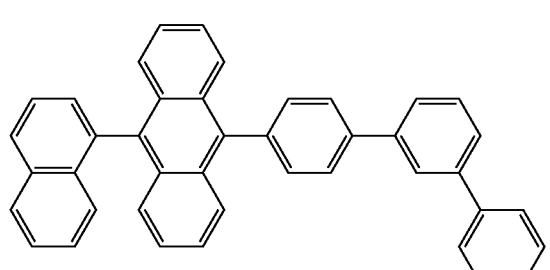

E4

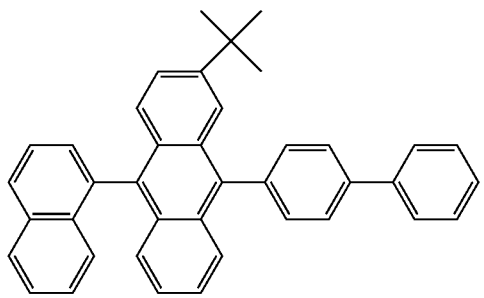

E5

E6
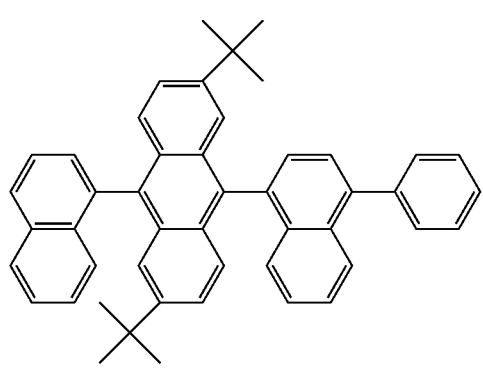
E7
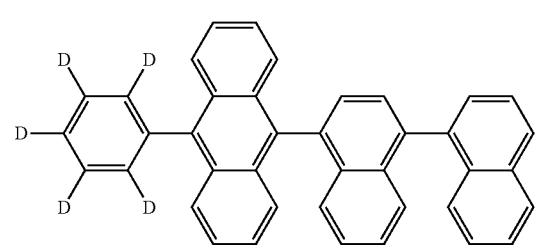
E8
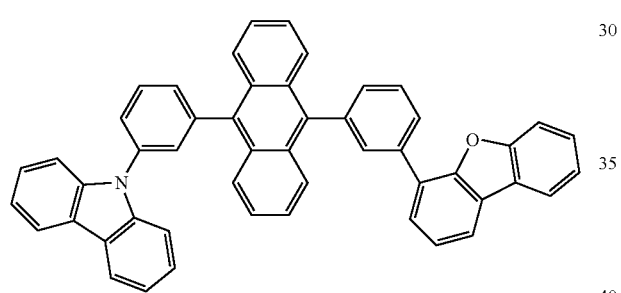
E9
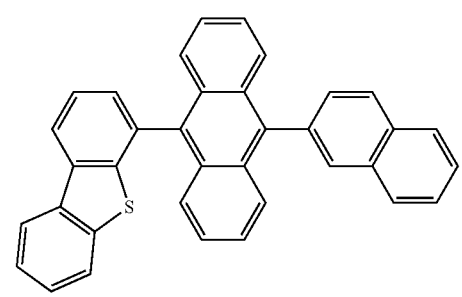
E10
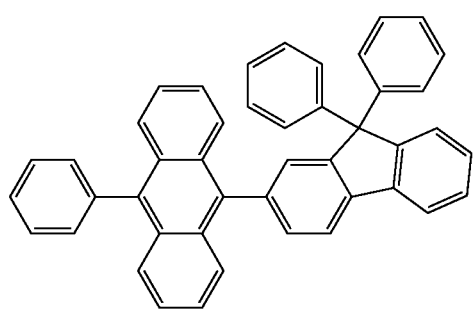
E11
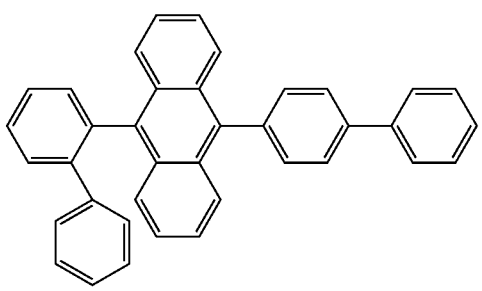
E12
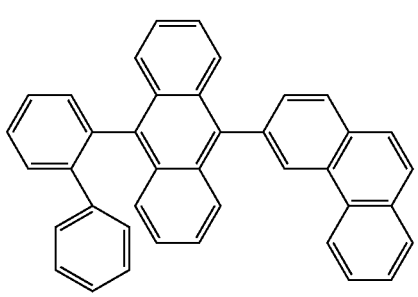
E13
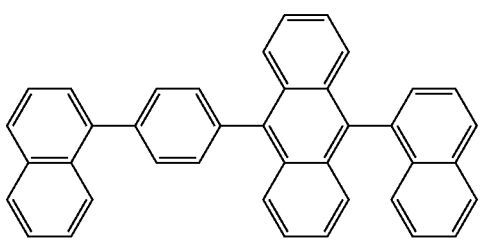
E14
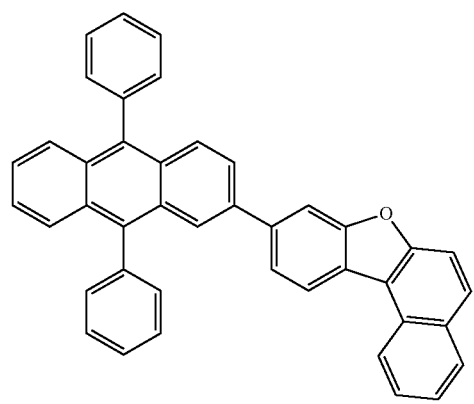

-continued

E15
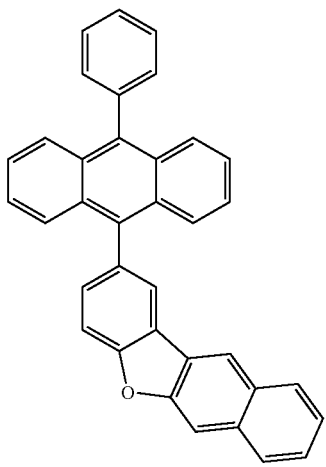

E16
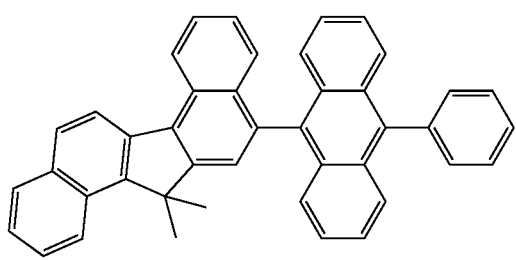

E17
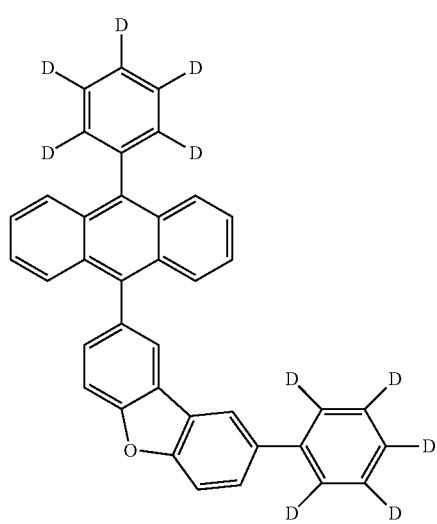

-continued

E18
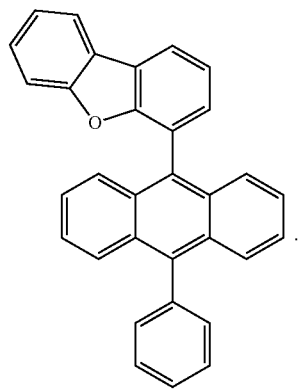

In an embodiment, the emission layer EML may include a compound represented by Formula E-2a or Formula E-2b. The compound represented by Formula E-2a or Formula E-2b may be utilized as a phosphorescence host material.

[Formula E-2a]
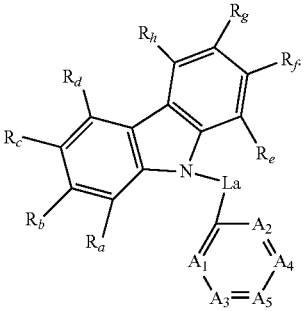

In Formula E-2a, La may be a direct linkage or a substituted or unsubstituted arylene group of 6 to 30 ring-forming carbon atoms. In some embodiments, in Formula E-2a, $A_1$ to $A_5$ may each independently be N or CRi. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to each other to form a ring. $R_a$ to $R_i$ may each independently be combined with an adjacent group to form a hydrocarbon ring or a heterocycle including N, O, S, etc. as a ring-forming atom.

In some embodiments, in Formula E-2a, two or three selected from $A_1$ to $A_5$ may be N, and the remainder may be $CR_i$.

[Formula E-2b]
$$(Cbz1)\!\!-\!\!L_b\!\!-\!\!(Cbz2).$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, or a substituted or unsubstituted arylene group of 6 to 30 ring-forming carbon atoms.

The compound represented by Formula E-2a or Formula E-2b may be represented by any one among the compounds in Compound Group E-2. However, the compounds shown in Compound Group E-2 are only illustrations, and the compound represented by Formula E-2a or Formula E-2b is not limited to the compounds represented in Compound Group E-2.

[Compound Group E-2]

E-2-1

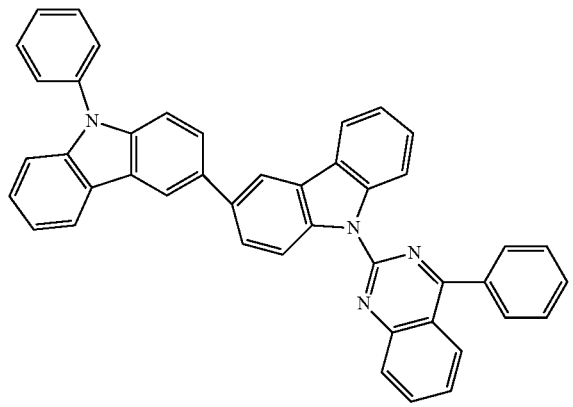

E-2-2

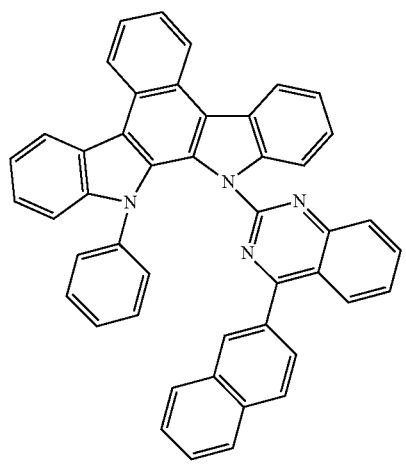

E-2-3

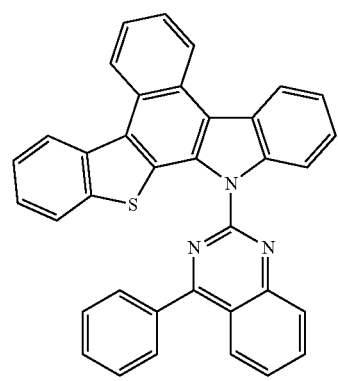

E-2-4

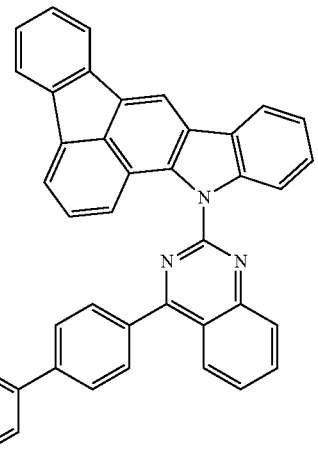

E-2-5

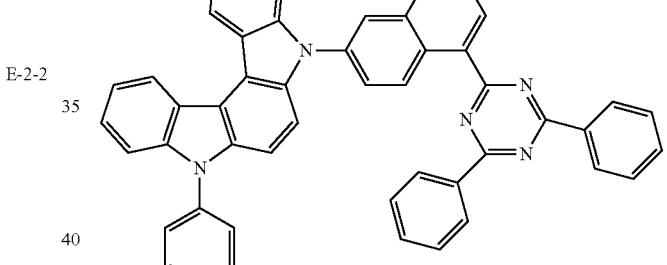

E-2-6

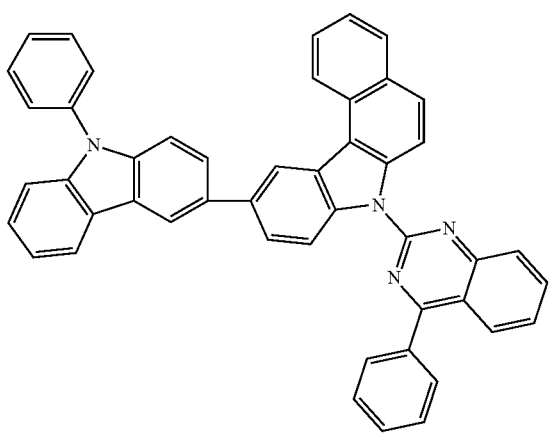

E-2-7
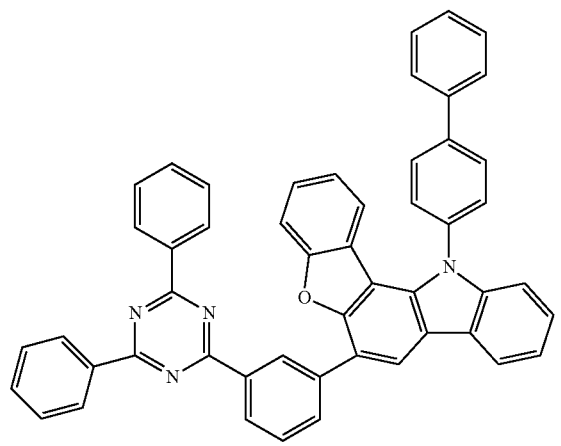
E-2-8
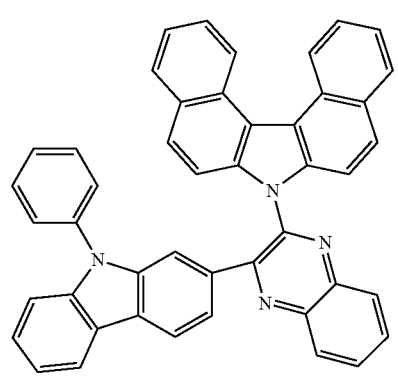
E-2-9
E-2-10
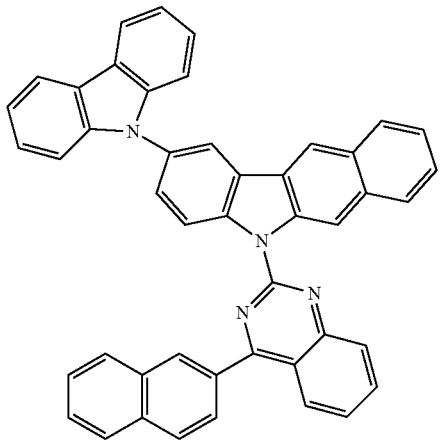
E-2-11
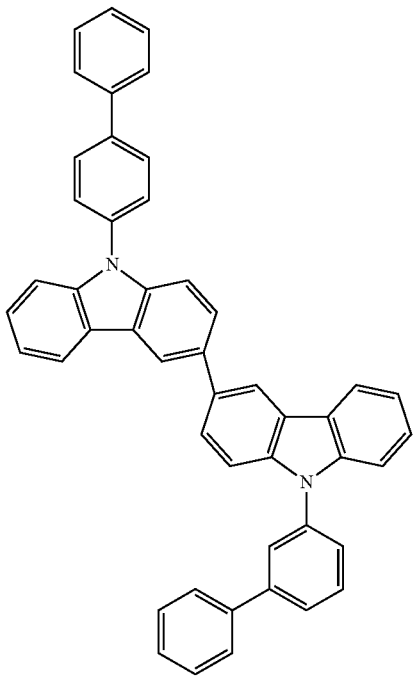
E-2-12
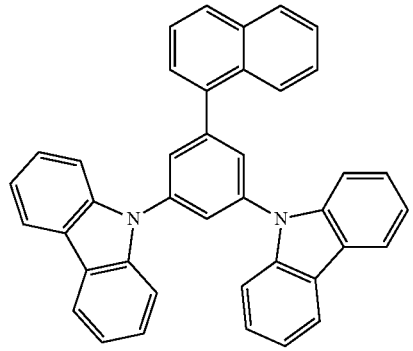

E-2-13
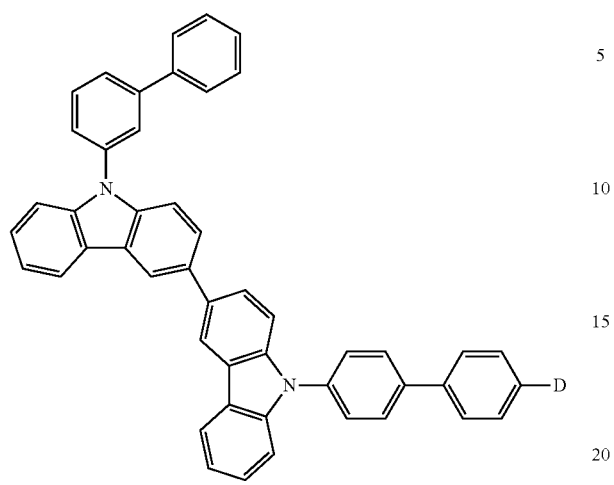
E-2-16
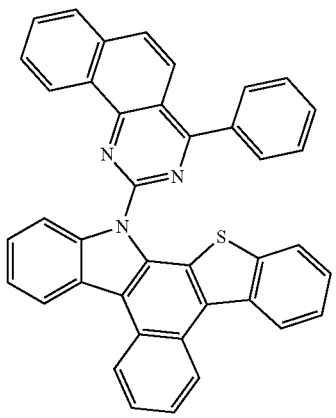
E-2-14
E-2-17
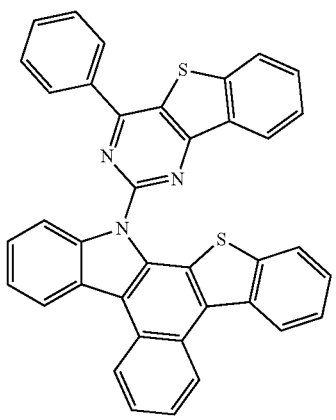
E-2-15
E-2-18
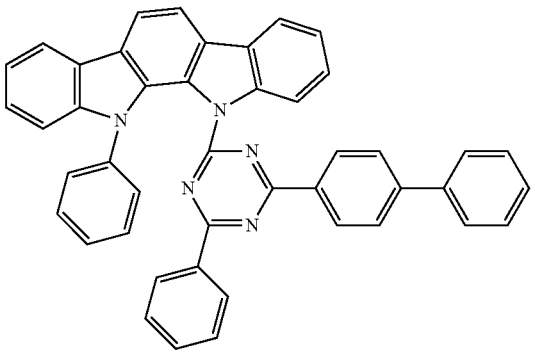

-continued

E-2-19

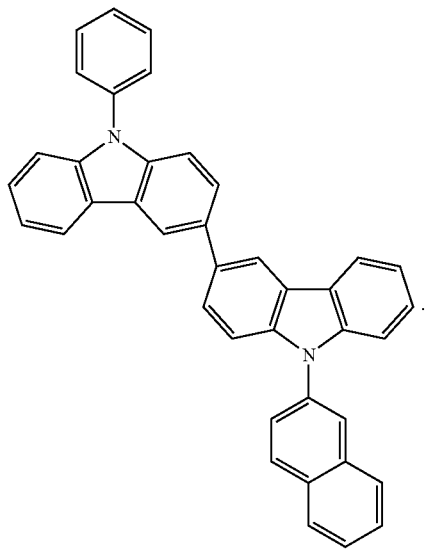

The emission layer EML may further include any suitable host material in the art. For example, the emission layer EML may include at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), and/or 1,3,5-tris(1-phenyl-1H-benzo[d]imidazole-2-yl)benzene (TPBi) as a host material. However, embodiments of the present disclosure are not limited thereto. For example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), etc. may be utilized as the host material.

The emission layer EML may include a compound represented by Formula M-a or Formula M-b. The compound represented by Formula M-a or Formula M-b may be utilized as a phosphorescence dopant material.

[Formula M-a]

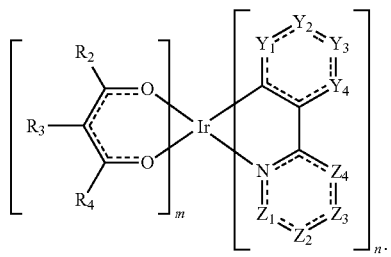

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" may be 0 or 1, and "n" may be 2 or 3. In Formula M-a, when "m" is 0, "n" is 3, and when "m" is 1, "n" is 2.

The compound represented by Formula M-a may be utilized as a red phosphorescence dopant or a green phosphorescence dopant.

The compound represented by Formula M-a may be represented by any one among Compounds M-a1 to M-a6. However, Compounds M-a1 to M-a6 are illustrations, and the compound represented by Formula M-a is not limited to the compounds represented by Compounds M-a1 to M-a6.

M-a1

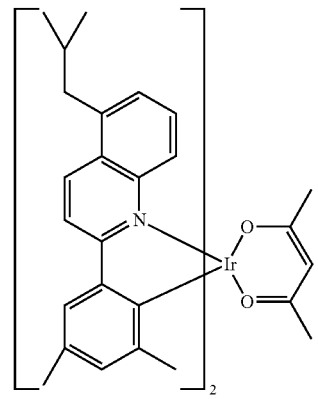

M-a2

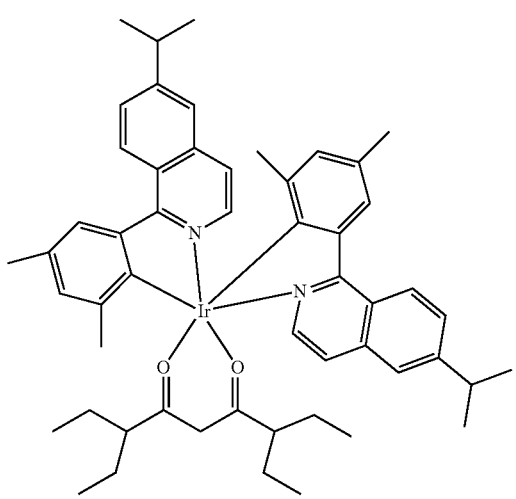

M-a3

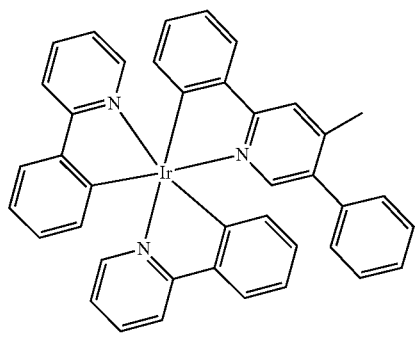

M-a4

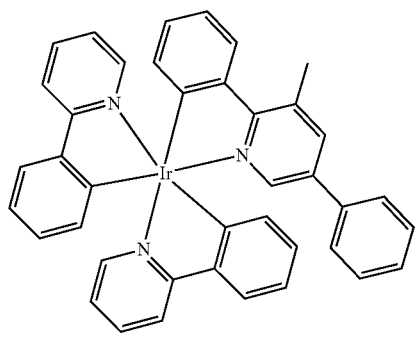

M-a5

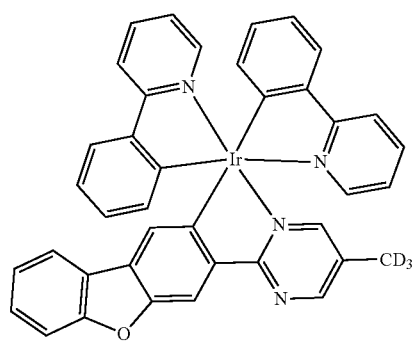

M-a6

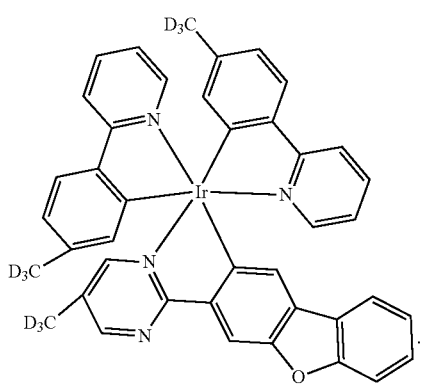

Compound M-a1 and/or Compound M-a2 may be utilized as red dopant materials, and Compound M-a3 and/or Compound M-a4 may be utilized as green dopant materials.

[Formula M-b]

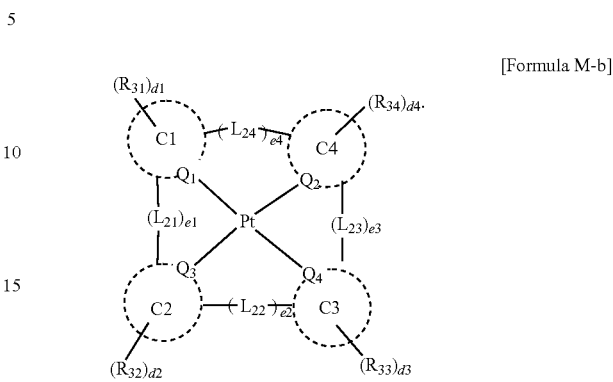

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

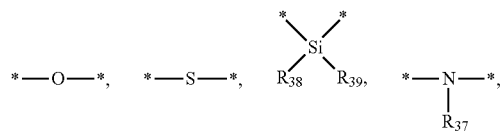

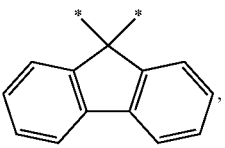

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and "e1" to "e4" may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "d1" to "d4" may each independently be an integer of 0 to 4.

The compound represented by Formula M-b may be utilized as a blue phosphorescence dopant or a green phosphorescence dopant.

The compound represented by Formula M-b may be represented by any one among the compounds. However, the compounds are illustrations, and the compound represented by Formula M-b is not limited to the compounds represented.

M-b-1
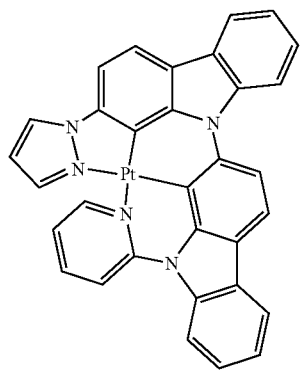
M-b-5
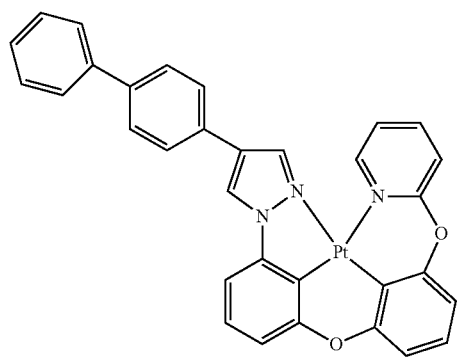
M-b-2
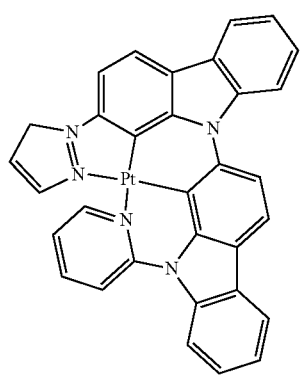
M-b-6
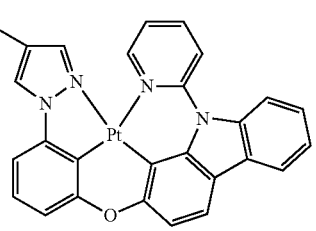
M-b-7
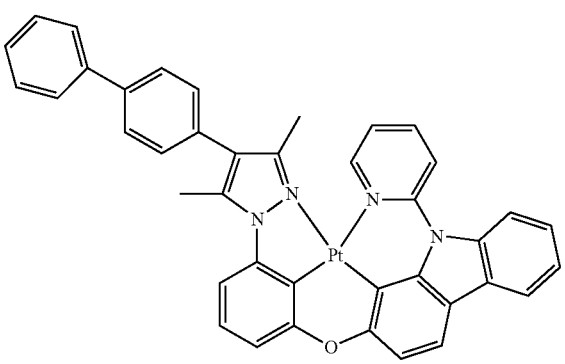
M-b-4
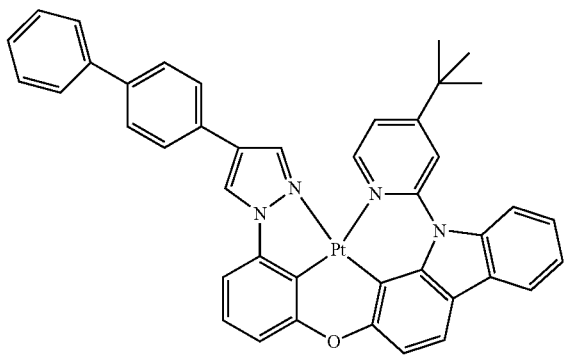
M-b-8
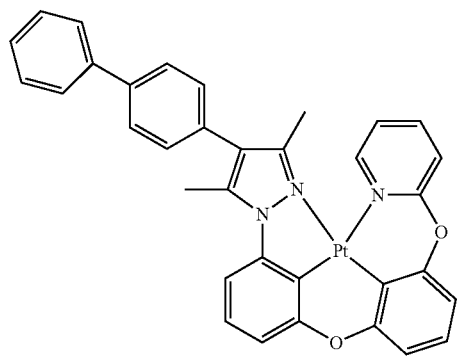

-continued

M-b-9

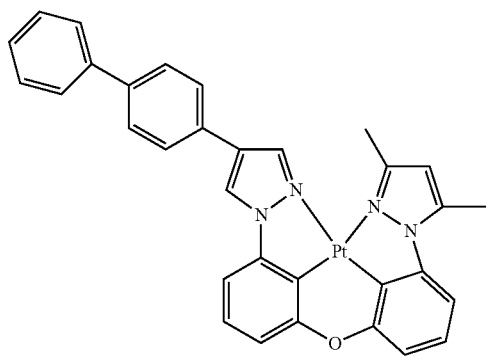

M-b-10

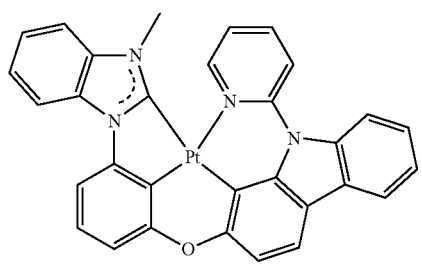

M-b-11

M-b-12

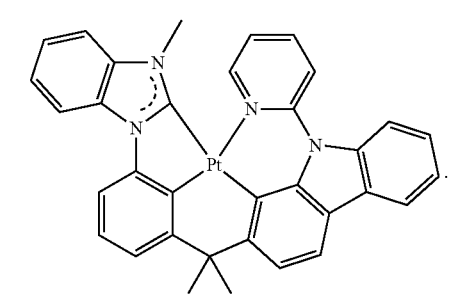

The emission layer EML may include a compound represented by any one among Formula F-a to Formula F-c. The compounds represented by Formula F-a to Formula F-c may be utilized as fluorescence dopant materials.

[Formula F-a]

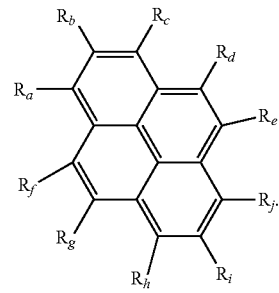

In Formula F-a, two selected from $R_a$ to $R_j$ may each independently be substituted with *—$NAr_1Ar_2$. The remainder not substituted with *—$NAr_1Ar_2$ among $R_a$ to $R_j$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one among $Ar_1$ and $Ar_2$ may be a heteroaryl group including O or S as a ring-forming atom.

[Formula F-b]

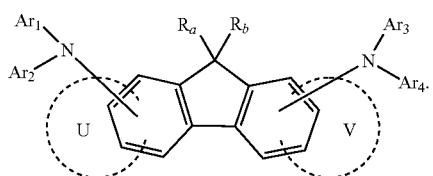

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, when the number of U or V is 1, one ring forms a fused ring at the designated part by U or V, and when the number of U or V is 0, a ring is not present at the designated part by U or V. For example, when the number of U is 0, and the number of V is 1, or when the number of U is 1, and the number of V is 0, a fused ring having the fluorene core of Formula F-b may be a ring compound with four rings. In some embodiments, when the number of both U and V is 0 (e.g., simultaneously), the fused ring of Formula F-b may be a ring compound with three rings. In some embodiments, when the number of both U and V is 1 (e.g., simultaneously), a fused ring having the fluorene core of Formula F-b may be a ring compound with five rings.

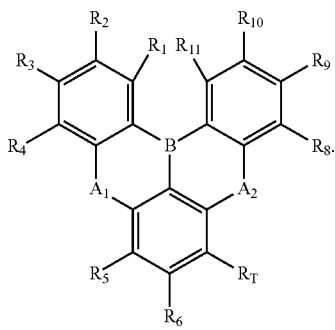

[Formula F-c]

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may each independently be combined with the substituents of an adjacent ring to form a fused ring. For example, when $A_1$ and $A_2$ are each independently $NR_m$, $A_1$ may be combined with $R_4$ or $R_5$ to form a ring. In some embodiments, $A_2$ may be combined with $R_7$ or $R_8$ to form a ring.

In an embodiment, the emission layer EML may include styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), perylene and/or derivatives thereof (for example, 2,5,8,11-tetra-t-butylperylene (TBP)), pyrene and/or derivatives thereof (for example, 1,1-dipyrene, 1,4-dipyrenylbenzene, and 1,4-bis(N,N-diphenylamino)pyrene), etc., as a suitable dopant material.

The emission layer EML may include any suitable phosphorescence dopant material. For example, the phosphorescence dopant may utilize a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (Flrpic), bis(2,4-difluorophenylpyridinato)-tetrakis(1-pyrazolyl)borate iridium (III) (Fir6), and/or platinum octaethyl porphyrin (PtOEP) may be utilized as the phosphorescence dopant. However, embodiments of the present disclosure are not limited thereto.

The emission layer EML may include a quantum dot material. The core of the quantum dot may be selected from a II-VI group compound, a III-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound (such as $In_2S_3$, and/or $In_2Se_3$), a ternary compound (such as $InGaS_3$, and/or $InGaSe_3$), and/or one or more optional combinations thereof.

The group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound (such as $AgInGaS_2$, and/or $CuInGaS_2$).

The III-V group compound may be selected from the group consisting of: a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InAsP, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group consisting of: a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound or the quaternary compound may be present at a substantially uniform concentration in a particle, or may be present at a partially different concentration distribution state in the same particle.

In some embodiments, a core/shell structure in which one quantum dot wraps another quantum dot may be possible. The interface of the core and the shell may have a concentration gradient in which the concentration of an element present in the shell is decreased toward the center (e.g., toward the core).

In some embodiments, the quantum dot may have the above-described core-shell structure including a core including a nanocrystal and a shell wrapping the core. The shell of the quantum dot may play the role of a protection layer for preventing or reducing chemical deformation of the core to maintain its semiconductor properties and/or as a charging layer for imparting the quantum dot with electrophoretic properties. The shell may have a single layer or a multilayer.

The interface of the core and the shell may have a concentration gradient in which the concentration of an element present in the shell is decreased toward the center. Non-limiting examples of the shell of the quantum dot may include a metal or non-metal oxide, a semiconductor compound, and/or one or more combinations thereof.

For example, the metal or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), or a ternary compound (such as $MgAl_2O_4$, $CoFe_2O_4$, $NiFe_2O_4$ and/or $CoMn_2O_4$), but embodiments of the present disclosure are not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width at half maximum (FWHM) of its emission wavelength spectrum of about 45 nm or less, about 40 nm or less, or about 30 nm or less. Within these ranges, color purity and/or color reproducibility may be improved. In some embodiments, light emitted via the quantum dot are emitted in all directions, and light view angle properties may be improved.

The shape of the quantum dot may be any suitable shape in the art, without specific limitation. For example, a spherical, pyramidal, multi-arm, or cubic nanoparticle, nanotube, nanowire, nanofiber, nanoplate particle shape, etc. may be utilized.

The quantum dot may control or determine the color of light emitted according to the particle size, and accordingly, the quantum dot may have one or more suitable emission colors (such as blue, red and green).

In some embodiments, in an embodiment, the emission layer EML may include two dopant materials having different lowest triplet excitation energy levels (T1). In the light emitting device ED of an embodiment, the emission layer EML may include a host having a first lowest triplet excitation energy level, a first dopant having a second lowest triplet excitation energy level lower than the first lowest triplet excitation energy level, and a second dopant having a third lowest triplet excitation energy level lower than the second lowest triplet excitation energy level.

In the light emitting device ED of an embodiment, including the host, the first dopant and the second dopant in the emission layer EML, the first dopant may be a delayed fluorescence dopant, and the second dopant may be a fluorescence dopant.

For example, when the emission layer EML of the light emitting device ED of an embodiment includes multiple dopants, the emission layer EML may include a first dopant and a second dopant that are different from each other. For example, when the emission layer EML is to emit blue light, the emission layer EML may further include as the second dopant, any one selected from the group consisting of spiro-DPVBi, spiro-6P, distyryl-benzene (DSB), distyryl-arylene (DSA), a polyfluorene (PFO)-based polymer and a poly(p-phenylene vinylene) (PPV)-based polymer. In some embodiments, a metal complex such as $(4,6-F_2ppy)_2Irpic$, an organometallic complex, perylene, and/or derivatives thereof may be utilized as the second dopant.

In the light emitting devices ED of embodiments, as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, embodiments of the present disclosure are not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure having multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

For example, the electron transport layer ETL may include a compound represented by Formula ET-1.

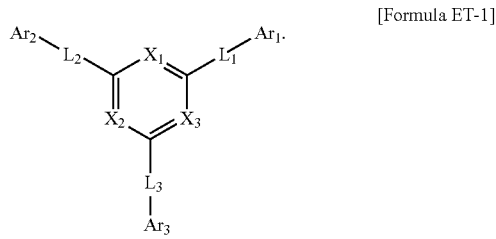

[Formula ET-1]

In Formula ET-1, at least one among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_4$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benz[d]imidazol-2-yl)phenyl (TPBi), 2,9-dimethyl-4,7-diphenyl-1,10-phenanthroline (BCP), 4,7-diphenyl-1,10- phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalene-2-yl)anthracene (ADN), 1,3-bis[3,5-di(pyridin-3-yl)phenyl]benzene (BmPyPhB), and/or one or more mixtures thereof, without limitation.

In some embodiments, the electron transport region ETR may include a metal halide (such as LiF, NaCl, CsF, RbCl, RbI, CuI and/or KI), a lanthanide metal (such as Yb), or a co-deposited material of the metal halide and the lanthanide metal. For example, the electron transport region ETR may include KI:Yb, RbI:Yb, etc., as the co-depositing material. In some embodiments, the electron transport region ETR may utilize a metal oxide (such as Li$_2$O and/or BaO), or 8-hydroxy-lithium quinolate (LiQ). However, embodiments of the present disclosure are not limited thereto. The electron injection layer EIL may be formed utilizing a mixture of an electron transport material and an insulating organo metal salt. The organo metal salt may be a material having an energy band gap of about 4 eV. For example, the organo metal salt may include metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the aforementioned materials. However, embodiments of the present disclosure are not limited thereto.

The electron transport region ETR may include the above-described compounds of the electron transport region in at least one of an electron injection layer EIL, an electron transport layer ETL, or a hole blocking layer HBL.

When the electron transport region ETR includes an electron transport layer ETL, the thickness of the electron transport layer ETL may be about 100 Å to about 1,000 Å, for example, about 150 Å to about 500 Å. When the thickness of the electron transport layer ETL satisfies the above described ranges, satisfactory electron transport properties may be obtained without inducing substantial increase of a driving voltage.

When the electron transport region ETR includes an electron injection layer EIL, the thickness of the electron injection layer EIL may be about 1 Å to about 100 Å, for example, about 3 Å to about 90 Å. When the thickness of the electron injection layer EIL satisfies the above-described ranges, satisfactory electron injection properties may be obtained without substantial increase of a driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed by utilizing a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, one or more compounds thereof, one or more mixtures thereof (for example, a mixture of Ag and/or Mg), and/or one or more oxides thereof. The second electrode EL2 may have a multilayered structure including a reflective layer or a transflective layer formed utilizing the above-described materials and a transparent conductive layer formed utilizing ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, the light emitting device ED of an embodiment may further include a buffer layer between the emission layer EML and the electron transport region ETR. The buffer layer may control the concentration of excitons produced in the emission layer EML. For example, the buffer layer may include a portion of a material for (e.g., the same material in) the emission layer EML. The buffer layer may include a host material in the material for the emission layer EML. The lowest triplet excitation energy level of the material for the buffer layer may be controlled or selected to the lowest triplet excitation energy level of the second dopant or more, or to the lowest triplet excitation energy level of the second dopant or less according to the combination of the host and dopant materials included in the emission layer EML.

In some embodiments, a capping layer CPL may be further disposed on the second electrode EL2 in the light emitting device ED of an embodiment. The capping layer CPL may include multiple layers or a single layer.

In an embodiment, the capping layer CPL may be an organic layer or an inorganic layer. For example, when the capping layer CPL includes an inorganic material, the inorganic material may include an alkali metal compound (such as LiF), and/or an alkaline earth metal compound (such as MgF$_2$, SiON, SiN$_x$, SiO$_y$, etc.).

For example, when the capping layer CPL includes an organic material, the organic material may include α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-tris (carbazol-9-yl) triphenylamine (TCTA), etc., an epoxy resin, and/or an acrylate (such as methacrylate). In some embodiments, the capping layer CPL may include at least one of Compounds P1 to P5, but embodiments of the present disclosure are not limited thereto.

P1

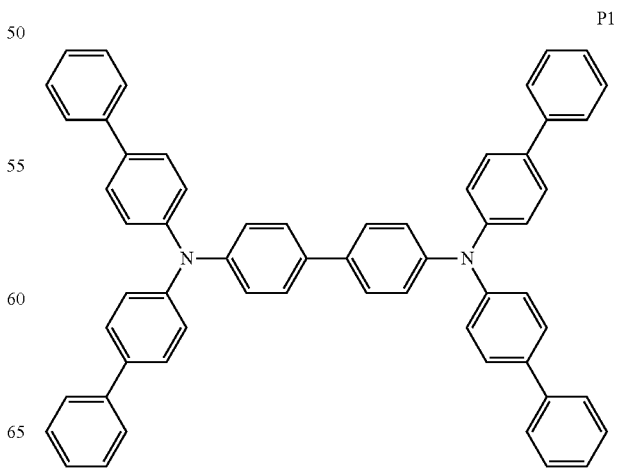

-continued

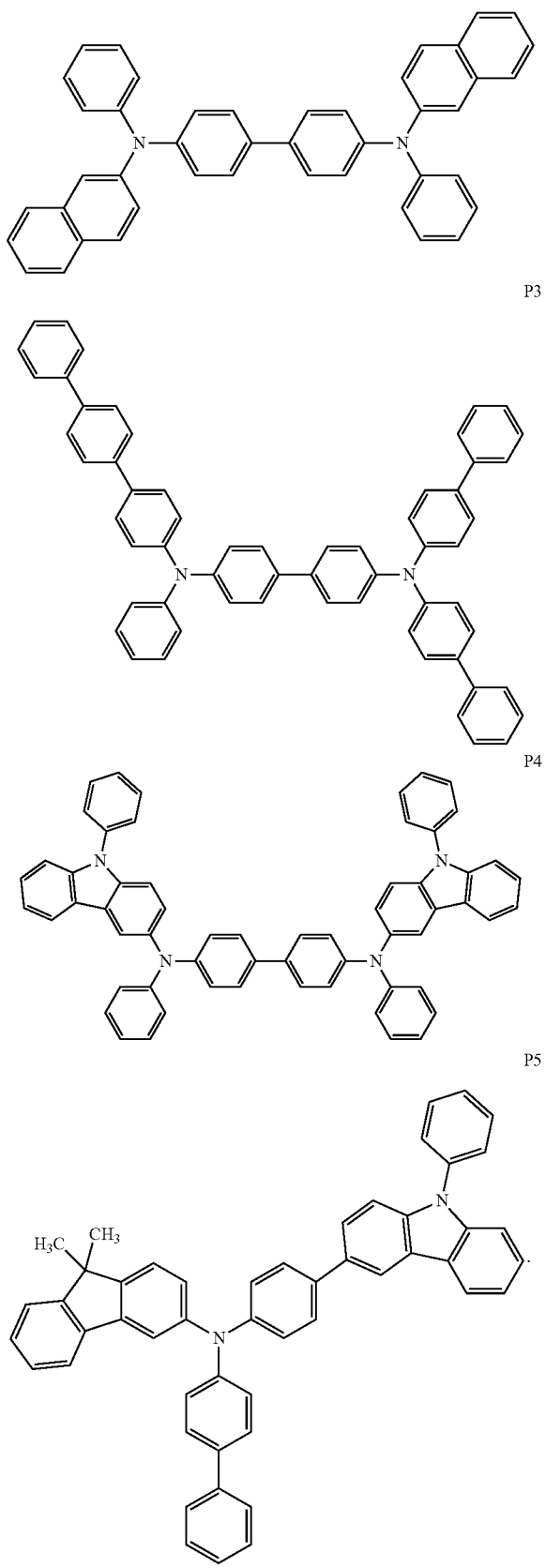

In some embodiments, the refractive index of the capping layer CPL may be about 1.6 or more. For example, the refractive index of the capping layer CPL with respect to light in a wavelength region of about 550 nm to about 660 nm may be about 1.6 or more.

The light emitting device ED according to embodiments of the present disclosure may include the amine compound of an embodiment in the hole transport region HTR disposed between the first electrode EL1 and the second electrode EL2, and may show high emission efficiency and long device life characteristics.

In some embodiments, the amine compound of an embodiment may be included as a material for the light emitting device ED in organic layers other than the hole transport region HTR. For example, the light emitting device ED according to embodiments of the present disclosure may include the amine compound in at least one organic layer disposed between the first electrode EL1 and the second electrode EL2, or in the capping layer CPL disposed on the second electrode EL2.

The amine compound of an embodiment includes a carbazole group and a benzo[b]fluorenyl group connected with an amine group, and may show improved intermolecular hole transport capacity when compared with the compounds; and when utilized as the hole transport material of an organic electroluminescence device, long life (lifespan) and/or high efficiency of the organic electroluminescence device may be accomplished.

Figure 7:
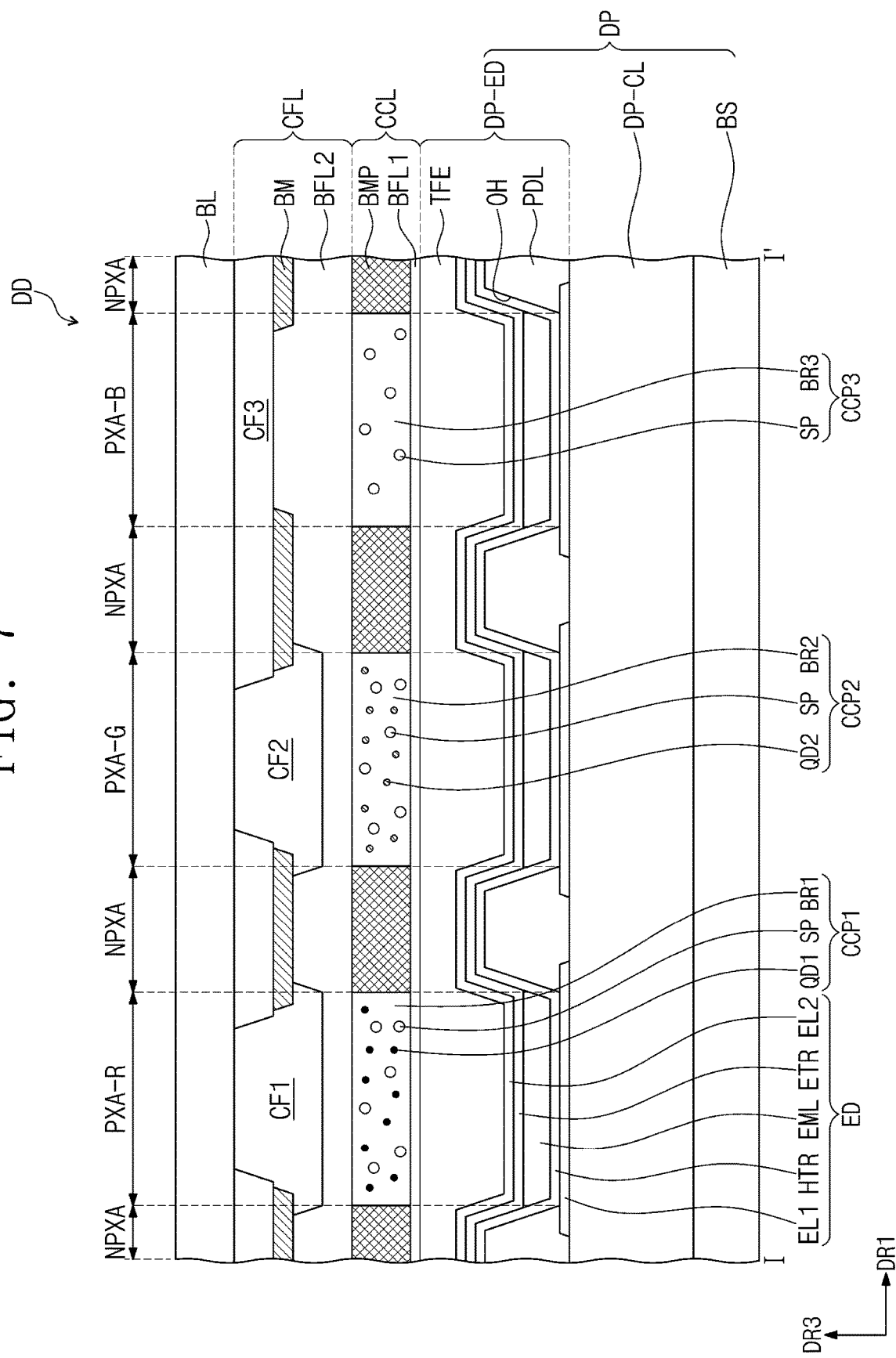
FIG. 7 and FIG. 8 are cross-sectional views showing display apparatuses according to embodiments.
Figure 8:
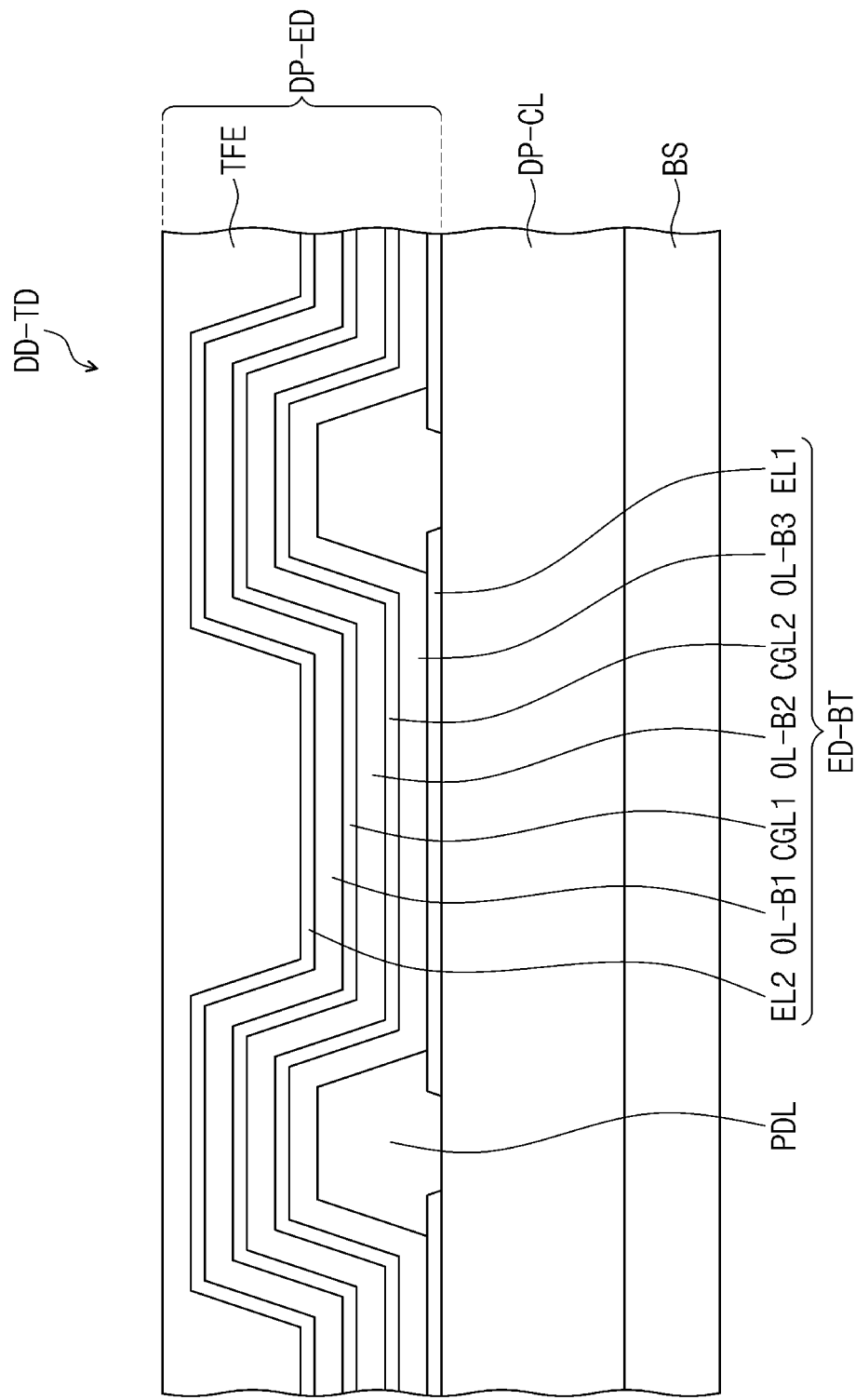

FIG. 7 and FIG. 8 are cross-sectional views of display apparatuses according to embodiments. In the explanation on the display apparatuses of FIG. 7 and FIG. 8, the parts previously described in FIG. 1 to FIG. 6 will not be explained again, and chiefly different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS and a display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In some embodiments, the same structures of the light emitting devices of FIG. 3 to FIG. 6 may be applied to the structure of the light emitting device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided in each of luminous areas PXA-R, PXA-G, and PXA-B may be to emit light in the same wavelength region. In the display apparatus DD of an embodiment, the emission layer EML may be to emit blue light. In some embodiments, the emission layer EML may be provided as a common layer for all luminous areas PXA-R, PXA-G, and PXA-B.

The light controlling layer CCL may be disposed on the display panel DP. The light controlling layer CCL may include a light converter. The light converter may be or include a quantum dot and/or a phosphor. The light converter may transform the wavelength of light provided and then emit the transformed light. For example, the light controlling layer CCL may be a layer including a quantum dot or a layer including a phosphor.

The light controlling layer CCL may include multiple light controlling parts CCP1, CCP2, and CCP3. The light controlling parts CCP1, CCP2, and CCP3 may be separated from one another along the first direction DR1.

Referring to FIG. 7, a partition pattern BMP may be disposed between the separated light controlling parts CCP1, CCP2, and CCP3, but embodiments of the present disclosure are not limited thereto. In FIG. 7, the partition pattern BMP is shown as being non-overlapped with the light controlling parts CCP1, CCP2 and CCP3, but in some embodiments at least a portion of the edge of the light controlling parts CCP1, CCP2 and CCP3 may be overlapped with the partition pattern BMP.

The light controlling layer CCL may include a first light controlling part CCP1 including a first quantum dot QD1 converting first color light provided from the light emitting device ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third color controlling part CCP3 may transmit and provide blue light, which is the first color light provided from the light emitting device ED. For example, the first quantum dot QD1 may be a red quantum dot, and the second quantum dot QD2 may be a green quantum dot. For the quantum dots QD1 and QD2, the same explanation as above may be applied.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one among $TiO_2$, ZnO, $Al_2O_3$, $SiO_2$, and/or hollow silica. The scatterer SP may include at least one among $TiO_2$, ZnO, $Al_2O_3$, $SiO_2$, and/or hollow silica, or may be a mixture of two or more materials selected among $TiO_2$, ZnO, $Al_2O_3$, $SiO_2$, and hollow silica.

The first light controlling part CCP1, the second light controlling part CCP2, and the third light controlling part CCP3 may respectively include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatter SP dispersed in the third base resin BR3. The base resins BR1, BR2, and BR3 are mediums in which the quantum dots QD1 and QD2 and the scatterer SP are dispersed, and may be composed of various suitable resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same or different from each other.

The light controlling layer CCL may include a barrier layer BFL1. The barrier layer BFL1 may play the role of blocking or reducing the penetration of moisture and/or oxygen (hereinafter, will be referred to as "humidity/oxygen"). The barrier layer BFL1 may be disposed on the light controlling parts CCP1, CCP2, and CCP3 to block or reduce the exposure of the light controlling parts CCP1, CCP2, and CCP3 to humidity/oxygen. In some embodiments, the barrier layer BFL1 may cover the light controlling parts CCP1, CCP2, and CCP3. In some embodiments, a barrier layer BFL2 may be provided between a color filter layer CFL and each of the light controlling parts CCP1, CCP2, and CCP3.

Barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride, or a metal thin film securing light transmittance. In some embodiments, the barrier layers BFL1 and BFL2 may further include an organic layer. The barrier layers BFL1 and BFL2 may each be composed of a single layer or multiple layers.

In the display apparatus DD of an embodiment, the color filter layer CFL may be disposed on the light controlling layer CCL. For example, the color filter layer CFL may be disposed directly on the light controlling layer CCL. In this case, the barrier layer BFL2 may not be provided.

The color filter layer CFL may include a light blocking part BM and filters CF1, CF2, and CF3. The color filter layer CFL may include a first filter CF1 to transmit second color light, a second filter CF2 to transmit third color light, and a third filter CF3 to transmit first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. In some embodiments, embodiments of the present disclosure are not limited thereto, and the third filter CF3 may not include a pigment or dye. The third filter CF3 may include a polymer photosensitive resin and not include a pigment or dye. The third filter CF3 may be transparent. The third filter CF3 may be formed utilizing a transparent photosensitive resin.

In some embodiments, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent or reduce light leakage phenomenon and divide the boundaries among adjacent filters CF1, CF2, and CF3. In some embodiments, the light blocking part BM may be formed as a blue filter.

The first to third filters CF1, CF2, and CF3 may be disposed to respectively correspond to each of a red luminous area PXA-R, green luminous area PXA-G, and blue luminous area PXA-B.

A base substrate BL may be disposed on the color filter layer CFL. The base substrate BL may be a member providing a base surface on which the color filter layer CFL, the light controlling layer CCL, etc. are disposed. The base substrate BL may be a glass substrate, a metal substrate, a plastic substrate, etc. However, embodiments of the present disclosure are not limited thereto, and the base substrate BL may be an inorganic layer, an organic layer or a composite material layer. In some embodiments, the base substrate BL may not be provided in an embodiment.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the light emitting device ED-BT may include multiple luminous structures OL-B1, OL-B2, and OL-B3. The light emitting device ED-BT may include oppositely disposed first electrode EL1 and second electrode EL2, and the multiple luminous structures OL-B1, OL-B2, and OL-B3 stacked in order in a thickness direction between the first electrode EL1 and the second electrode EL2. Each of the luminous structures OL-B1, OL-B2, and OL-B3 may include an emission layer EML (FIG. 7), and a hole transport region HTR and an electron transport region ETR disposed with the emission layer EML (FIG. 7) therebetween.

For example, the light emitting device ED-BT included in the display apparatus DD-TD of an embodiment may be a light emitting device of a tandem structure including multiple emission layers.

In an embodiment shown in FIG. 8, light emitted from the luminous structures OL-B1, OL-B2, and OL-B3 may be all blue light. However, embodiments of the present disclosure are not limited thereto, and the wavelength regions of light emitted from the luminous structures OL-B1, OL-B2, and OL-B3 may be different from each other. For example, the light emitting device ED-BT including the multiple luminous structures OL-B1, OL-B2, and OL-B3 emitting light in different wavelength regions may be to emit white light.

Between neighboring luminous structures OL-B1, OL-B2, and OL-B3, charge generating layers CGL1 and CGL2 may be disposed. The charge generating layers CGL1 and CGL2 may include a p-type charge generating layer and/or an n-type charge generating layer.

Hereinafter, referring to Examples and Comparative Examples, the compound according to embodiments and the organic electroluminescence device of embodiments of the present disclosure will be explained in more detail. The following Examples are only illustrations to assist the understanding of the present disclosure, and the scope of the present disclosure is not limited thereto.

EXAMPLES

1. Synthesis of Amine Compound

First, an example synthetic method of an amine compound according to embodiments of the present disclosure will be explained by illustrating the synthetic methods of Compounds 1, 2, 3, 17, 21, 27, 33, 34, 35, 49, 53, and 59. The synthetic methods of the amine compounds explained hereinafter are examples, and embodiments of the present disclosure are not limited to embodiments.

(1) Synthesis of Compound 1

Amine Compound 1 according to an embodiment may be synthesized by, for example, the reaction below.

[Reaction 1-1]

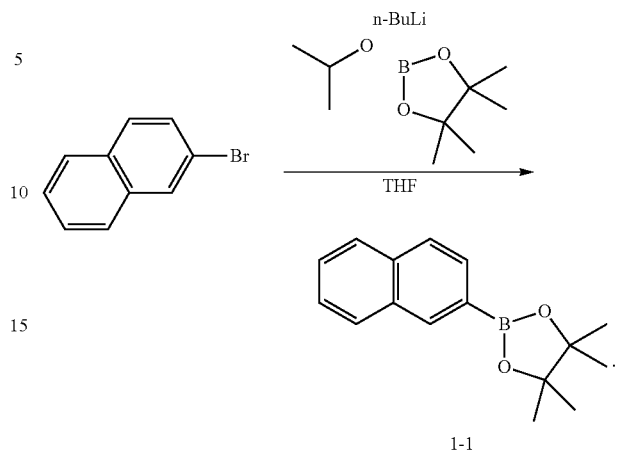

Synthesis of Intermediate Compound 1-1

2.07 g (10 mmol) of 2-bromonaphthalene was dissolved in 30 mL of THF, and n-butyllithium (4 mL, 2.5 M in hexane) was added thereto at about −78° C. After one hour at the same temperature, 2.04 mL (10 mmol) of 2-isopropoxy-4,4,5,5-tetramethyl-1,3,2-dioxaborolane was added. After stirring at room temperature for about 5 hours, water was added, and the resultant solution was washed with diethyl ether (30 mL) three times. The washed diethyl ether layer was dried with $MgSO_4$ and dried under a reduced pressure to obtain a product. Then, the product was separated by column chromatography to obtain 1.78 g of Intermediate Compound 1-1. The compound produced was identified through LC-MS. $C_{16}H_{19}BO_2$: M+254.1.

[Reaction 1-2]

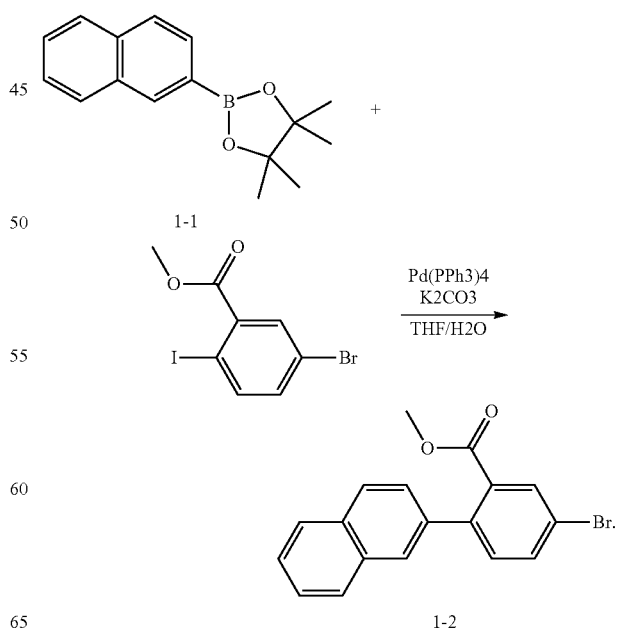

Synthesis of Intermediate Compound 1-2

2.54 g (10.0 mmol) of Intermediate Compound 1-1, 3.75 g (11.0 mmol) of methyl 5-bromo-2-iodobenzoate, 0.58 g (0.5 mmol) of Pd(PPh$_3$)$_4$, and 4.14 g (30.0 mmol) of K$_2$CO$_3$ were dissolved in 60 mL of a mixture solution of THF/H$_2$O (2/1) and stirred at about 80° C. for about 16 hours. After cooling the reaction solution to room temperature, extraction with 60 mL of water and 60 mL of diethyl ether was carried out three times. The organic layer thus obtained was dried with magnesium sulfate, and solvents were evaporated. The crude product thus obtained was separated by silica gel column chromatography to obtain 2.39 g (yield 70%) of Intermediate Compound 1-2. The compound thus produced was identified through LC-MS. C$_{18}$H$_{13}$BrO$_2$: M+340.0.

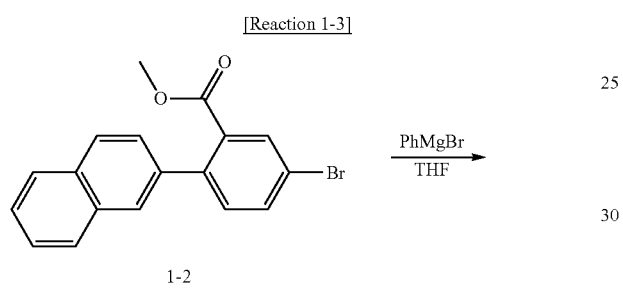

Synthesis of Intermediate Compound 1-3

To a flask in which 3.41 g (10 mmol) of Intermediate Compound 1-2 was dissolved in THF (20 mL), phenylmagnesium bromide (8.4 mL, 3.0 M in diethyl ether) was slowly added at about 0° C., followed by stirring at room temperature for about 2 hours. The reaction solution was extracted with 60 mL of water and 60 mL of diethyl ether three times. The organic layer thus obtained was dried with magnesium sulfate, and solvents were evaporated. The crude product thus obtained was separated by silica gel column chromatography to obtain 2.79 g (yield 60%) of Intermediate Compound 1-3. The compound thus produced was identified through LC-MS. C$_{29}$H$_{21}$BrO: M+464.1.

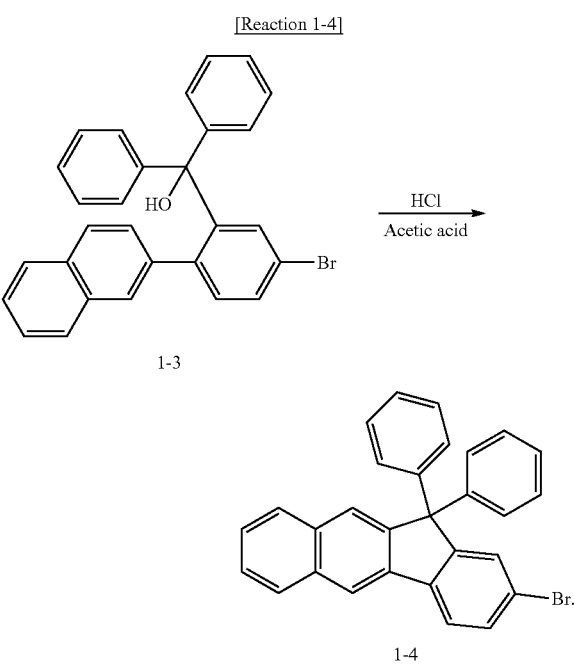

Synthesis of Intermediate Compound 1-4

4.65 g (10 mmol) of Intermediate Compound 1-3 was dissolved in 20 mL of acetic acid/HCl (4/1) and stirred at about 60° C. for about 6 hours. After cooling the reaction solution to room temperature, 10 g of sodium hydroxide was dissolved in 20 mL of water and then added thereto, and extraction with 60 mL of water and 60 mL of dichloromethane was carried out three times. The organic layer thus obtained was dried with magnesium sulfate, and solvents were evaporated. The crude product thus obtained was separated by silica gel column chromatography to obtain 3.35 g (yield 75%) of Intermediate Compound 1-4. The compound thus produced was identified through LC-MS. C$_{29}$H$_{19}$Br: M+446.1.

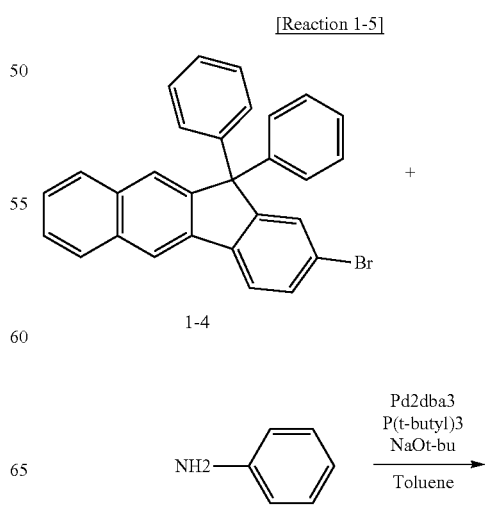

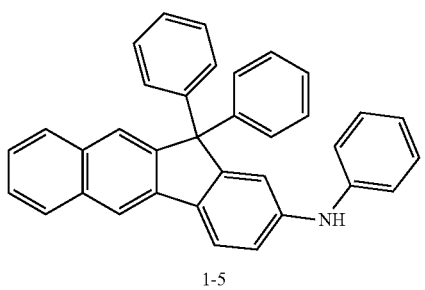

1-5

Synthesis of Intermediate Compound 1-5

4.46 g (10 mmol) of Intermediate Compound 1-4, 1.40 g (15 mmol) of aniline, 0.46 g (0.5 mmol) of tris(dibenzylideneacetone)dipalladium(0) (Pd$_2$dba$_3$), and 2.88 g (30 mmol) of sodium tert-butoxide were dissolved in 60 mL of toluene, and stirred at about 80° C. for about 3 hours. After cooling the reaction solution to room temperature, 40 mL of water was added thereto, and extraction with 50 mL of ethyl ether was carried out three times. The organic layer thus collected was dried with magnesium sulfate, solvents were evaporated, and the crude product thus obtained was separated by silica gel column chromatography to obtain 3.21 g (yield 70%) of Intermediate Compound 1-5. The compound thus produced was identified through LC-MS. C$_{35}$H$_{25}$N: M+459.2.

[Reaction 1-6]

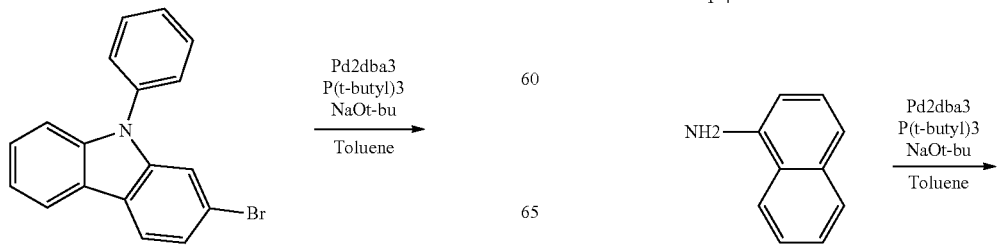

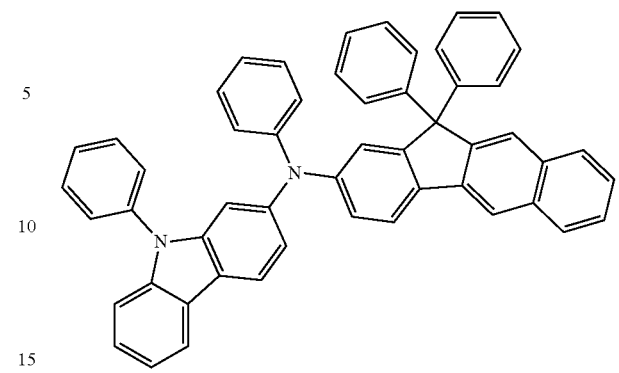

compound 1

Synthesis of Compound 1

4.59 g (10 mmol) of Intermediate Compound 1-5, 3.54 g (11 mmol) of 2-bromo-9-phenyl-9H-carbazole, 0.46 g (0.5 mmol) of tris(dibenzylideneacetone)dipalladium(0) (Pd$_2$dba$_3$), and 2.88 g (30 mmol) of sodium tert-butoxide were dissolved in 60 mL of toluene, and then, stirred at about 80° C. for about 3 hours. After cooling the reaction solution to room temperature, 40 mL of water was added thereto, and extraction with 50 mL of ethyl ether was carried out three times. The organic layer thus collected was dried with magnesium sulfate, solvents were evaporated, and the crude product thus obtained was separated by silica gel column chromatography to obtain 4.91 g (yield 70%) of Compound 1. The compound thus produced was identified through MS/FAB and 1H NMR.

(2) Synthesis of Compound 2

Amine Compound 2 according to an embodiment may be synthesized by, for example, the reaction below.

[Reaction 2-1]

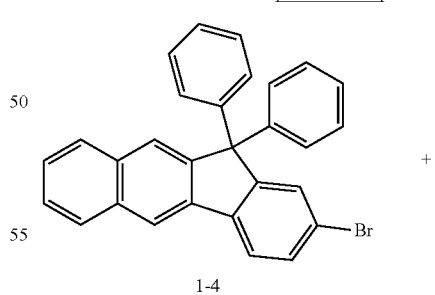

-continued

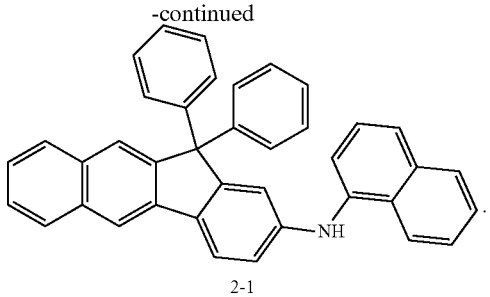

2-1

Synthesis of Intermediate Compound 2-1

Intermediate Compound 2-1 was synthesized by the same synthetic method of Intermediate Compound 1-5 except for utilizing naphthalen-1-amine instead of aniline.

[Reaction 2-2]

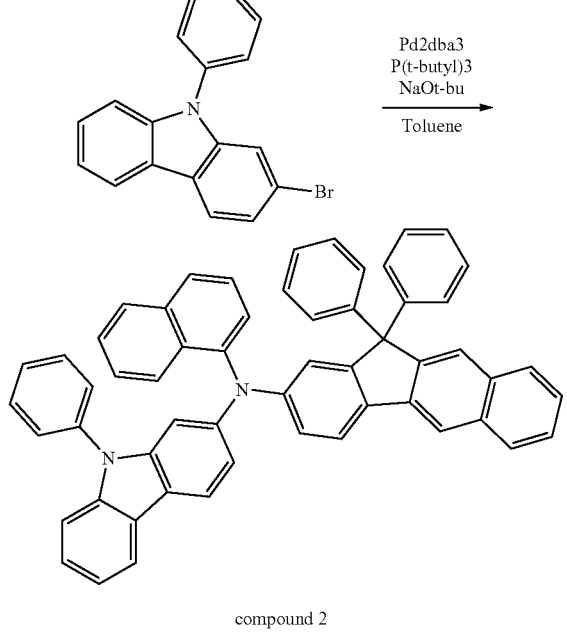

compound 2

Synthesis of Compound 2

Compound 2 was synthesized by the same synthetic method of Compound 1 except for utilizing Intermediate Compound 2-1 instead of Intermediate Compound 1-5. The compound thus produced was identified through MS/FAB and $^1$H NMR.

(3) Synthesis of Compound 3

Amine Compound 3 according to an embodiment may be synthesized by, for example, the reaction below.

[Reaction 3-1]

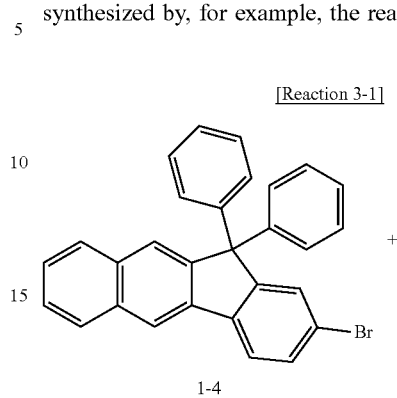

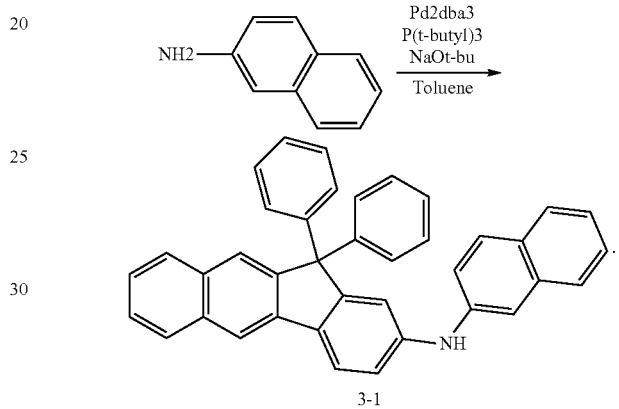

3-1

Synthesis of Intermediate Compound 3-1

Intermediate Compound 3-1 was synthesized by the same synthetic method of Intermediate Compound 1-5 except for utilizing naphthalen-2-amine instead of aniline.

[Reaction 3-2]

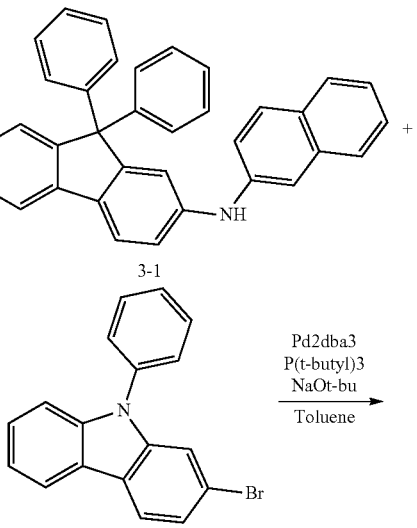

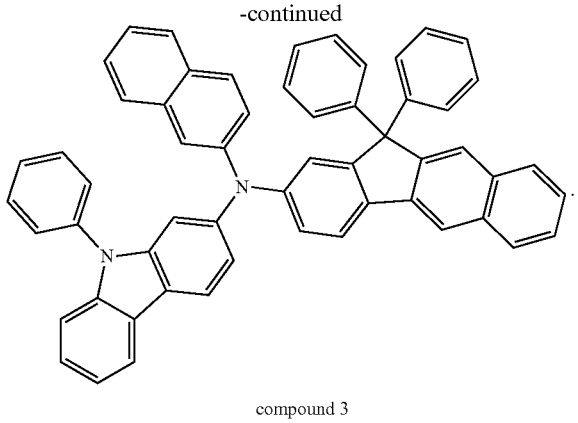

compound 3

Synthesis of Compound 3

Compound 3 was synthesized by the same synthetic method of Compound 1 except for utilizing Intermediate Compound 3-1 instead of Intermediate Compound 1-5. The compound thus produced was identified through MS/FAB and $^1$H NMR.

(4) Synthesis of Compound 17

Amine Compound 17 according to an embodiment may be synthesized by, for example, the reaction below.

[Reaction 4-1]

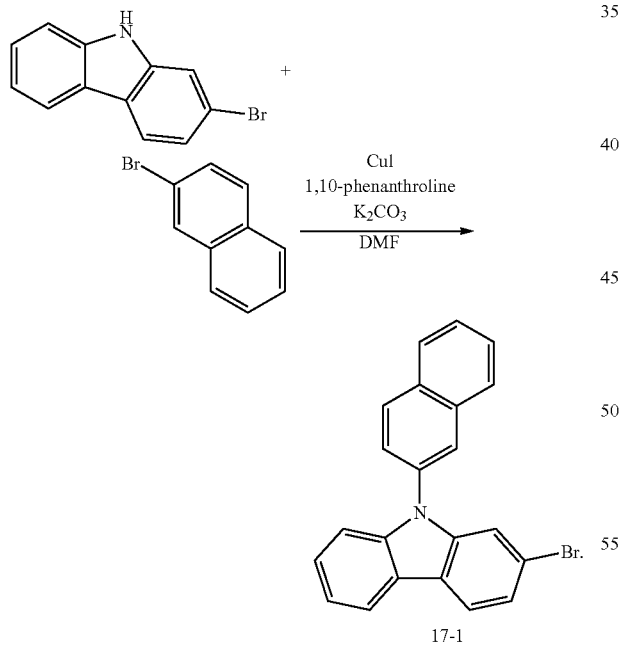

Synthesis of Intermediate Compound 17-1

2.46 g (10.0 mmol) of 2-bromo-9H-carbazole, 3.11 g (15.0 mmol) of 2-bromonaphthalene, 0.1 g (0.5 mmol) of CuI, 0.09 g (0.5 mmol) of 1,10-phenanthroline, and 4.14 g (30.0 mmol) of $K_2CO_3$ were dissolved in 60 mL of DMF, and then, stirred at about 150° C. for about 16 hours. After cooling the reaction solution to room temperature, extraction with 60 mL of water and 60 mL of diethyl ether was carried out three times. The organic layer thus obtained was dried with magnesium sulfate, solvents were evaporated, and the crude product thus obtained was separated by silica gel chromatography to obtain 2.05 g (yield 55%) of Intermediate Compound 17-1. The compound thus produced was identified through LC-MS. $C_{22}H_{14}BrN$: M+371.0.

[Reaction 4-2]

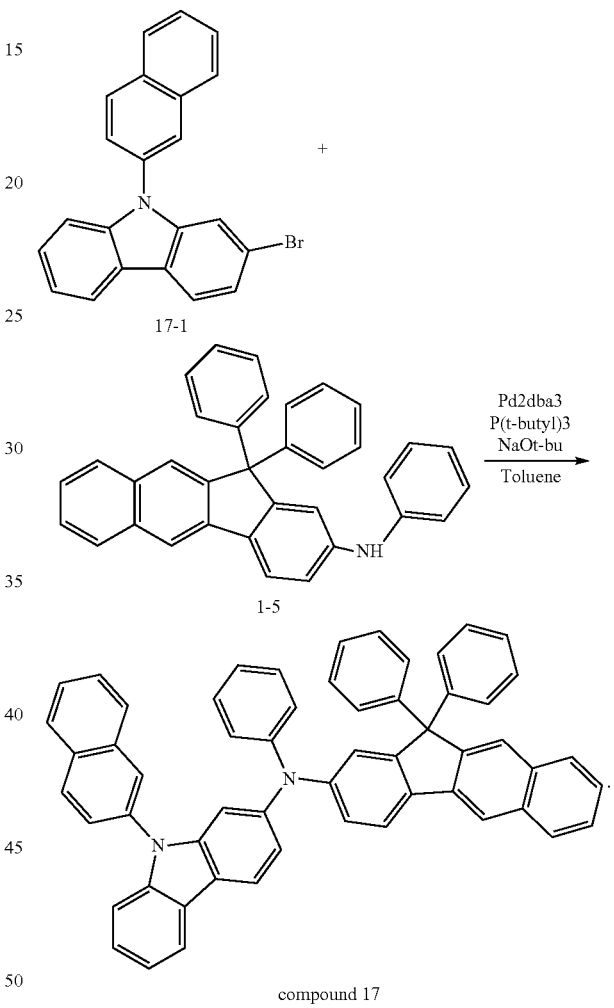

compound 17

Synthesis of Compound 17

4.08 g (11 mmol) of Intermediate Compound 17-1, 4.59 g (10 mmol) of Intermediate Compound 1-5, 0.46 g (0.5 mmol) of tris(dibenzylideneacetone)dipalladium(0) ($Pd_2dba_3$), and 2.88 g (30 mmol) of sodium tert-butoxide were dissolved in 60 mL of toluene, and stirred at about 80° C. for about 3 hours. After cooling the reaction solution to room temperature, 40 mL of water was added, and extraction with 50 mL of ethyl ether was carried out three times. The organic layer thus collected was dried with magnesium sulfate, solvents were evaporated, and the crude product thus obtained was separated by silica gel column chromatography to obtain 5.26 g (yield 70%) of Compound 17. The compound thus obtained was identified through MS/FAB and ¹H NMR.

(5) Synthesis of Compound 21

Amine Compound 21 according to an embodiment may be synthesized by, for example, the reaction below.

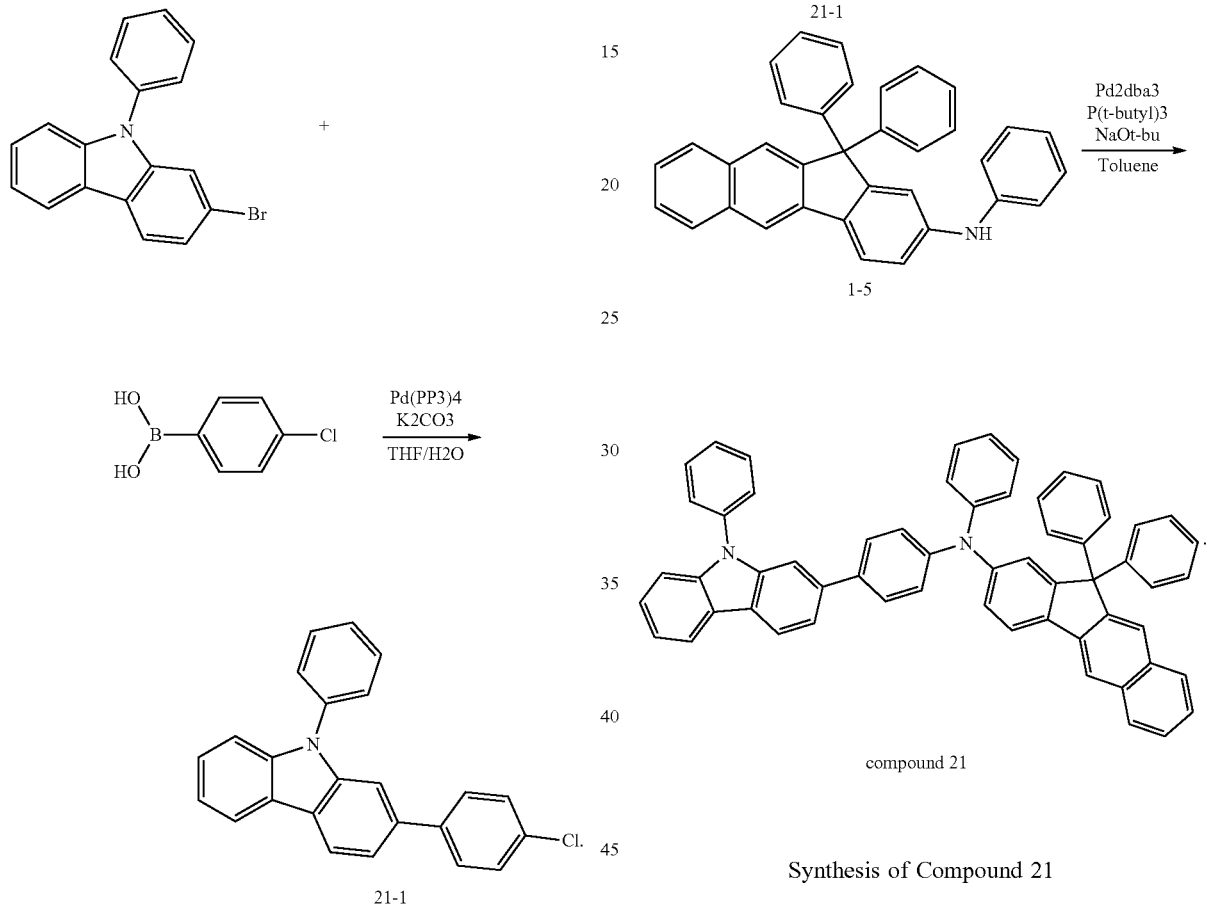

Synthesis of Intermediate Compound 21-1

3.22 g (10.0 mmol) of 2-bromo-9-phenyl-9H-carbazole, 1.56 g (10.0 mmol) of (4-chlorophenyl)boronic acid, 0.58 g (0.5 mmol) of Pd(PPh$_3$)$_4$, and 4.14 g (30.0 mmol) of K$_2$CO$_3$ were dissolved in 60 mL of a mixture solution of THF/H$_2$O (2/1) and then, stirred at about 80° C. for about 16 hours. After cooling the reaction solution to room temperature, extraction with 60 mL of water and 60 mL of diethyl ether was carried out three times. The organic layer thus obtained was dried with magnesium sulfate, solvents were evaporated, and the crude product thus obtained was separated by silica gel column chromatography to obtain 2.12 g (yield 60%) of Intermediate Compound 21. The compound thus obtained was identified through LC-MS. C$_{24}$H$_{16}$ClN: M+353.1.

Synthesis of Compound 21

3.89 g (11 mmol) of Intermediate Compound 21-1, 4.59 g (10 mmol) of Intermediate Compound 1-5, 0.46 g (0.5 mmol) of tris(dibenzylideneacetone)dipalladium(0) (Pd$_2$dba$_3$), and 2.88 g (30 mmol) of sodium tert-butoxide were dissolved in 60 mL of toluene and then, stirred at about 80° C. for about 3 hours. After cooling the reaction solution to room temperature, 40 mL of water was added, and extraction with 50 mL of ethyl ether was carried out three times. The organic layer thus collected was dried with magnesium sulfate, solvents were evaporated, and the crude product thus obtained was separated by silica gel column chromatography to obtain 5.44 g (yield 70%) of Compound 21. The compound thus obtained was identified through MS/FAB and ¹H NMR.

(6) Synthesis of Compound 27

Amine Compound 27 according to an embodiment may be synthesized by, for example, the reaction below.

[Reaction 6-1]

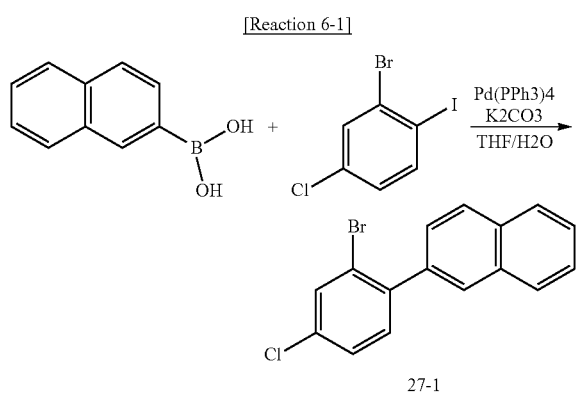

Synthesis of Intermediate Compound 27-1

3.17 g (10.0 mmol) of 2-bromo-4-chloro-1-iodobenzene, 1.72 g (10.0 mmol) of naphthalen-2-ylboronic acid, 0.58 g (0.5 mmol) of Pd(PPh$_3$)$_4$ and 4.14 g (30.0 mmol) of K$_2$CO$_3$ were dissolved in 60 mL of a mixture solution of THF/H$_2$O (2/1) and then, stirred at about 80° C. for about 16 hours. After cooling the reaction solution to room temperature, extraction with 60 mL of water and 60 mL of diethyl ether was carried out three times. The organic layer thus obtained was dried with magnesium sulfate, solvents were evaporated, and the crude product thus obtained was separated by silica gel column chromatography to obtain 1.91 g (yield 60%) of Intermediate Compound 27-1. The compound thus obtained was identified through LC-MS. C$_{16}$H$_{10}$BrCl: M+315.9.

[Reaction 6-2]

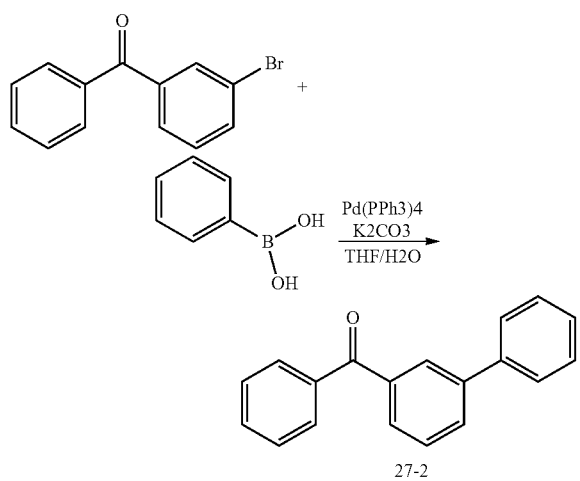

Synthesis of Intermediate Compound 27

2.61 g (10.0 mmol) of 3-bromobenzophenone, 1.46 g (12.0 mmol) of phenylboronic acid, 0.58 g (0.5 mmol) of Pd(PPh$_3$)$_4$ and 4.14 g (30.0 mmol) of K$_2$CO$_3$ were dissolved in 60 mL of a mixture solution of THF/H$_2$O (2/1) and then, stirred at about 80° C. for about 16 hours. After cooling the reaction solution to room temperature, extraction with 60 mL of water and 60 mL of diethyl ether was carried out three times. The organic layer thus obtained was dried with magnesium sulfate, solvents were evaporated, and the crude product thus obtained was separated by silica gel column chromatography to obtain 2.19 g (yield 85%) of Intermediate Compound 27-2. The compound thus obtained was identified through LC-MS. C$_{19}$H$_{14}$O: M+258.1.

[Reaction 6-3]

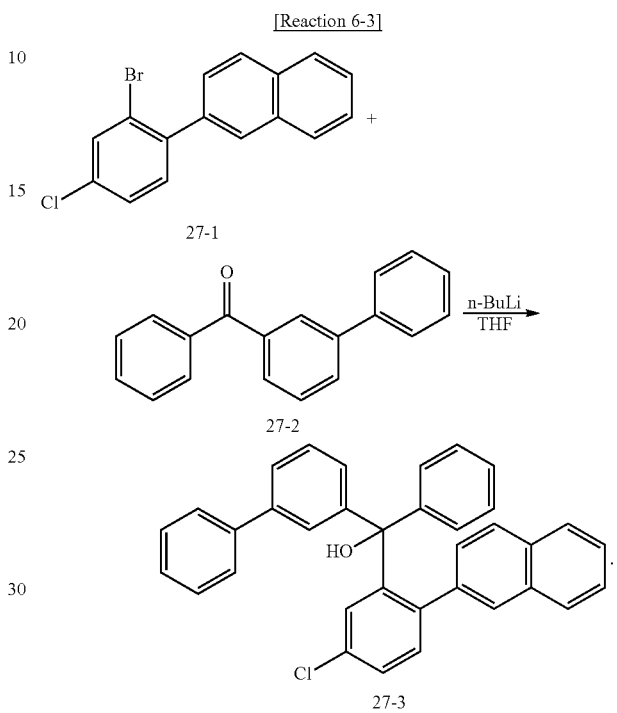

Synthesis of Intermediate Compound 27-3

3.18 g (10 mmol) of Intermediate Compound 27-1 was dissolved in 30 mL of THF, and n-butyllithium (4 mL, 2.5 M in hexane) was added thereto at about −78° C. After one hour at the same temperature, 2.58 g of Intermediate Compound 27-2 was dissolved in 30 mL of THF and then, added thereto. After stirring at room temperature for about 5 hours, water was added, and the resultant solution was washed with diethyl ether (30 mL) three times. A washed diethyl ether layer was dried with MgSO$_4$ and dried under a reduced pressure to obtain a crude product. The crude product was separated by silica gel column chromatography to obtain 3.73 g of Intermediate Compound 27-3. The compound produced was identified through LC-MS. C$_{35}$H$_{25}$ClO: M+496.1.

[Reaction 6-4]

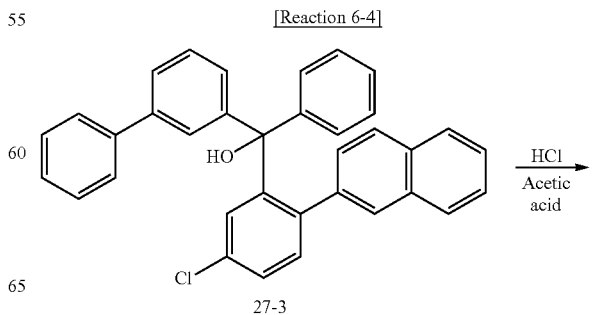

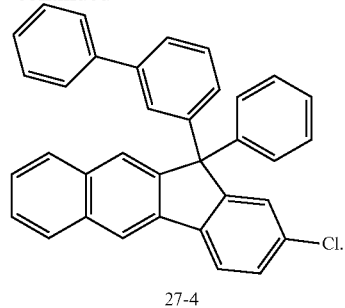

27-4

Synthesis of Intermediate Compound 27-4

4.97 g (10 mmol) of Intermediate Compound 27-3 was dissolved in 20 mL of acetic acid/HCl (4/1) and stirred at about 60° C. for about 6 hours. After cooling the reaction solution to room temperature, 10 g of sodium hydroxide was dissolved in 20 mL of water and then added thereto, and extraction with 60 mL of water and 60 mL of dichloromethane was carried out three times. The organic layer thus obtained was dried with magnesium sulfate, and solvents were evaporated. The crude product thus obtained was separated by silica gel column chromatography to obtain 3.35 g (yield 70%) of Intermediate Compound 27-4. The compound thus produced was identified through LC-MS. $C_{35}H_{23}ClIr$: M+478.1.

[Reaction 6-5]

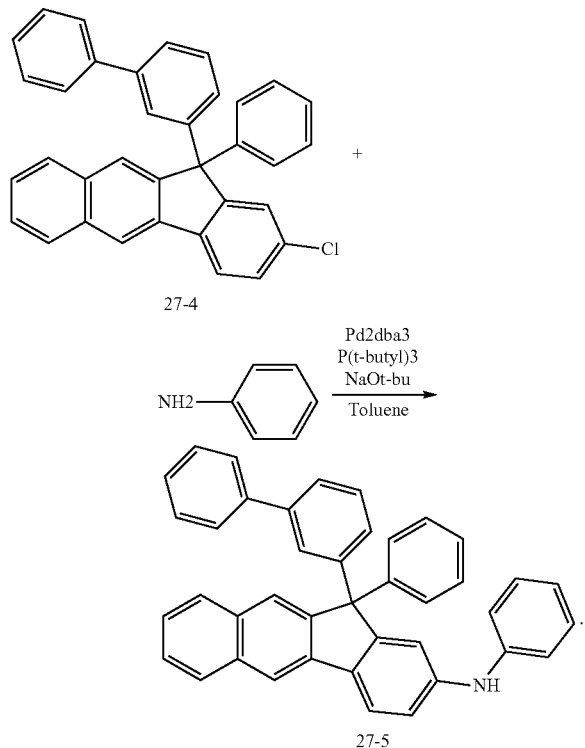

27-5

Synthesis of Intermediate Compound 27-5

4.79 g (10 mmol) of Intermediate Compound 27-4, 1.40 g (15 mmol) of aniline, 0.46 g (0.5 mmol) of tris(dibenzylideneacetone)dipalladium(0) ($Pd_2dba_3$), and 2.88 g (30 mmol) of sodium tert-butoxide were dissolved in 60 mL of toluene, and stirred at about 80° C. for about 3 hours. After cooling the reaction solution to room temperature, 40 mL of water was added thereto, and extraction with 50 mL of ethyl ether was carried out three times. The organic layer thus collected was dried with magnesium sulfate, solvents were evaporated, and the crude product thus obtained was separated by silica gel column chromatography to obtain 3.51 g (yield 77%) of Intermediate Compound 27-5. The compound thus produced was identified through LC-MS. $C_{35}H_{25}N$: M+535.2.

[Reaction 6-6]

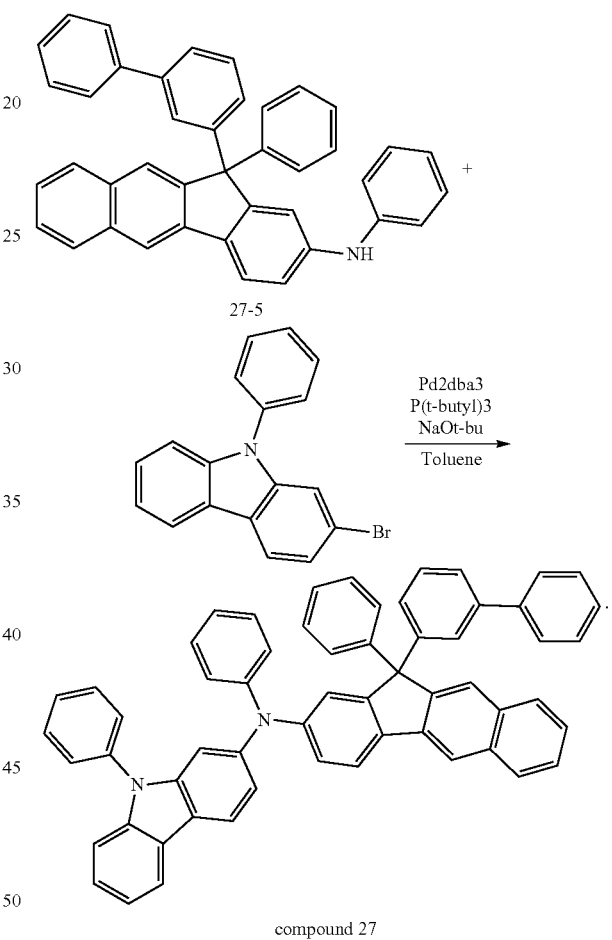

compound 27

Synthesis of Compound 27

5.35 g (10 mmol) of Intermediate Compound 27-5, 3.54 g (11 mmol) of 2-bromo-9-phenyl-9H-carbazole, 0.46 g (0.5 mmol) of tris(dibenzylideneacetone)dipalladium(0) ($Pd_2dba_3$), and 2.88 g (30 mmol) of sodium tert-butoxide were dissolved in 60 mL of toluene, and then, stirred at about 80° C. for about 3 hours. After cooling the reaction solution to room temperature, 40 mL of water was added thereto, and extraction with 50 mL of ethyl ether was carried out three times. The organic layer thus collected was dried with magnesium sulfate, solvents were evaporated, and the crude product thus obtained was separated by silica gel column chromatography to obtain 5.44 g (yield 70%) of Compound 27. The compound thus produced was identified through MS/FAB and ¹H NMR.

(7) Synthesis of Compound 33

Amine Compound 33 according to an embodiment may be synthesized by, for example, the reaction below.

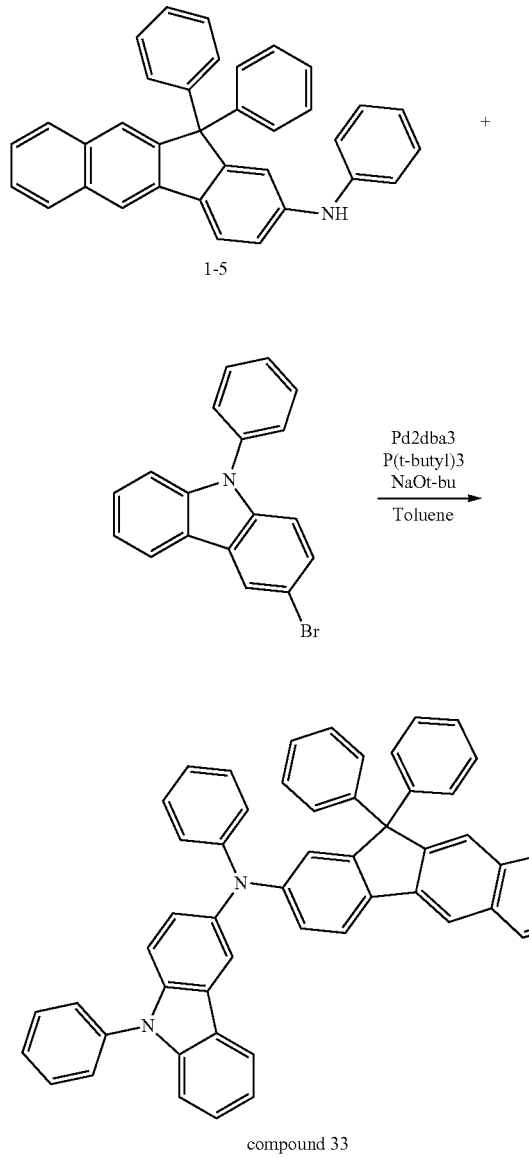

compound 33

Synthesis of Compound 33

Compound 33 was synthesized by the same synthetic method of Compound 1 except for utilizing 3-bromo-9-phenyl-9H-carbazole instead of 2-bromo-9-phenyl-9H-carbazole. The compound thus produced was identified through MS/FAB and ¹H NMR.

(8) Synthesis of Compound 34

Amine Compound 34 according to an embodiment may be synthesized by, for example, the reaction below.

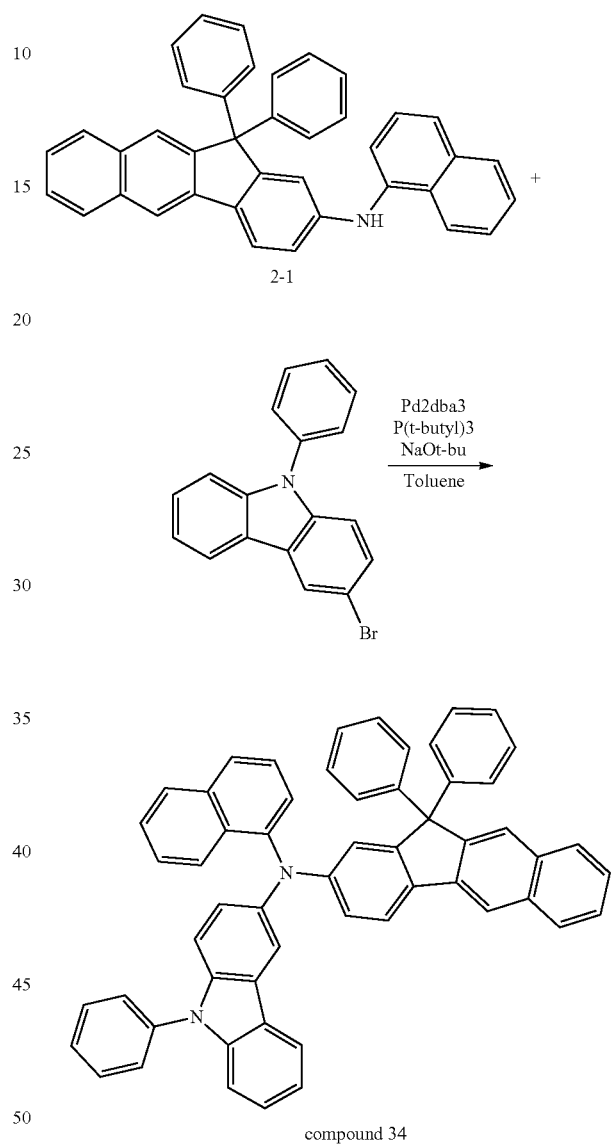

compound 34

Synthesis of Compound 34

Compound 34 was synthesized by the same synthetic method of Compound 33 except for utilizing Intermediate Compound 2-1 instead of Intermediate Compound 1-5. The compound thus produced was identified through MS/FAB and ¹H NMR.

(9) Synthesis of Compound 35

Amine Compound 35 according to an embodiment may be synthesized by, for example, the reaction below.

[Reaction 9]

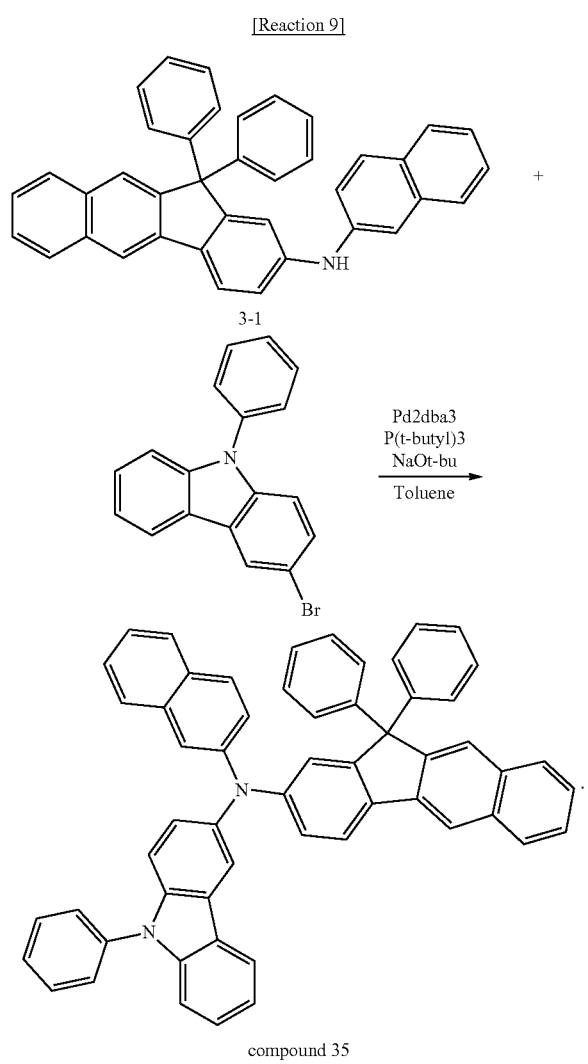

Synthesis of Compound 35

Compound 35 was synthesized by the same synthetic method of Compound 33 except for utilizing Intermediate Compound 3-1 instead of Intermediate Compound 1-5. The compound thus produced was identified through MS/FAB and $^1$H NMR.

(10) Synthesis of Compound 49

Amine Compound 49 according to an embodiment may be synthesized by, for example, the reaction below.

[Reaction 10-1]

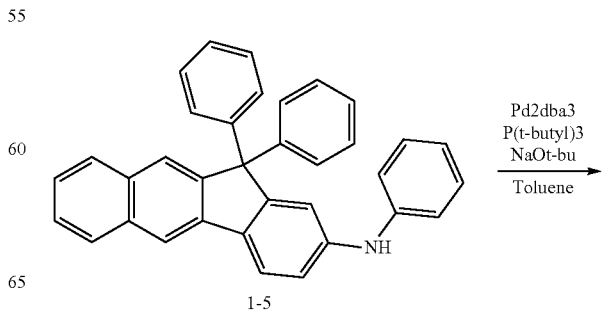

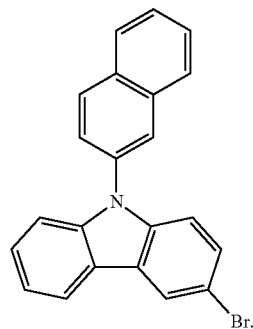

Synthesis of Intermediate Compound 49-1

Intermediate Compound 49-1 was synthesized by the same synthetic method of Intermediate Compound 17-1 except for utilizing 3-bromo-9-phenyl-9H-carbazole instead of 2-bromo-9-phenyl-9H-carbazole. The compound thus produced was identified through LC-MS. $C_{22}H_{14}BrN$: M+371.0.

[Reaction 10-2]

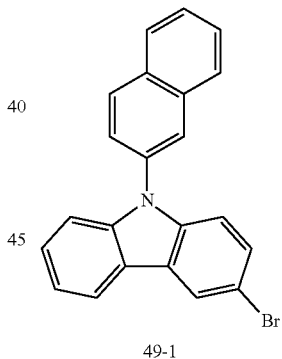

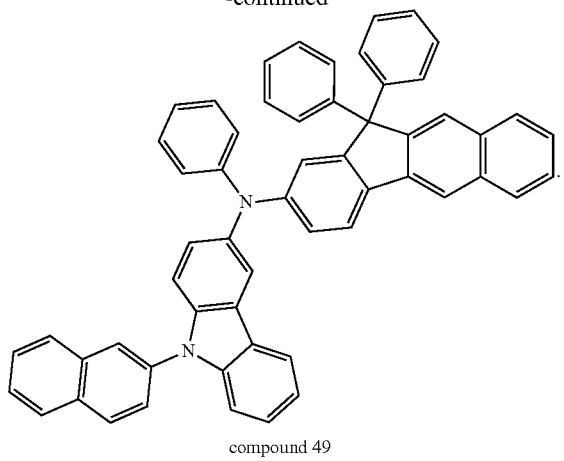

compound 49

Synthesis of Compound 49

Compound 49 was synthesized by the same synthetic method of Compound 17 except for utilizing Intermediate Compound 49-1 instead of Intermediate Compound 17-1. The compound thus produced was identified through MS/FAB and $^1$H NMR.

(11) Synthesis of Compound 53

Amine Compound 53 according to an embodiment may be synthesized by, for example, the reaction below.

[Reaction 11-1]

Synthesis of Intermediate Compound 53-1

Intermediate Compound 53-1 was synthesized by the same synthetic method of Intermediate Compound 21-1 except for utilizing 3-bromo-9-phenyl-9H-carbazole instead of 2-bromo-9-phenyl-9H-carbazole. The compound thus produced was identified through LC-MS. $C_{24}H_{16}ClN$: M+353.1.

[Reaction 11-2]

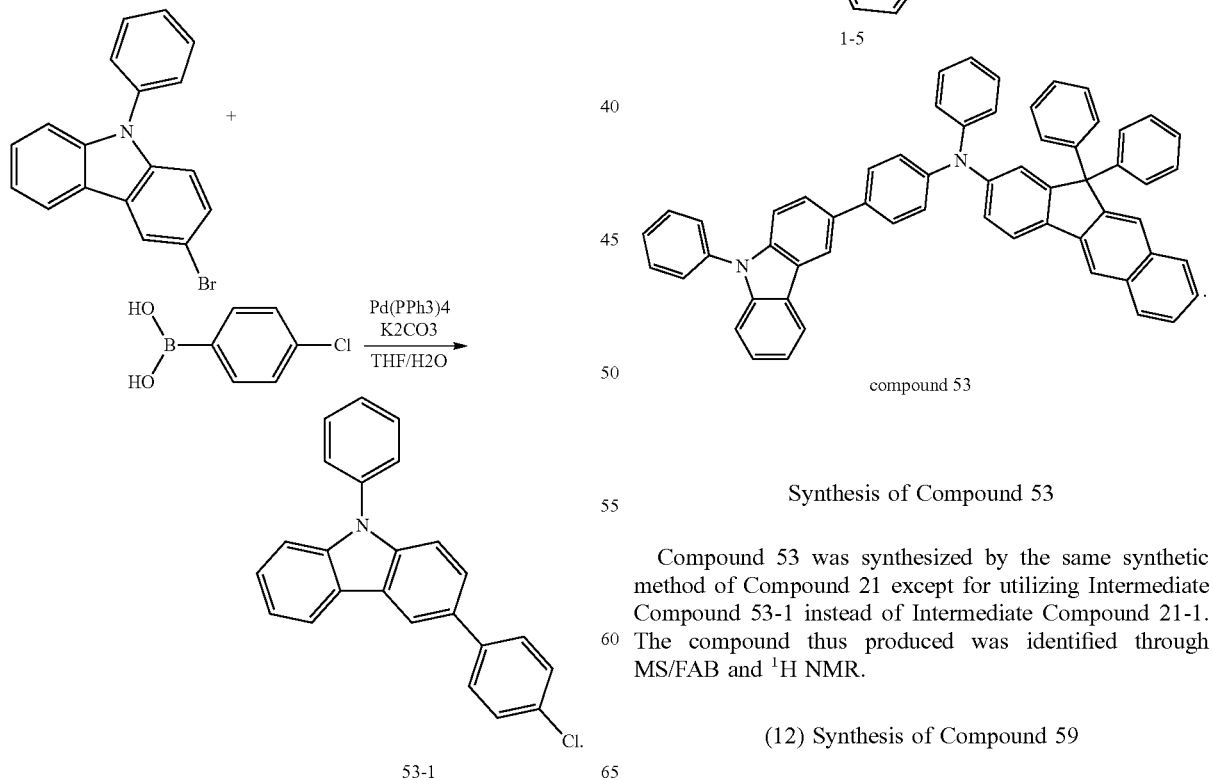

compound 53

Synthesis of Compound 53

Compound 53 was synthesized by the same synthetic method of Compound 21 except for utilizing Intermediate Compound 53-1 instead of Intermediate Compound 21-1. The compound thus produced was identified through MS/FAB and $^1$H NMR.

(12) Synthesis of Compound 59

Amine Compound 59 according to an embodiment may be synthesized by, for example, the reaction below.

[Reaction 12]

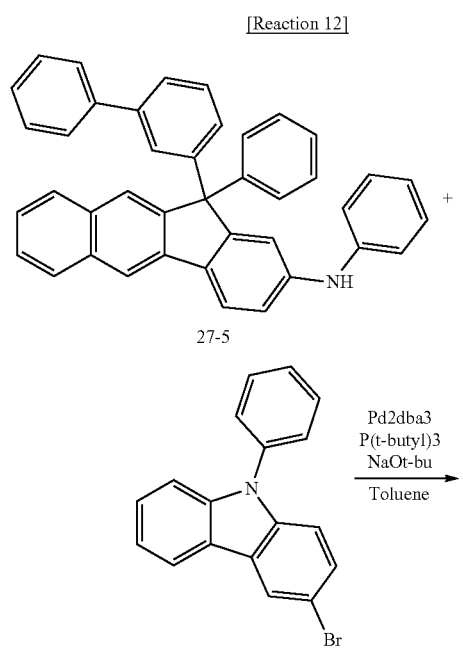

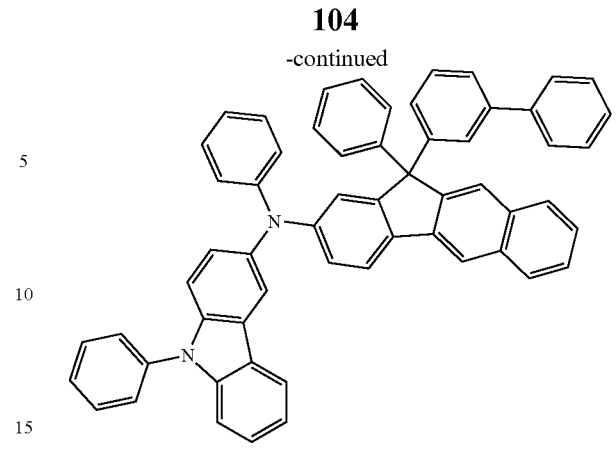

compound 59

Synthesis of Intermediate Compound 59

Compound 59 was synthesized by the same synthetic method of Compound 27 except for utilizing 3-bromo-9-phenyl-9H-carbazole instead of 2-bromo-9-phenyl-9H-carbazole. The compound thus produced was identified through MS/FAB and $^1$H NMR.

Table 1 below shows $^1$H NMR and MS/FAB results of Example Compounds.

TABLE 1

| Compound | $^1$H NMR (CDCl$_3$, 400 MHz) | MS/FAB found | calc. |
|---|---|---|---|
| Compound 1 | 8.39(d, 1H), 8.20-8.14(m, 3H), 8.03-7.98(m, 2H), 7.85(s, 1H), 7.62-7.50 (m, 10H), 7.26-7.00 (m, 18H), 6.40 (d, 1H) | 700.39 | 700.29 |
| Compound 2 | 8.39(d, 1H), 8.22-8.14(m, 5H), 8.03-7.98(m, 2H), 7.85-7.81(m, 2H), 7.63-7.49 (m, 14H), 7.26-7.10 (m, 13H), 6.40 (d, 1H) | 750.40 | 750.30 |
| Compound 3 | 8.39(d, 1H), 8.20-8.14(m, 3H), 8.03-7.98(m, 2H), 7.85(s, 1H), 7.78-7.10(m, 30H), 6.40 (d, 1H) | 750.40 | 750.30 |
| Compound 17 | 8.39(d, 1H), 8.20-8.14(m, 3H), 8.03-7.98(m, 5H), 7.85(s, 1H), 7.83(s, 1H), 7.59-7.50(m, 7H), 7.36-7.08 (m, 19H), 6.40 (d, 1H) | 750.40 | 750.30 |
| Compound 21 | 8.62(d, 1H), 8.22-8.14(m, 4H), 8.03-7.98(m, 2H), 7.85(s, 1H), 7.74(s, 1H), 7.62-7.50(m, 12H), 7.37-7.00 (m, 19H) | 776.42 | 776.32 |
| Compound 27 | 8.39(d, 1H), 8.20-8.14(m, 3H), 8.03-7.98(m, 2H), 7.85-7.75(s, 4H), 7.62-7.41 (m, 16H), 7.26-7.00 (m, 13H), 6.40 (d, 1H) | 776.42 | 776.32 |
| Compound 33 | 8.20-8.14(m, 3H), 8.03-7.98(m, 3H), 7.90-7.85(m, 2H), 7.62-7.50 (m, 10H), 7.26-7.00 (m, 17H), 6.48 (d, 1H) | 700.39 | 700.29 |
| Compound 34 | 8.22-8.14(m, 5H), 8.03-7.98(m, 3H), 7.90-7.81(m, 3H), 7.63-7.49 (m, 14H), 7.35-7.10 (m, 12H), 6.48 (d, 1H) | 750.40 | 750.30 |
| Compound 35 | 8.20-8.14(m, 3H), 8.03-7.98(m, 3H), 7.90-7.85(m, 2H), 7.78-7.10(m, 29H), 6.48(d, 1H) | 750.40 | 750.30 |
| Compound 49 | 8.20-8.14(m, 3H), 8.03-7.98(m, 6H), 7.90-7.83(m, 3H), 7.59-7.50(m, 7H), 7.36-7.00 (m, 18H), 6.48 (d, 1H) | 750.40 | 750.30 |
| Compound 53 | 8.30(d, 1H), 8.20-8.13(m, 4H), 8.03-7.98(m, 2H), 7.89(s, 1H), 7.85(s, 1H), 7.62-7.50(m, 12H), 7.37-7.00 (m, 19H) | 776.42 | 776.32 |
| Compound 59 | 8.20-8.14(m, 3H), 8.03-7.98(m, 3H), 7.90-7.75(s, 5H), 7.62-7.41 (m, 16H), 7.26-7.00 (m, 12H), 6.48 (d, 1H) | 776.42 | 776.32 |

2. Manufacture and Evaluation of Organic Electroluminescence Device Including Amine Compound (Manufacture of Organic Electroluminescence Device)

An organic electroluminescence device of an embodiment including an amine compound of an embodiment in a hole transport layer was manufactured by a method described hereinafter. Organic electroluminescence devices of Example 1 to Example 12 were manufactured utilizing the amine compounds of Compounds 1, 2, 3, 17, 21, 27, 33, 34, 35, 49, 53 and 59 (which are the above-described Example Compounds) as materials for a hole transport layer. Comparative Example 1 to Comparative Example 6 corresponded to organic electroluminescence devices manufactured utilizing Comparative Compounds C1 to C6 as materials for a hole transport layer.

An ITO glass substrate with 15 $\Omega/cm^2$ of Corning Co. was cut into a size of 50 mm×50 mm×0.7 mm and washed utilizing isopropyl alcohol and pure water, exposed to ultrasonic waves for about 5 minutes and UV for about 30 minutes, and treated with ozone. After that, 4,4',4"-tris{N,-(2-naphthyl)-N-phenylamino}-triphenylamine (2-TNATA) was deposited in vacuum to a thickness of about 600 Å to form a hole injection layer, and the Example Compound or Comparative Compound was deposited in vacuum to a thickness of about 300 Å to form a hole transport layer.

On the hole transport layer, blue fluorescence hosts, 9,10-di(naphthalen-2-yl)anthracene (DNA) and 4,4'-bis[2-(4-(N,N-diphenylamino)phenyl)vinyl]biphenyl (DPAVBi) were co-deposited in a ratio (e.g., weight ratio) of 98:2 to form an emission layer of a thickness of about 300 Å.

On the emission layer, an electron transport layer with a thickness of about 300 Å was formed utilizing tris(8-hydroxyquinolino)aluminum (Alq3), and then, LiF was deposited to about 10 Å to form an electron injection layer. On the electron injection layer, a second electrode of a thickness of about 3,000 Å was formed utilizing aluminum (Al).

The compounds utilized for the manufacture of the organic electroluminescence devices of the Examples and Comparative Examples are shown.

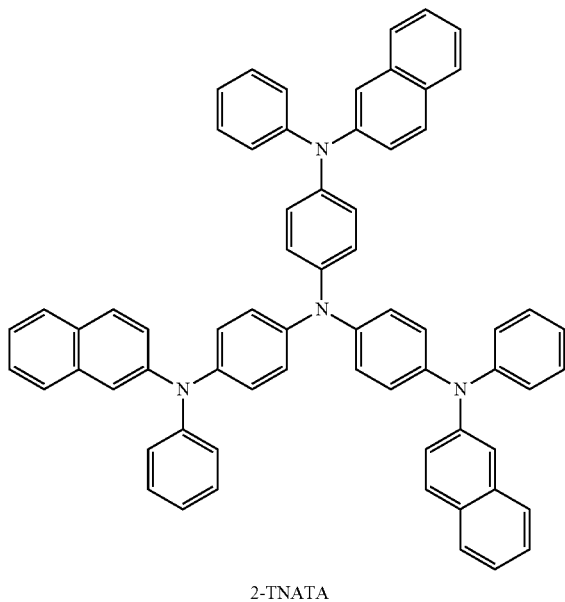

2-TNATA

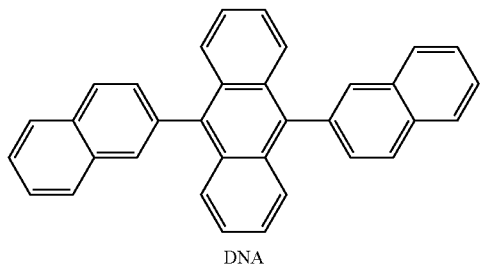

DNA

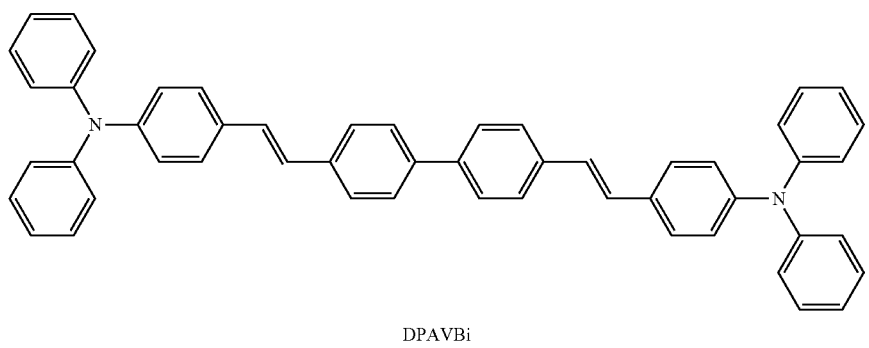

DPAVBi

-continued
107
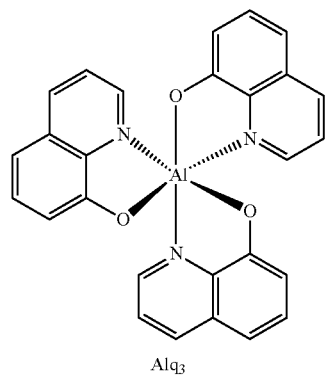
Alq3
108
1
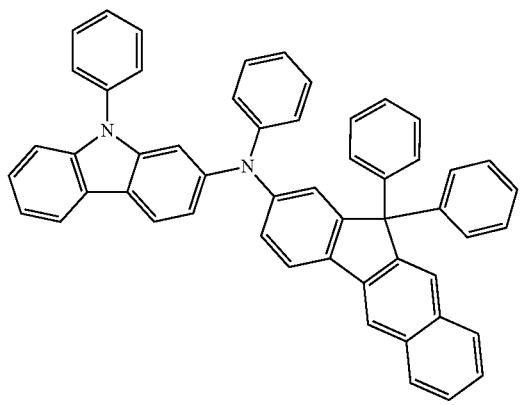
2
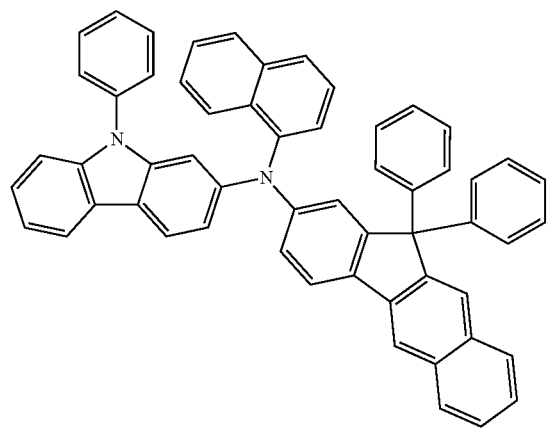
3
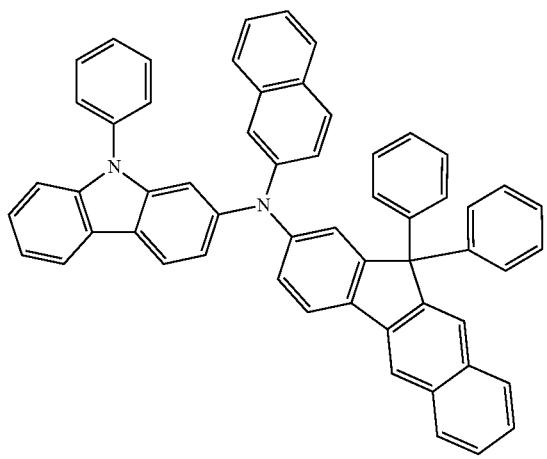
17
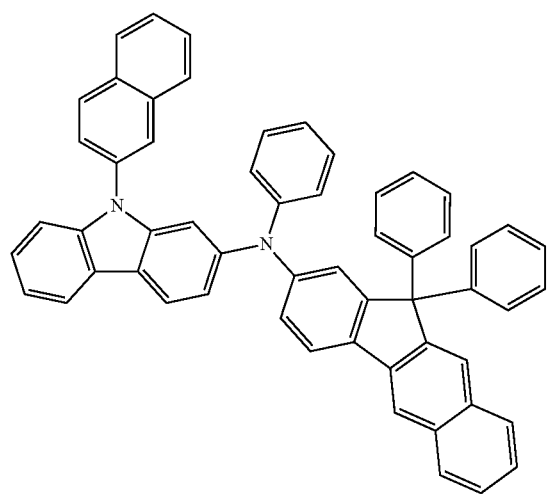
21
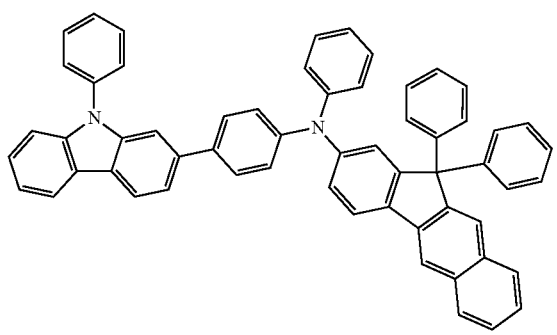

27
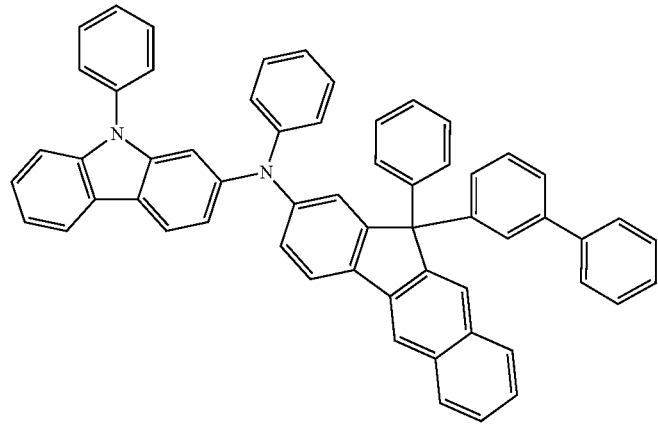
33 34
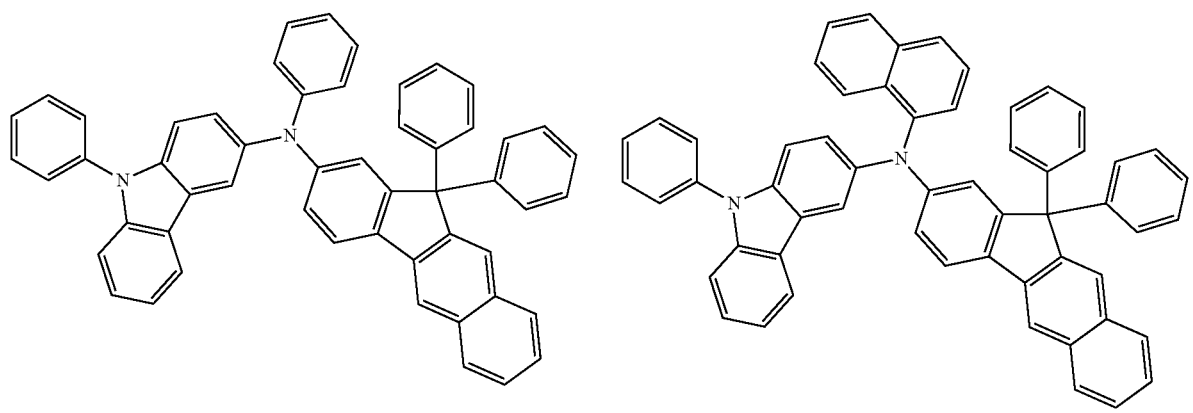
35 49
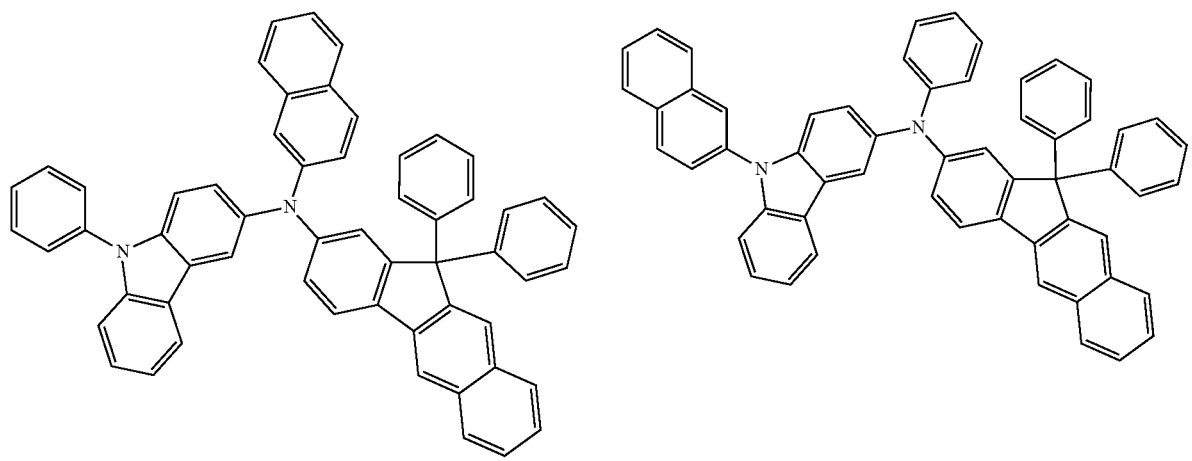

-continued
53
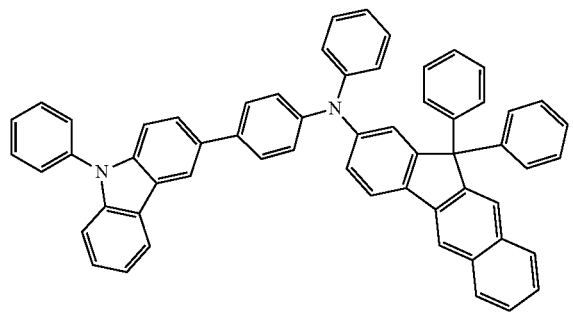
59
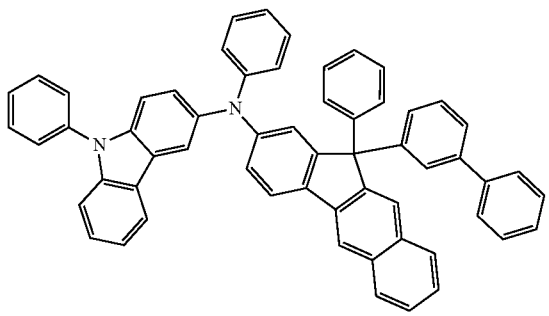
C1
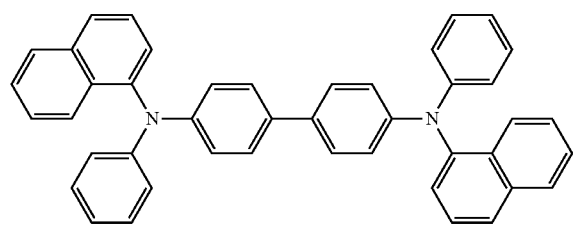
C2
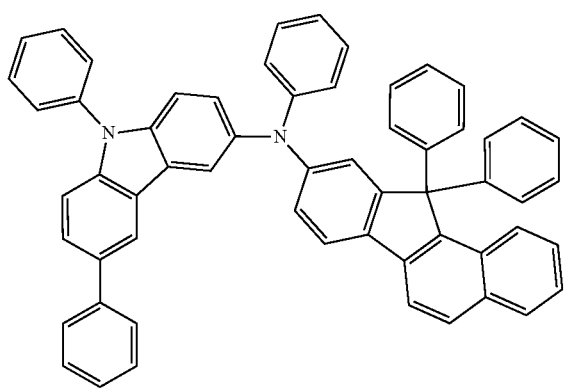
C3
C4
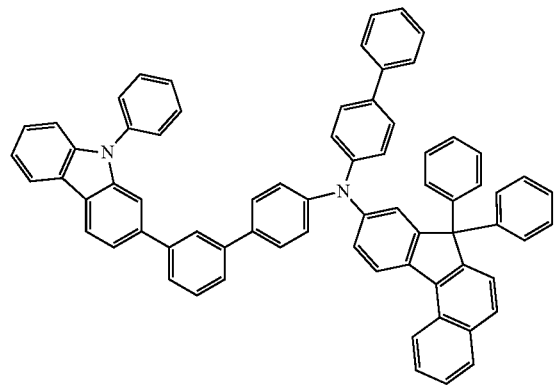
C5
C6
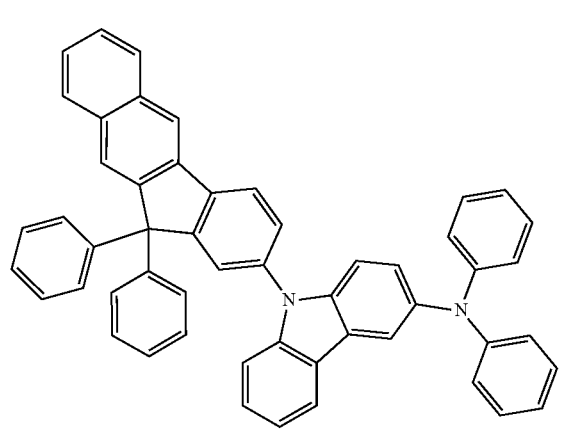
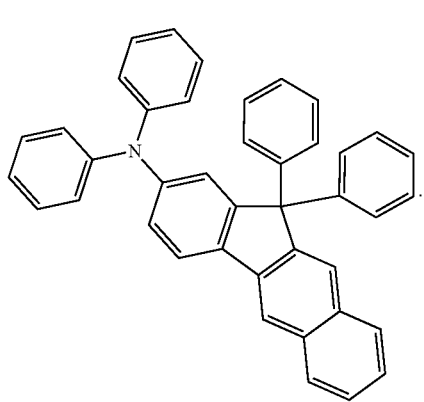

(Evaluation of Properties of Organic Electroluminescence Device)

In Table 2, the evaluation results of the organic electroluminescence devices for Example 1 to Example 12, and Comparative Example 1 to Comparative Example 6 are shown. In Table 2, the driving voltage, luminance, emission efficiency and half life of the organic electroluminescence devices thus manufactured are compared and shown.

In the evaluation results of the properties on the Examples and Comparative Examples shown in FIG. 2, the voltage and current density were measured utilizing V7000 OLED IVL Test System, (Polaronix). The emission efficiency value was measured at a current density of about 50 mA/cm$^2$. The half-life value was measured at a current density of about 100 mA/cm$^2$.

TABLE 2

| Device manufacturing example | Hole transport layer material | Driving voltage (V) | Luminance (cd/m$^2$) | Emission efficiency (cd/A) | Half-life (hr) (@100 mA/cm$^2$) | Emission color |
|---|---|---|---|---|---|---|
| Example 1 | Compound 1 | 4.83 | 3065 | 6.13 | 605 | Blue |
| Example 2 | Compound 2 | 4.82 | 3145 | 6.29 | 470 | Blue |
| Example 3 | Compound 3 | 4.82 | 3065 | 6.13 | 510 | Blue |
| Example 4 | Compound 17 | 4.82 | 3160 | 6.32 | 400 | Blue |
| Example 5 | Compound 21 | 4.96 | 3000 | 6.00 | 550 | Blue |
| Example 6 | Compound 27 | 4.85 | 3160 | 6.32 | 562 | Blue |
| Example 7 | Compound 33 | 4.81 | 3060 | 6.12 | 430 | Blue |
| Example 8 | Compound 34 | 4.86 | 3225 | 6.45 | 510 | Blue |
| Example 9 | Compound 35 | 4.88 | 3220 | 6.44 | 420 | Blue |
| Example 10 | Compound 49 | 4.85 | 3250 | 6.50 | 600 | Blue |
| Example 11 | Compound 53 | 4.98 | 3275 | 6.55 | 570 | Blue |
| Example 12 | Compound 59 | 4.82 | 3050 | 6.10 | 530 | Blue |
| Comparative Example 1 | Comparative Compound C1 | 7.01 | 2645 | 5.29 | 258 | Blue |
| Comparative Example 2 | Comparative Compound C2 | 5.11 | 3000 | 6.00 | 350 | Blue |
| Comparative Example 3 | Comparative Compound C3 | 5.21 | 2900 | 5.80 | 320 | Blue |
| Comparative Example 4 | Comparative Compound C4 | 5.00 | 3000 | 6.00 | 400 | Blue |
| Comparative Example 5 | Comparative Compound C5 | 5.65 | 2550 | 5.10 | 250 | Blue |
| Comparative Example 6 | Comparative Compound C6 | 5.91 | 2525 | 5.05 | 250 | Blue |

Referring to the results of Table 2, it could be found that each of the Examples of the organic electroluminescence devices utilizing the amine compounds according to embodiments of the present disclosure as materials for a hole transport layer emitted the same blue light and showed a lower driving voltage value and relatively high luminance, emission efficiency and device life (lifespan) when compared with the Comparative Examples. In the case of Comparative Compound C1, a carbazole group and a benzo[b]fluorenyl group substituted at an amine group were not both included, and when applied to a light emitting device, a driving voltage was increased, luminance and emission efficiency were reduced, and half life was reduced when compared with the Example Compounds. In the case of Comparative Compound C2 and Comparative Compound C3, a carbazole group and a benzofluorenyl group substituted at an amine group were included, but Comparative Compound C2 included a benzo[a]fluorenyl group, and Comparative Compound C3 included a benzo[c]fluorenyl group, and when applied to a light emitting device, a high driving voltage, low luminance and emission efficiency, and short half-life were shown when compared with the Example Compounds. In the case of Comparative Compound C4 and Comparative Compound C6, only one among a carbazole group and a benzo[b]fluorenyl group was included, and when applied to a light emitting device, a high driving voltage, low luminance and emission efficiency and short half-life were shown when compared with the Example Compounds. In case of Comparative Compound C5, both a carbazole group and a benzo[b]fluorenyl group were included (e.g., simultaneously), but the benzo[b]fluorenyl group was substituted at the nitrogen atom of the carbazole group instead of at an amine group, and it could be confirmed that, when applied to a light emitting device, a high driving voltage, low luminance and emission efficiency and short half-life were shown when compared with the Example Compounds.

In case of the Example Compounds, in an arylamine-based hole transport material, the amine compound of an embodiment has high stability due to a carbazole group and a benzo[b]fluorenyl group substituted at an amine group. Accordingly, higher hole transport properties may be achieved when compared with Comparative Compound C1 to Comparative Compound C5, and thus, the organic electroluminescence devices of the Examples may show improved emission efficiency and longer life when compared with the organic electroluminescence devices of the Comparative Examples. For example, the organic electroluminescence device of an embodiment includes the amine compound of an embodiment as a hole transport material, and may achieve high emission efficiency and/or long life (lifespan) in a blue wavelength region.

The organic electroluminescence device of an embodiment may show improved device properties of a low driving voltage, high efficiency, and/or long life (lifespan).

The amine compound of an embodiment is included in the hole transport region of an organic electroluminescence device, and may contribute to the increase of the efficiency and life (lifespan) of the organic electroluminescence device.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the embodiments of the present disclosure have been described, it is understood that the present disclosure should not be limited to these embodiments, and that various suitable changes and modifications can be made by one having ordinary skill in the art within the spirit and scope of the present disclosure as described in the following claims and equivalents thereof.

What is claimed is:

1. An organic electroluminescence device, comprising:
a first electrode;
a second electrode opposite the first electrode; and
a plurality of organic layers between the first electrode and the second electrode,
wherein at least one organic layer among the plurality of organic layers comprises an amine compound,
the amine compound is a monoamine compound comprising a single amine group, the amine group being an aryl amine group and three aromatic ring substituents substituted at the amine group, and
the three aromatic ring substituents comprise a carbazole group, and a benzo[b]fluorenyl group.

2. The organic electroluminescence device of claim 1, wherein the carbazole group and the benzo[b]fluorenyl group are each bonded to the amine group via a linker, or directly to the amine group.

3. The organic electroluminescence device of claim 1, wherein the plurality of organic layers comprise:
a hole transport region on the first electrode;
an emission layer on the hole transport region; and
an electron transport region on the emission layer, and
the hole transport region comprises the amine compound.

4. The organic electroluminescence device of claim 3, wherein the hole transport region comprises:
a hole injection layer on the first electrode; and
a hole transport layer on the hole injection layer, and
the hole transport layer comprises the amine compound.

5. The organic electroluminescence device of claim 3, wherein the hole transport region comprises multiple organic layers, and
an organic layer adjacent to the emission layer among the multiple organic layers comprises the amine compound.

6. An organic electroluminescence device, comprising:
a first electrode;
a second electrode opposite the first electrode; and
a plurality of organic layers between the first electrode and the second electrode,
wherein at least one organic layer among the plurality of organic layers comprises an amine compound represented by Formula 1:

[Formula 1]

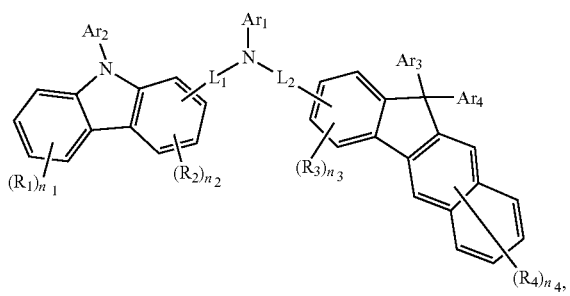

and
wherein in Formula 1,
$Ar_1$ to $Ar_4$ are each independently a substituted or unsubstituted aryl group of 6 to 30 ring-forming carbon atoms, or a substituted or unsubstituted heteroaryl group of 2 to 30 ring-forming carbon atoms,
$L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms,
$R_1$, $R_3$ and $R_4$ are each independently a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms,
$R_2$ is a hydrogen atom, a deuterium atom, a halogen atom, a substituted or unsubstituted alkyl group of 1 to 20 carbon atoms, or a substituted or unsubstituted heteroaryl group of 2 to 60 ring-forming carbon atoms,
"$n_1$" is an integer of 0 to 4,
"$n_2$" and "$n_3$" are each independently an integer of 0 to 3, and
"$n_4$" is an integer of 0 to 6.

7. The organic electroluminescence device of claim 6, wherein the amine compound represented by Formula 1 is a monoamine compound comprising a single amine group and the amine group being an aryl amine group.

8. The organic electroluminescence device of claim 6, wherein the amine compound represented by Formula 1 is represented by any one among Formula 2-1 to Formula 2-3:

[Formula 2-1]

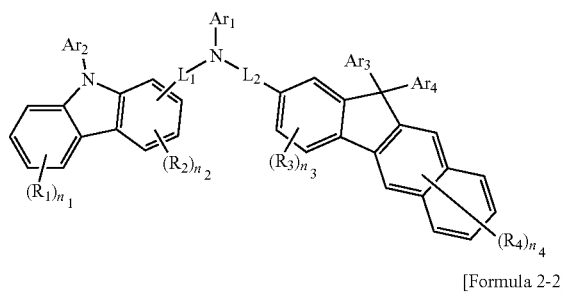

[Formula 2-2]

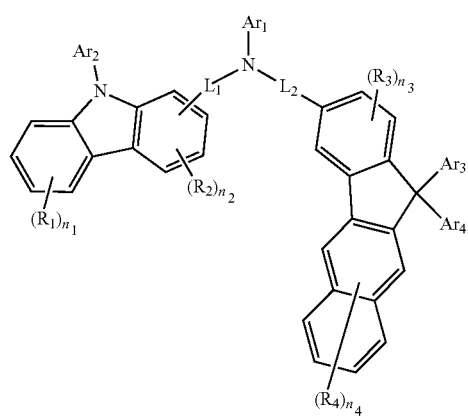

[Formula 2-3]

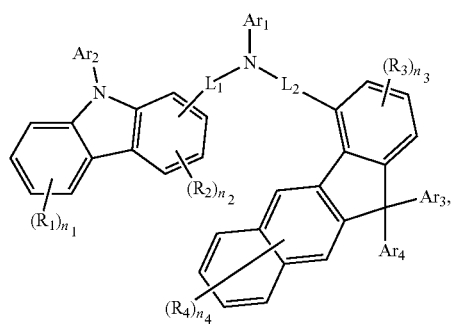

and wherein in Formula 2-1 to Formula 2-3, $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" are each independently the same as defined in Formula 1.

9. The organic electroluminescence device of claim 6, wherein the amine compound represented by Formula 1 is represented by Formula 3-1 or Formula 3-2:

[Formula 3-1]

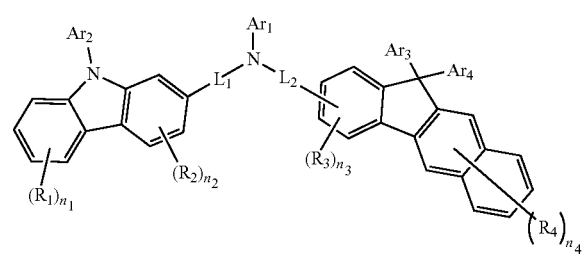

[Formula 3-2]

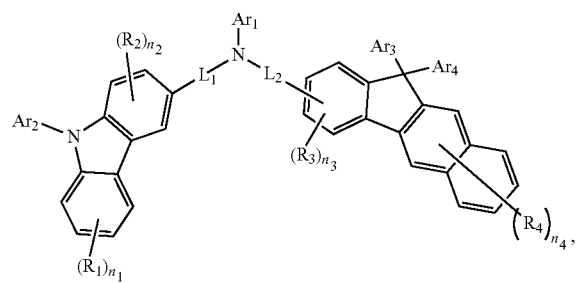

and wherein in Formula 3-1 and Formula 3-2, $Ar_1$, $Ar_2$, $Ar_3$, $Ar_4$, $L_1$, $L_2$, $R_1$, $R_2$, $R_3$, $R_4$, "$n_1$", "$n_2$", "$n_3$", and "$n_4$" are each independently the same as defined in Formula 1.

10. The organic electroluminescence device of claim 6, wherein the amine compound represented by Formula 1 is represented by Formula 4-1 or Formula 4-2:

[Formula 4-1]

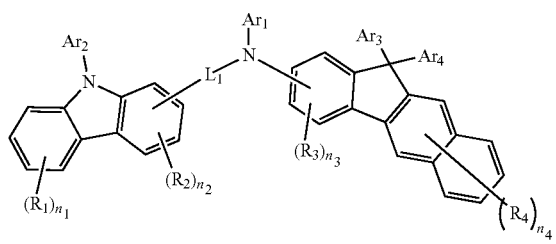

[Formula 4-2]

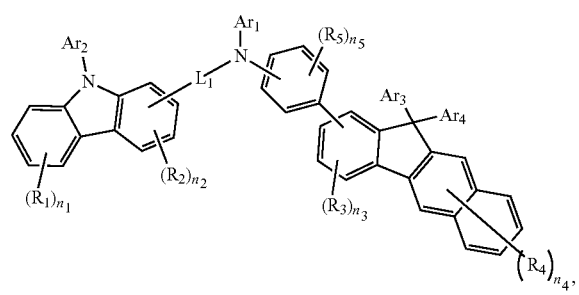

and wherein in Formula 4-1 and Formula 4-2, $R_5$ is a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, "$n_5$" is an integer of 0 to 4, and $Ar_1$, $Ar_2$, $Ar_3$, $Ar_4$, $L_1$, $R_1$, $R_2$, $R_3$, $R_4$, "$n_1$", "$n_2$", "$n_3$", and "$n_4$" are each independently the same as defined in Formula 1.

11. The organic electroluminescence device of claim 6, wherein the amine compound represented by Formula 1 is represented by Formula 5-1 or Formula 5-2:

[Formula 5-1]

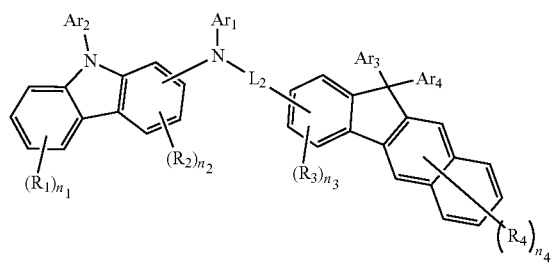

[Formula 5-2]

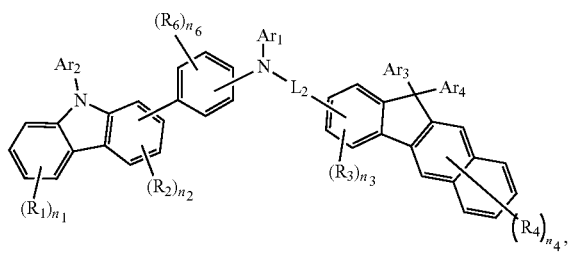

and wherein in Formula 5-1 and Formula 5-2, $R_6$ is a hydrogen atom, a deuterium atom, a halogen atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, "$n_5$" is an integer of 0 to 4, and $Ar_1$, $Ar_2$, $Ar_3$, $Ar_4$, $L_2$, $R_1$, $R_2$, $R_3$, $R_4$, "$n_1$", "$n_2$", "$n_3$", and "$n_4$" are each independently the same as defined in Formula 1.

12. The organic electroluminescence device of claim 6, wherein $Ar_1$ to $Ar_4$ are each independently a substituted or unsubstituted phenyl group, a substituted or unsubstituted biphenyl group, a substituted or unsubstituted naphthyl group, a substituted or unsubstituted dibenzofuran group, or a substituted or unsubstituted dibenzothiophene group.

13. The organic electroluminescence device of claim 6, wherein $R_1$ to $R_4$ are hydrogen atoms.

14. The organic electroluminescence device of claim 6, wherein the amine compound is at least one selected from compounds represented in Compound Group 1:

[Compound Group 1]

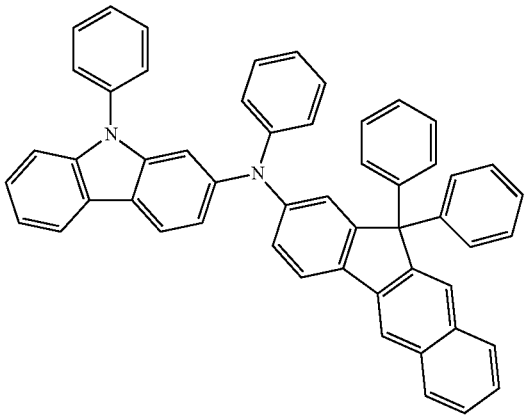

4
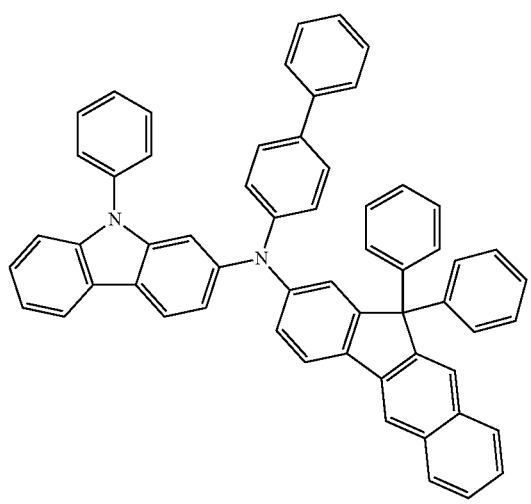
5
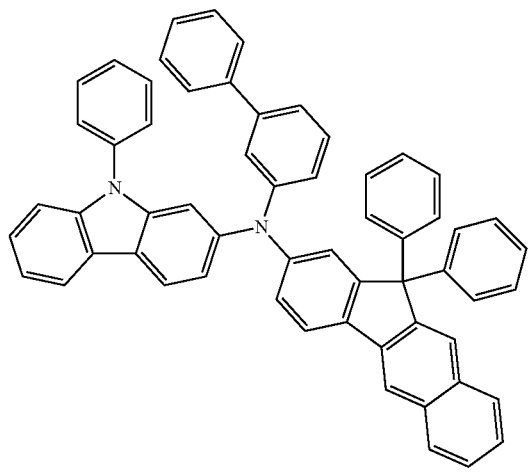
6
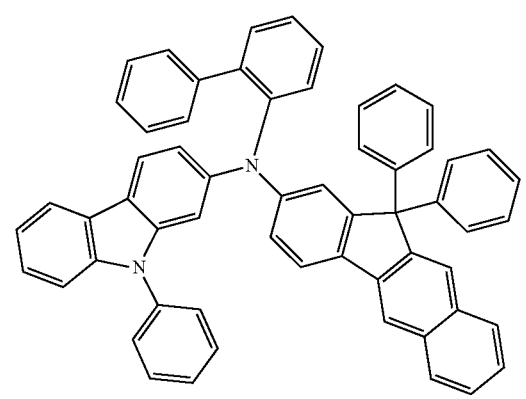
7
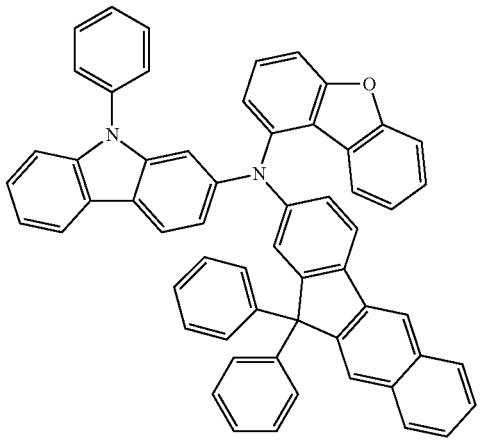
8
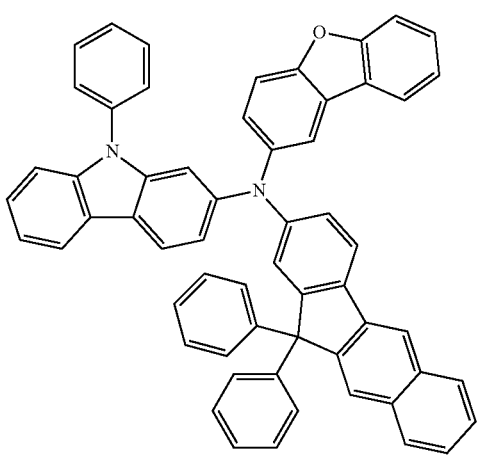
9
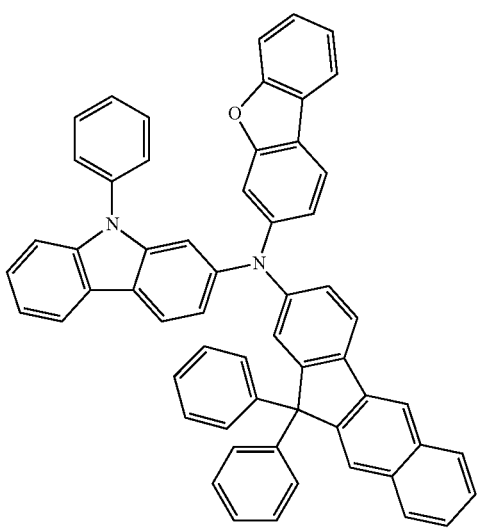

123
-continued
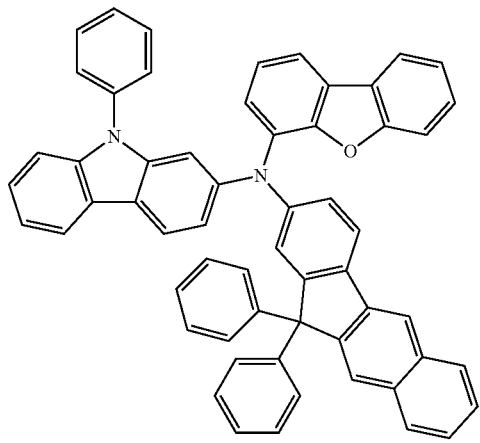
11
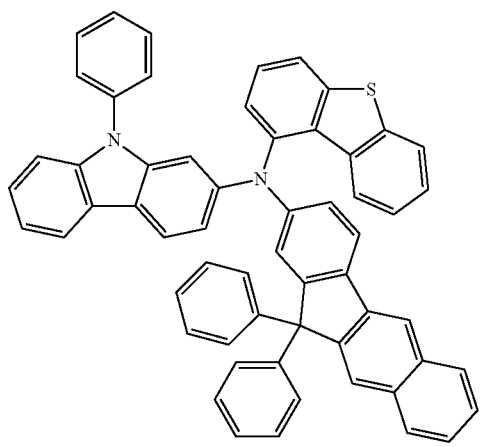
12
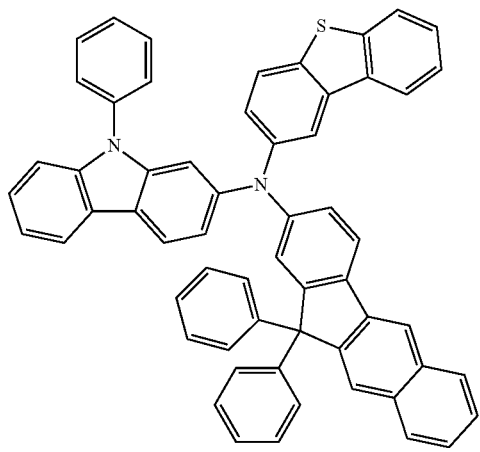
124
-continued
13
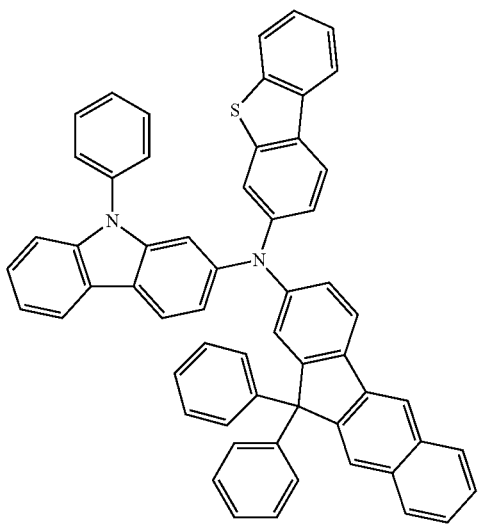
14
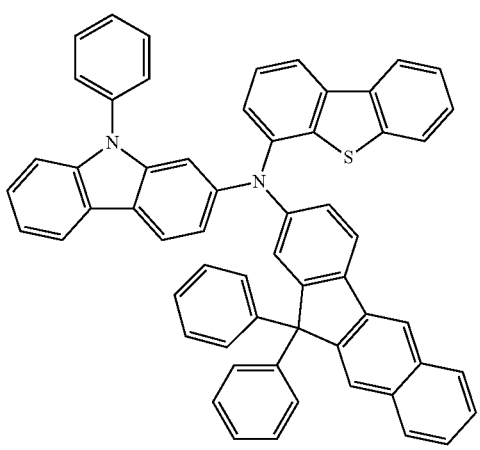
15
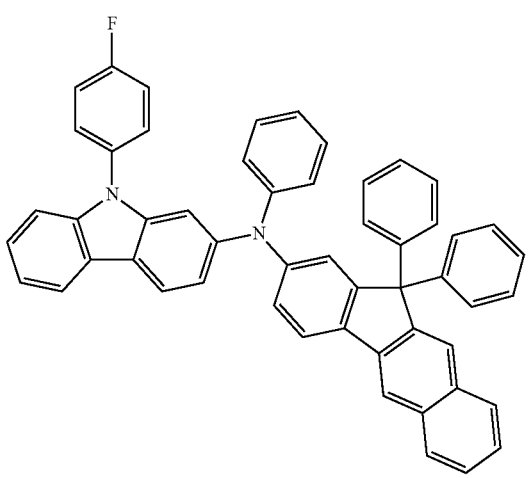

16
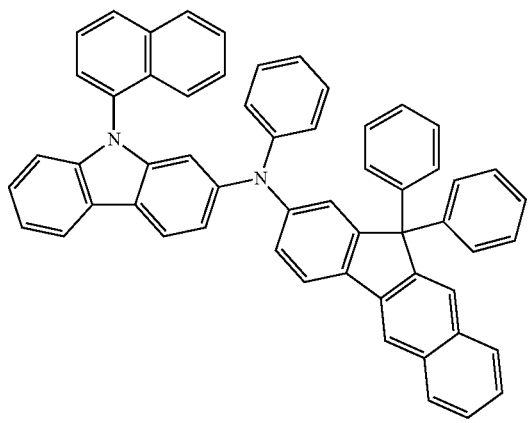
17
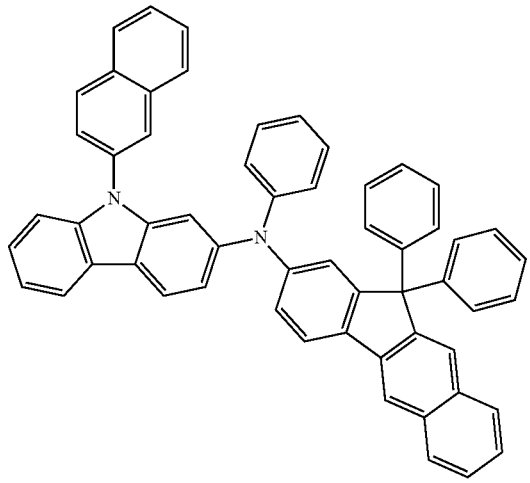
18
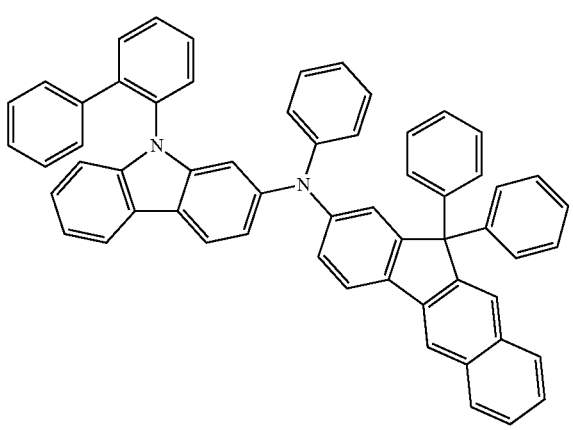
19
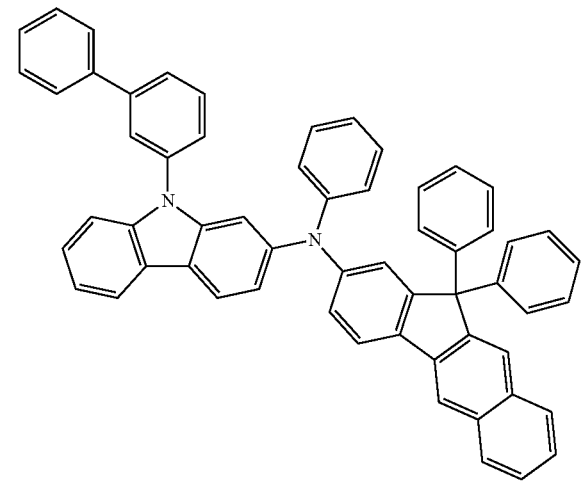
20
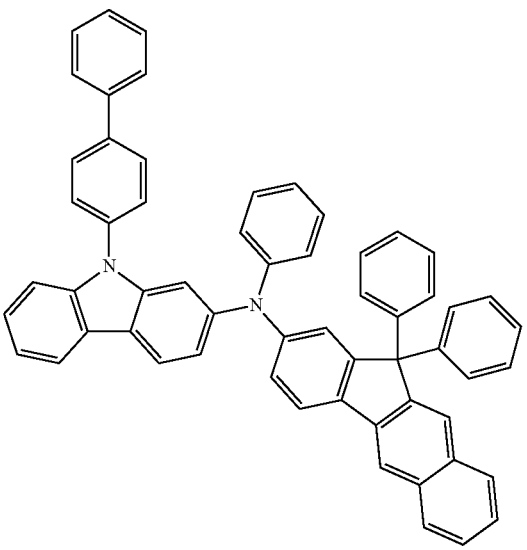
21
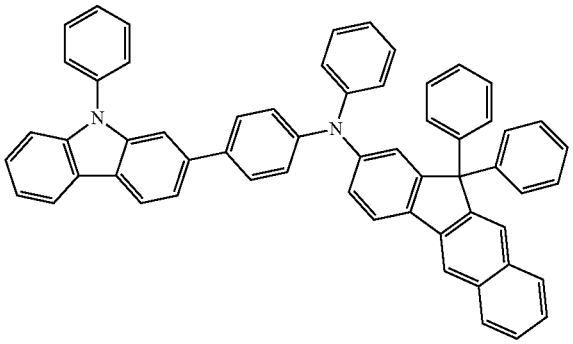

22
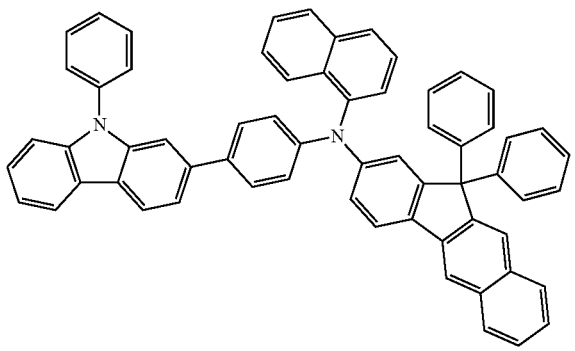
23
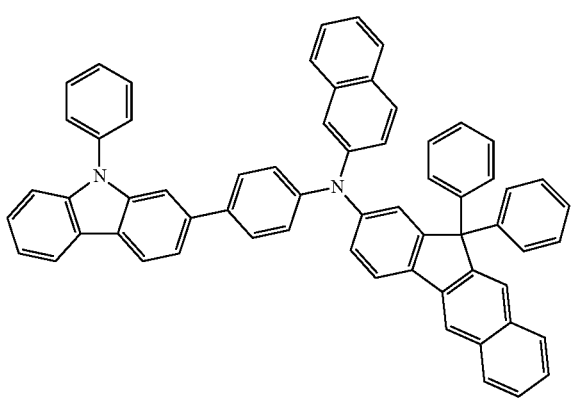
24
25
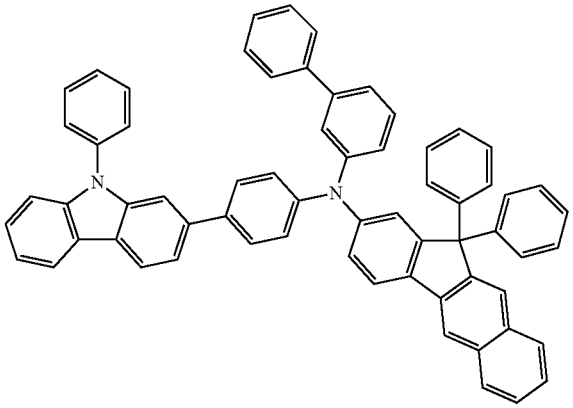
26
27
28

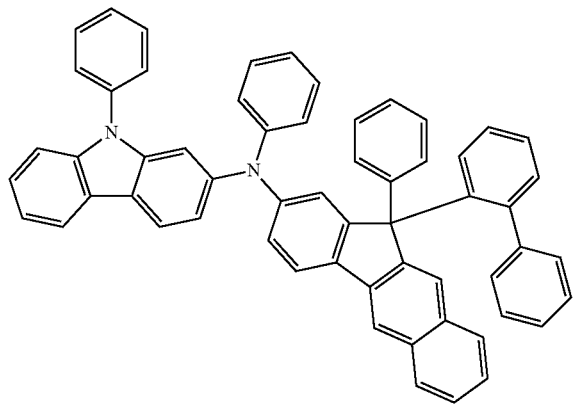
29
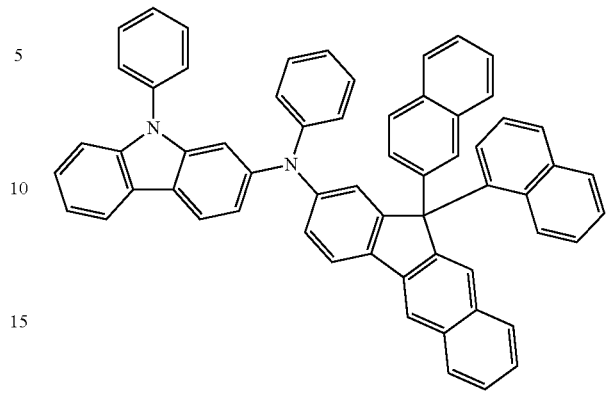
32
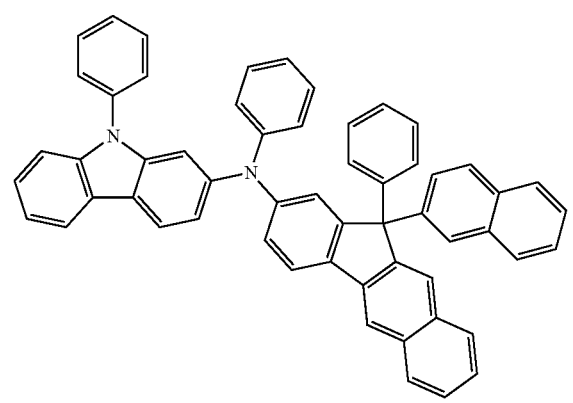
30
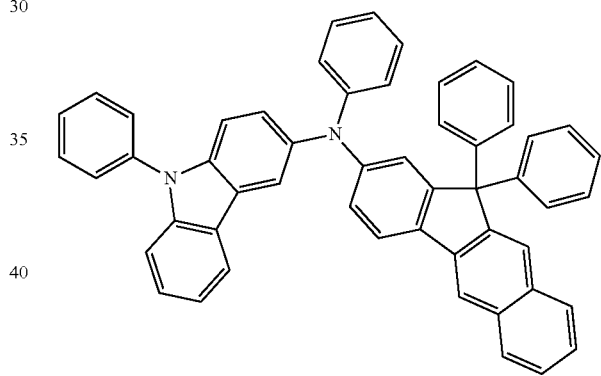
33
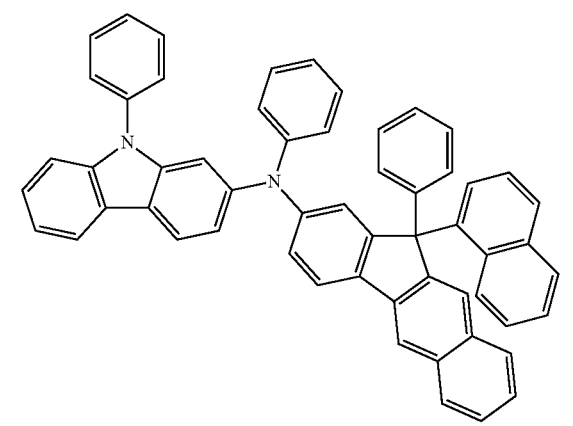
31
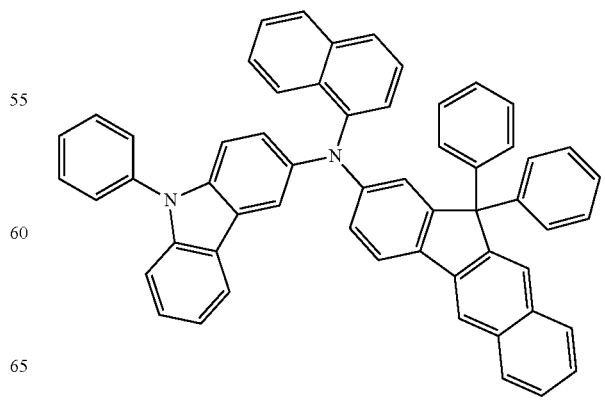
34

131
-continued
35
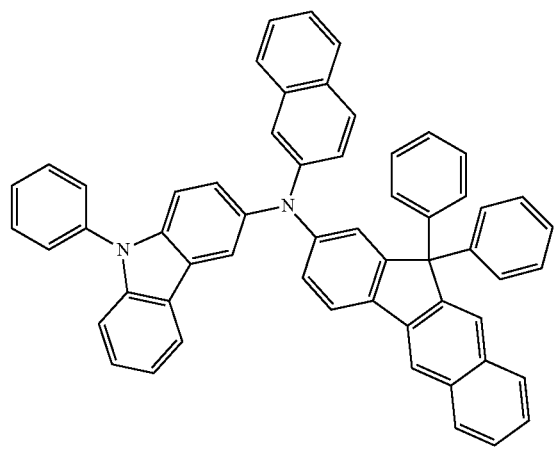
36
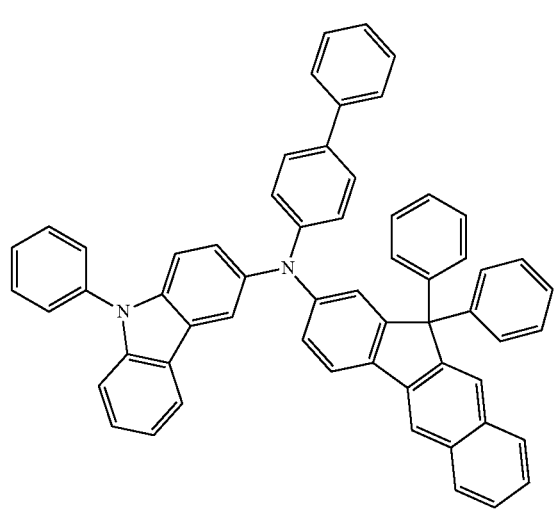
37
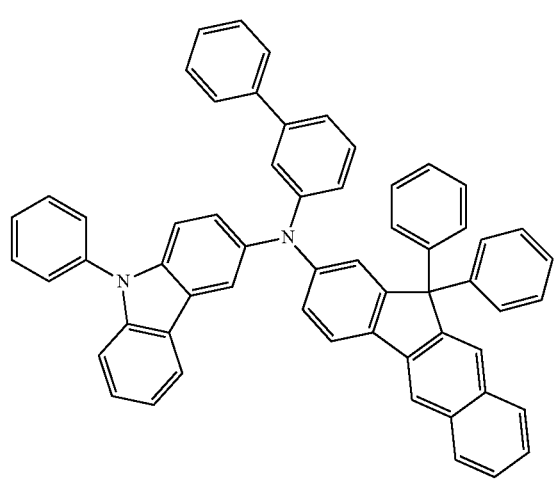
132
-continued
38
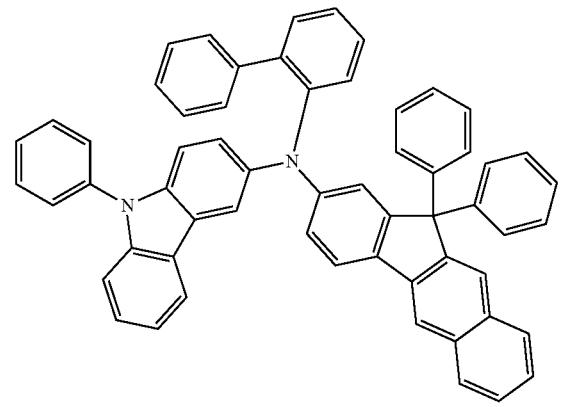
39
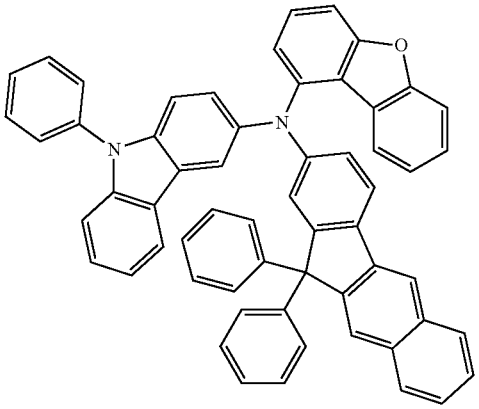
40
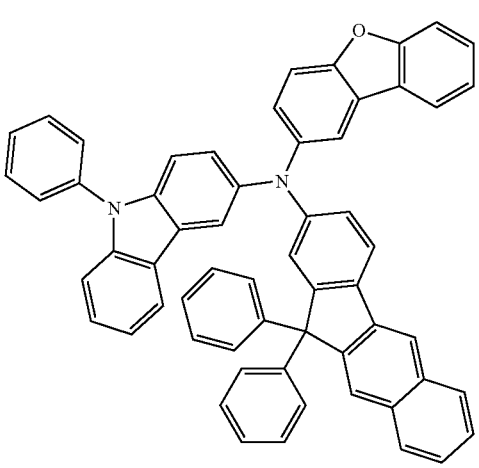

41
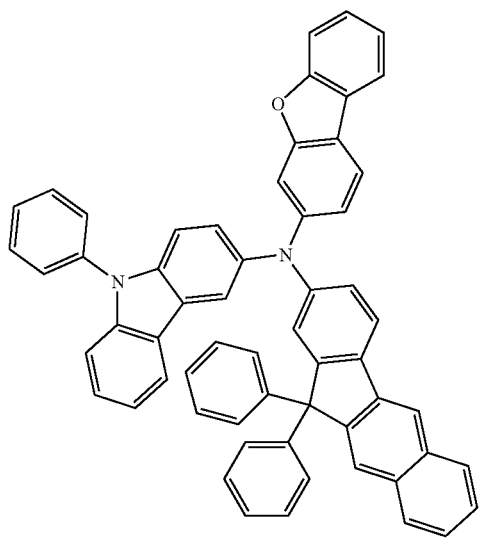
42
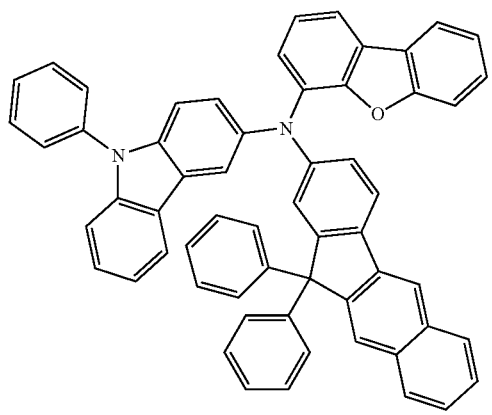
43
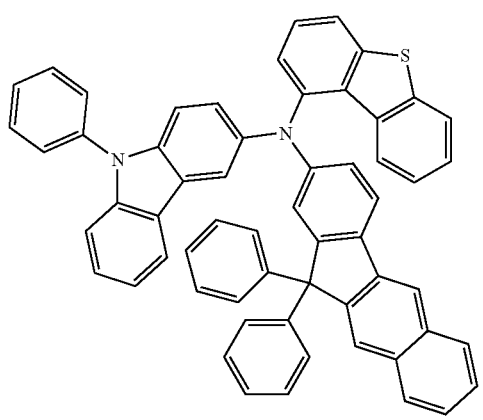
44
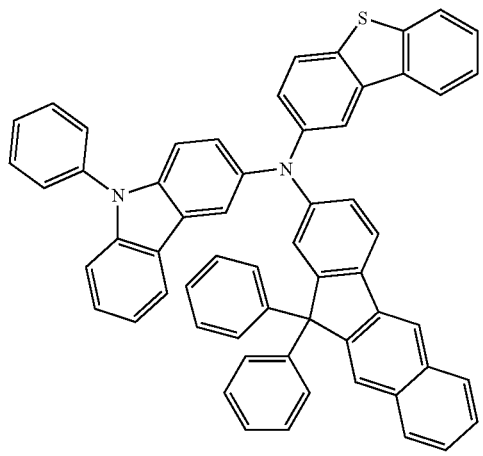
45
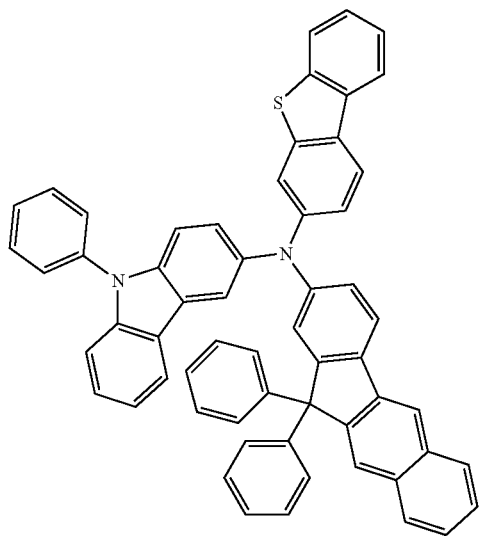
46
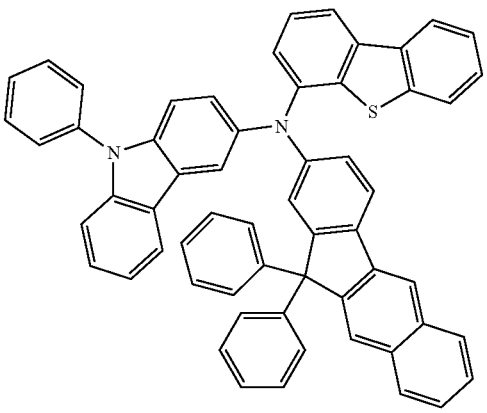

47
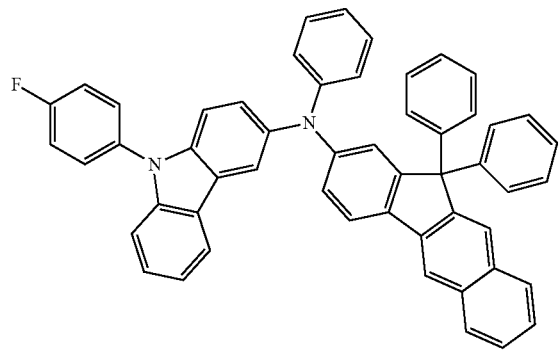
48
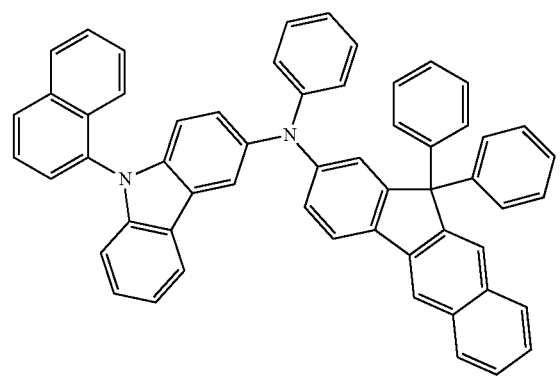
49
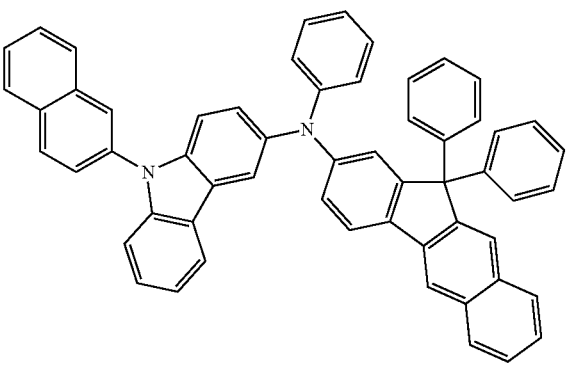
50
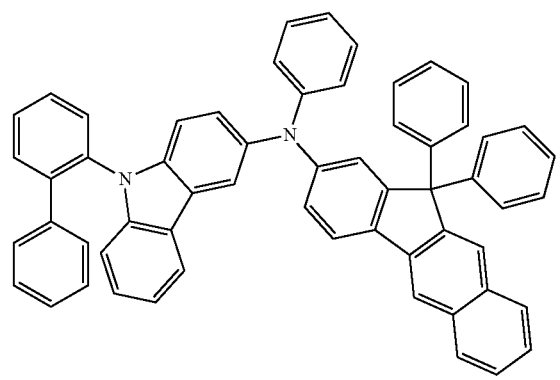
51
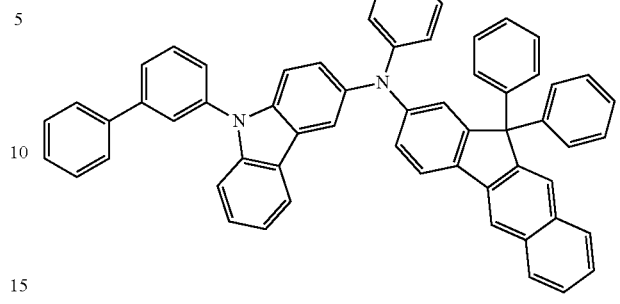
52
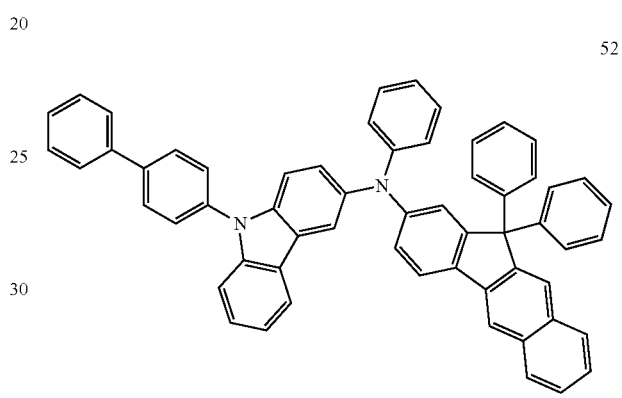
53
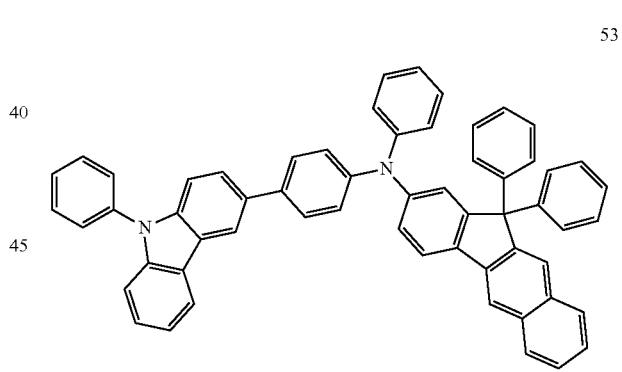
54
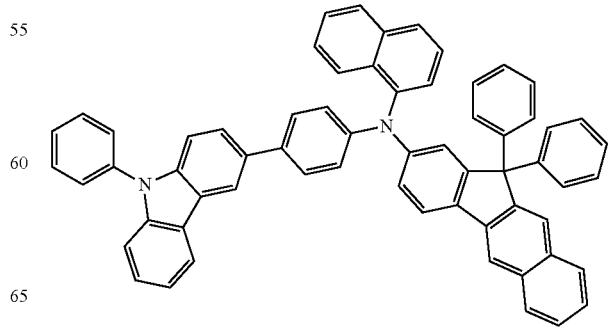

55
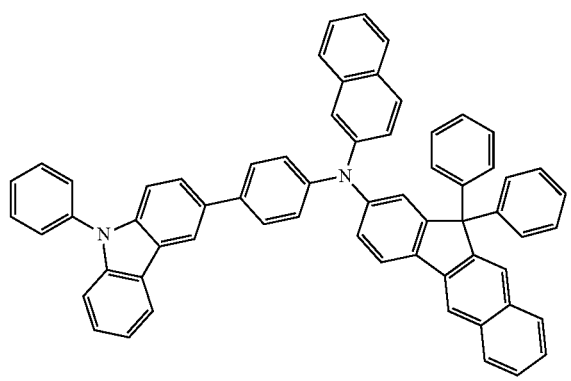
56
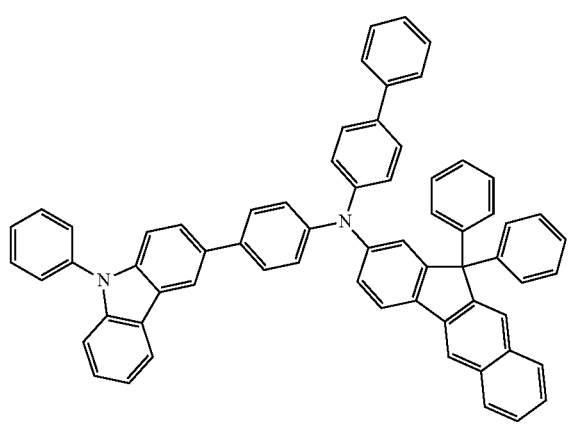
57
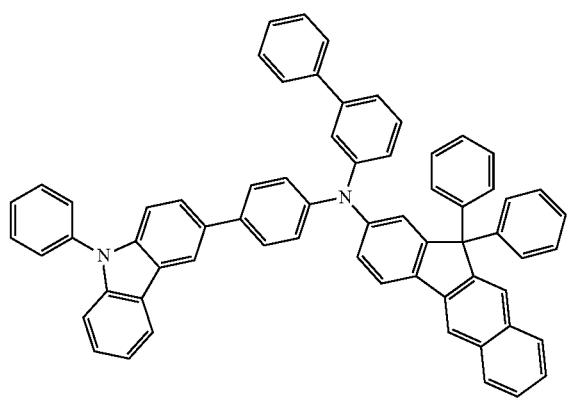
58
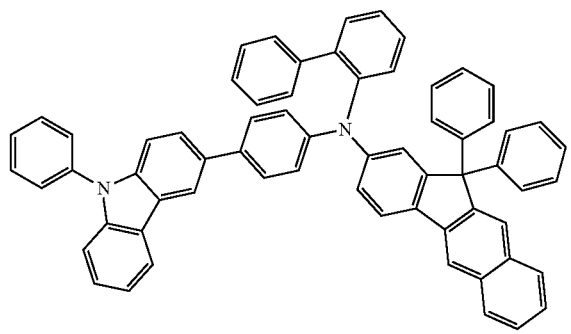
59
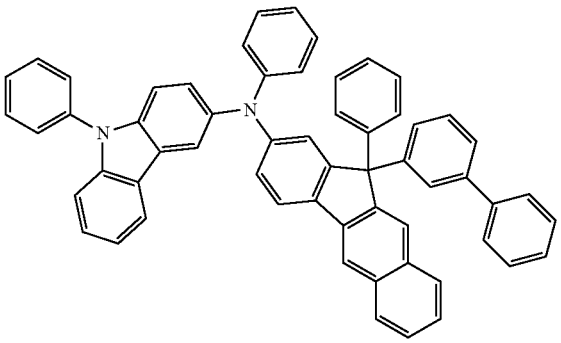
60
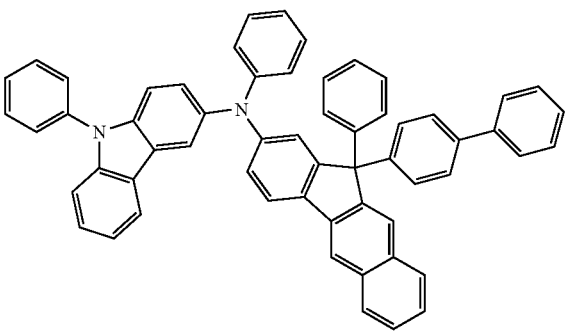
61
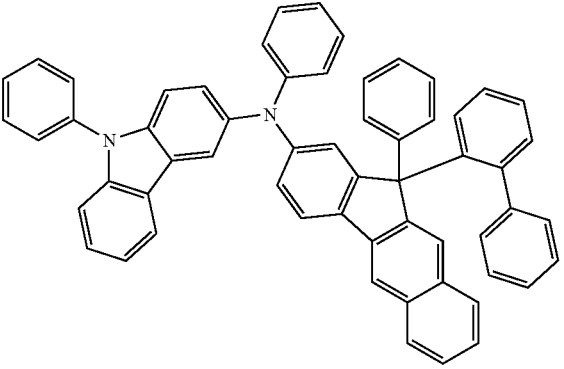
62
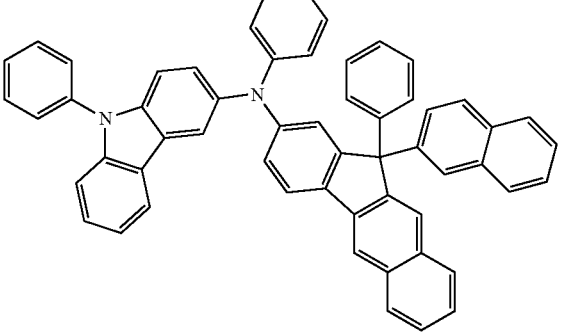

63
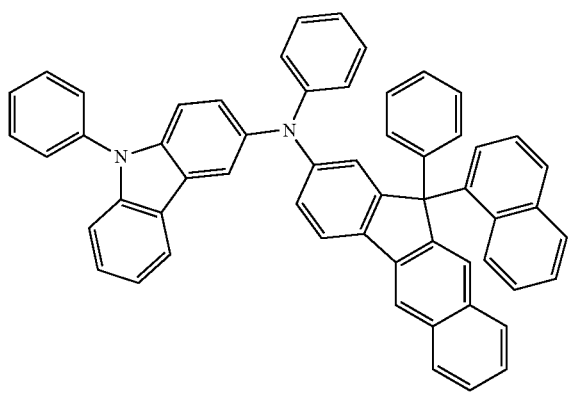
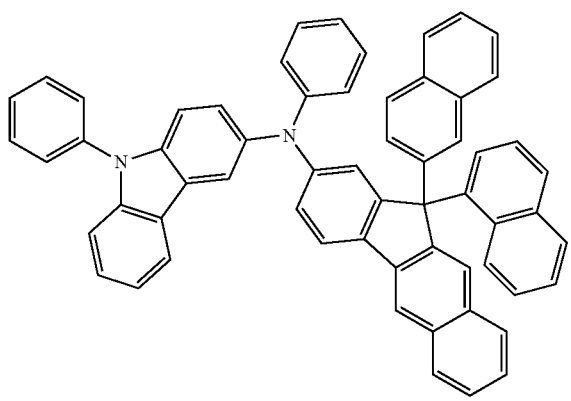
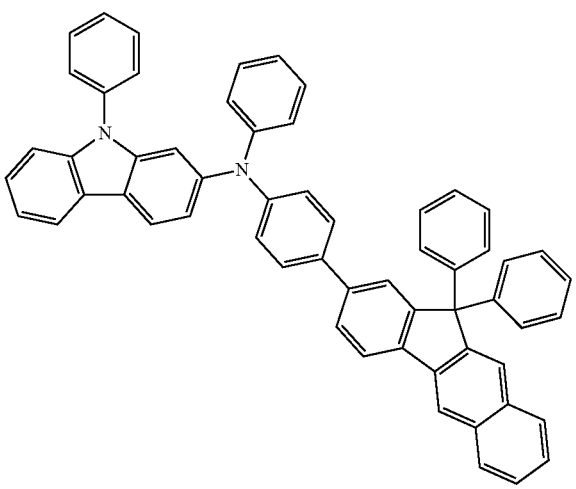
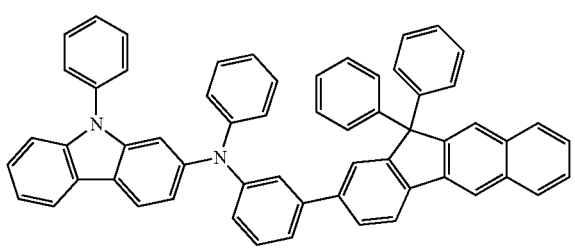
67
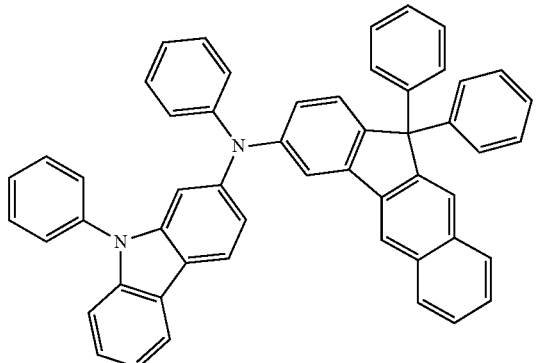
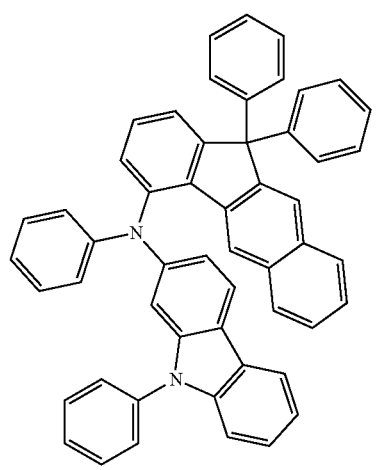
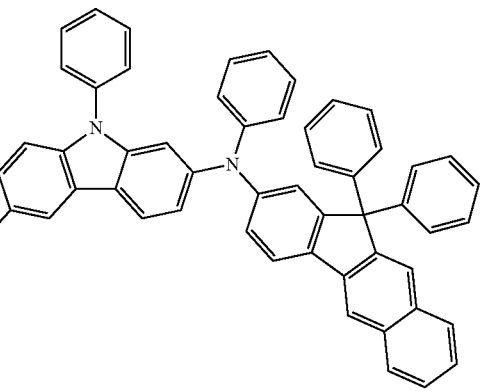
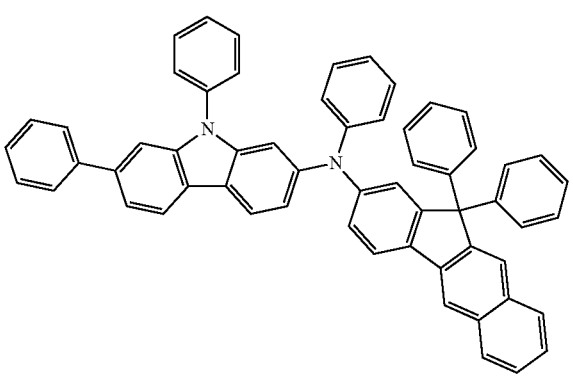

71
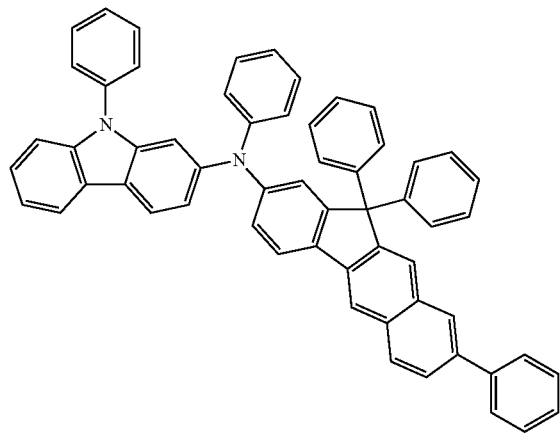
72
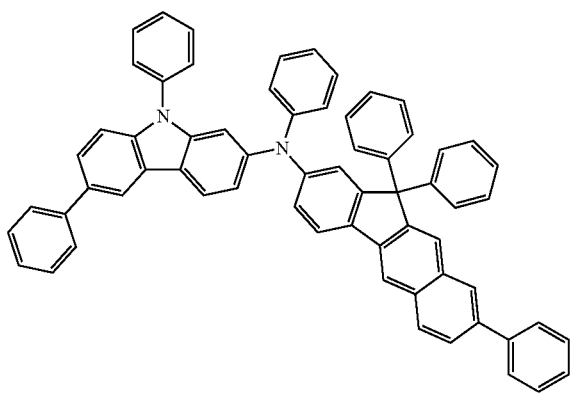
73
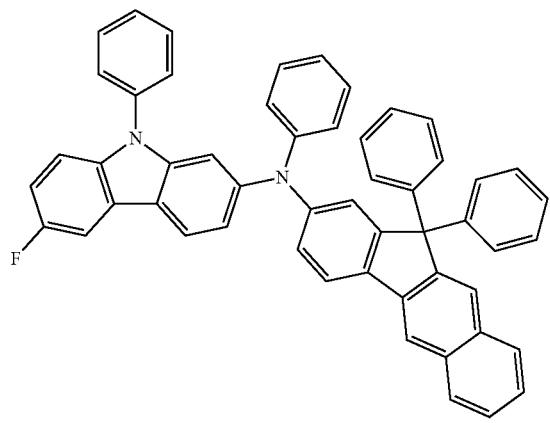
74
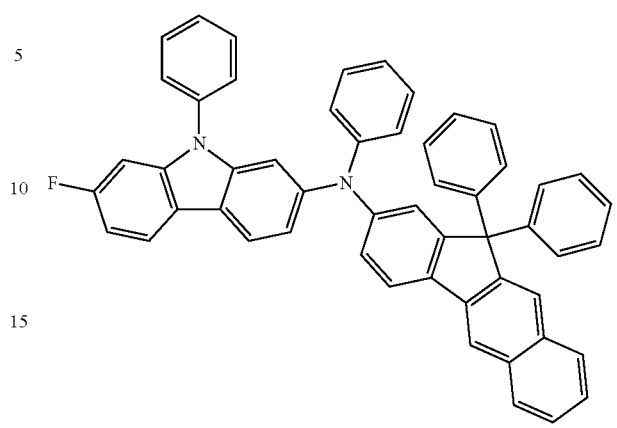
75
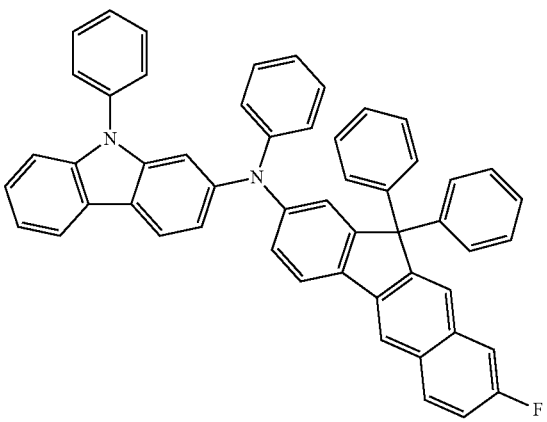
76
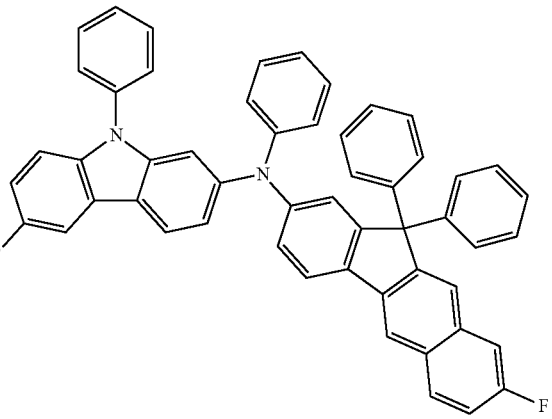

77
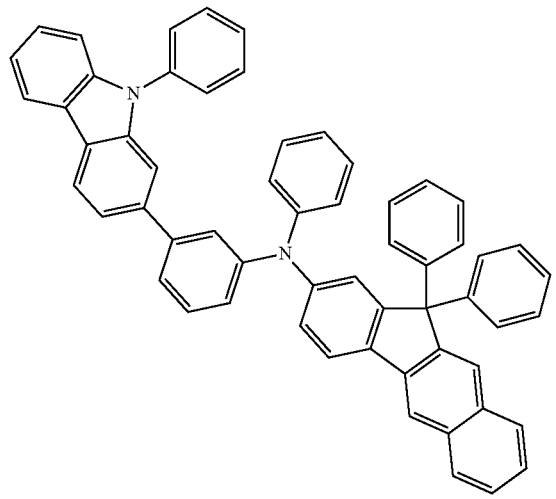
78
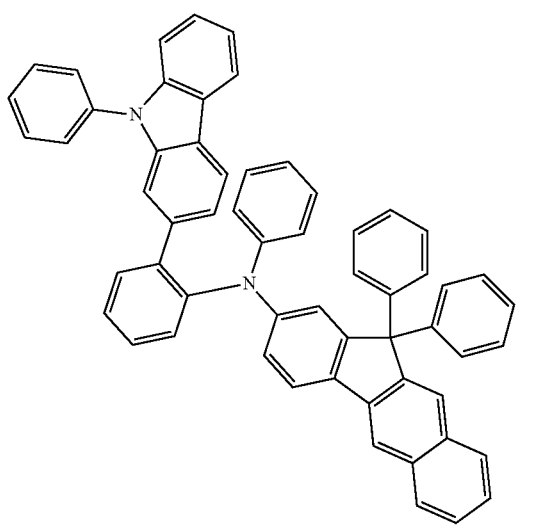
79
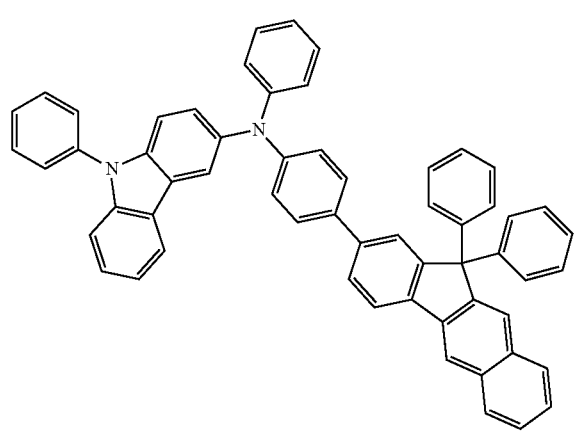
80
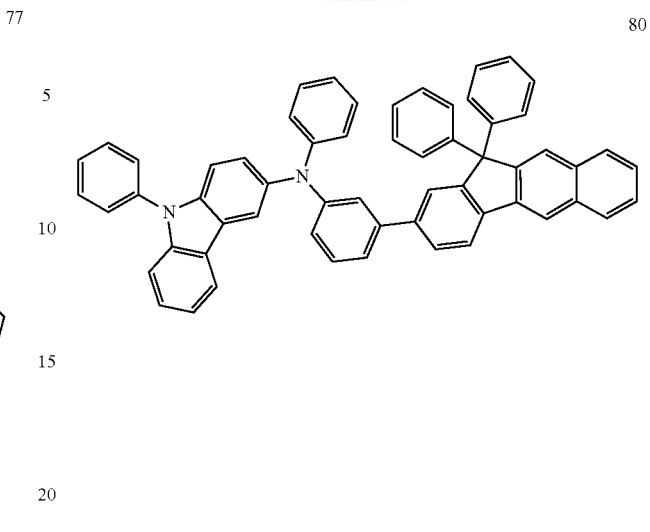
81
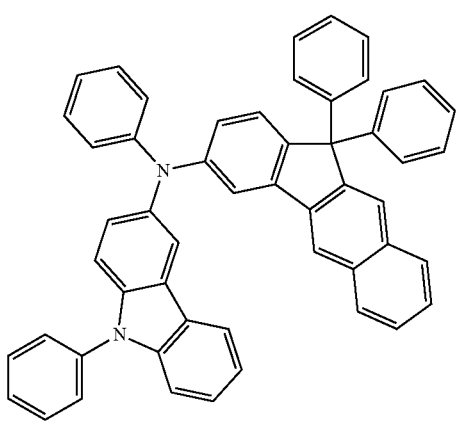
82
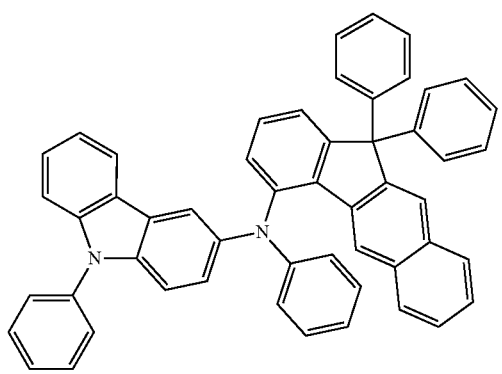

83
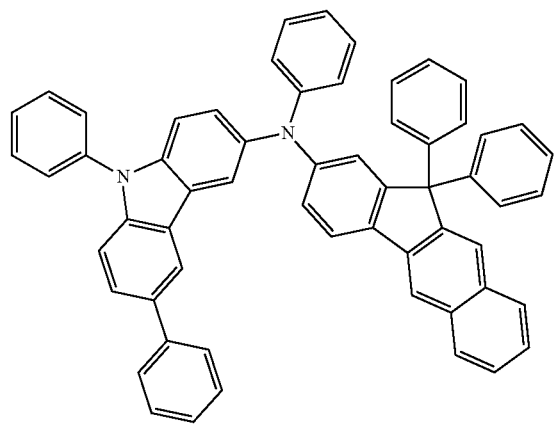
84
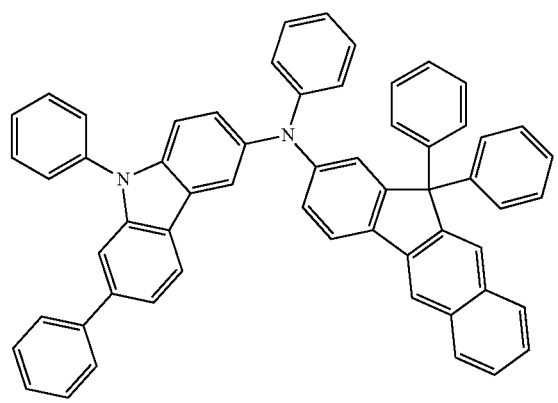
85
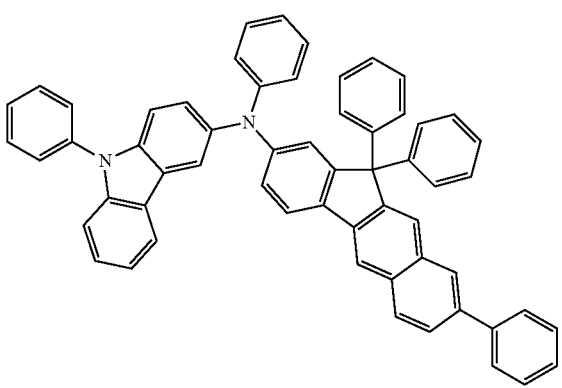
86
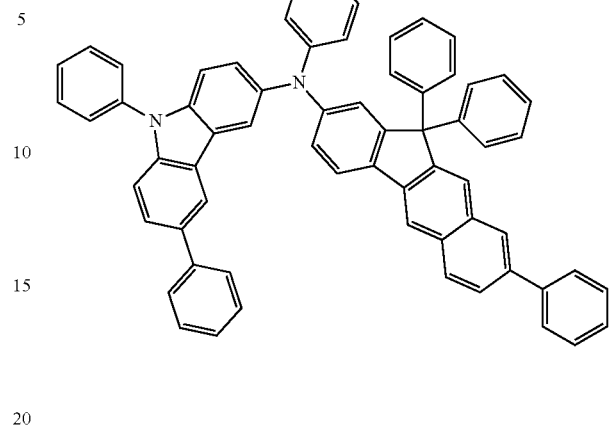
87
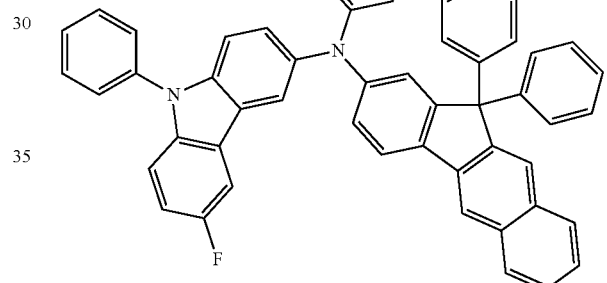
88
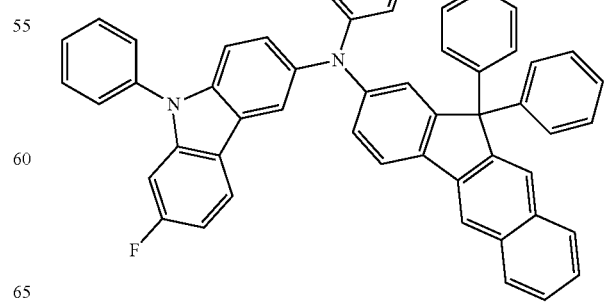

89
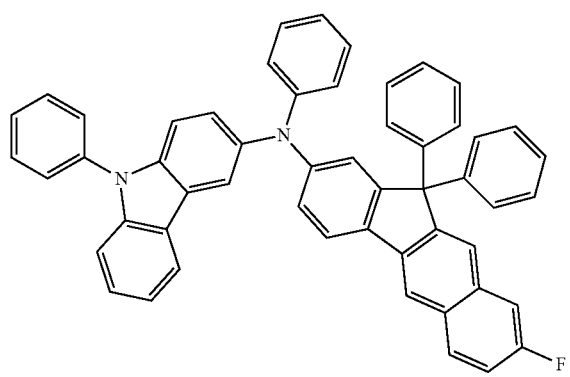
90
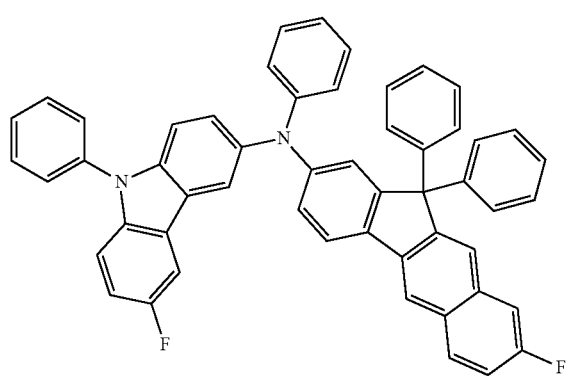
91
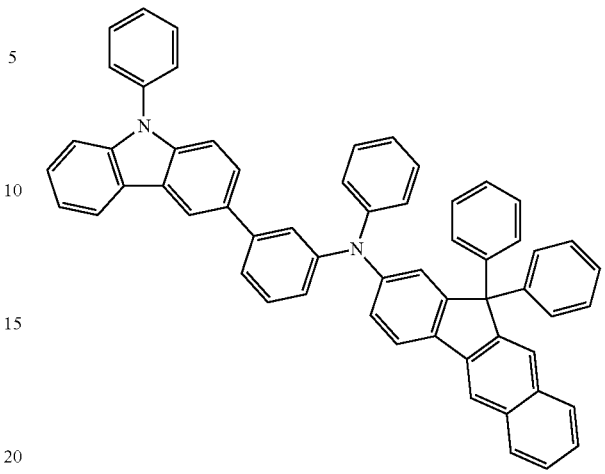
92
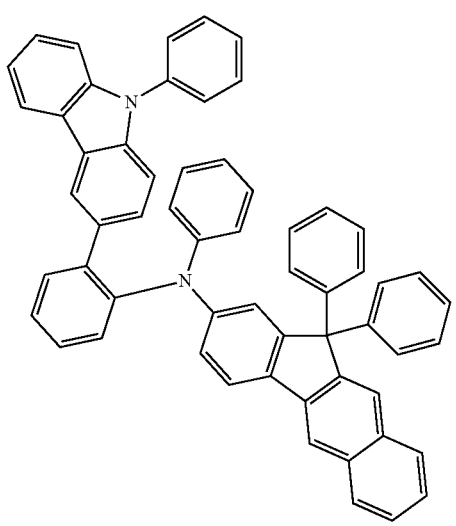
* * * * *

UNITED STATES PATENT AND TRADEMARK OFFICE
CERTIFICATE OF CORRECTION

PATENT NO. : 12,268,091 B2  
APPLICATION NO. : 17/351049  
DATED : April 1, 2025  
INVENTOR(S) : Eunjae Jeong et al.

Page 1 of 1

It is certified that error appears in the above-identified patent and that said Letters Patent is hereby corrected as shown below:

In the Claims

In Column 118, Line 28, in Claim 10, delete "[Formula [4-1]" and insert -- [Formula 4-1] --.

In Column 119, Line 47, in Claim 11, delete ""n5"" and insert -- "n6" --.

Signed and Sealed this  
Fifteenth Day of July, 2025

Coke Morgan Stewart  
*Acting Director of the United States Patent and Trademark Office*